(12) United States Patent  (10) Patent No.: US 8,319,292 B2
Maeda  (45) Date of Patent: Nov. 27, 2012

(54) SEMICONDUCTOR DEVICE

(75) Inventor: Noriaki Maeda, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/169,101

(22) Filed: Jun. 27, 2011

(65) Prior Publication Data

US 2011/0254104 A1 Oct. 20, 2011

Related U.S. Application Data

(62) Division of application No. 12/323,573, filed on Nov. 26, 2008, now Pat. No. 7,989,897.

(30) Foreign Application Priority Data

Jan. 31, 2008 (JP) ................................. 2008-020080

(51) Int. Cl.
*H01L 27/092* (2006.01)
(52) U.S. Cl. ................. 257/392; 257/369; 257/E27.062
(58) Field of Classification Search .................. 257/391, 257/392, E27.06, 365, E27.016, E27.081, 257/E21.625, E21.645, E21.679; 438/199
See application file for complete search history.

(56) References Cited

U.S. PATENT DOCUMENTS

| 6,078,195 | A | 6/2000 | Chen |
| 6,229,340 | B1 | 5/2001 | Hagihara |
| 6,787,787 | B1 | 9/2004 | Hishinuma et al. |
| 7,601,581 | B2 | 10/2009 | Taniguchi et al. |
| 2007/0207575 | A1 | 9/2007 | Taniguchi et al. |

FOREIGN PATENT DOCUMENTS

| CN | 101030556 A | 9/2007 |
| EP | 0 827 205 A2 | 3/1998 |
| JP | 11-17522 | 1/1999 |
| JP | 11-214527 A | 8/1999 |
| JP | 11-282886 | 10/1999 |
| JP | 2000-29665 | 1/2000 |

*Primary Examiner* — Benjamin Sandvik
*Assistant Examiner* — Whitney T Moore
(74) *Attorney, Agent, or Firm* — Mattingly & Malur, PC

(57) ABSTRACT

A semiconductor device includes a first MISFET and a second MISFET which are formed over a semiconductor substrate and have the same conductive type. The first MISFET has a first gate insulating film arranged over the semiconductor substrate, a first gate electrode arranged over the first gate insulating film, and a first source region and a first drain region. The second MISFET has a second gate insulating film arranged over the semiconductor substrate, a second gate electrode arranged over the second gate insulating film, and a second source region and a second drain region. The first and the second gate electrode are electrically coupled, the first and the second source region are electrically coupled, and the first and the second drain region are electrically coupled. Accordingly, the first and the second MISFET are coupled in parallel. In addition, threshold voltages are different between the first and the second MISFET.

3 Claims, 23 Drawing Sheets

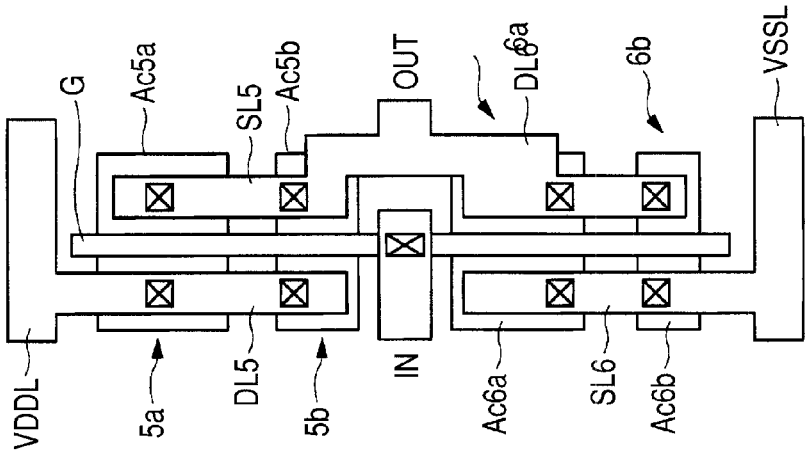
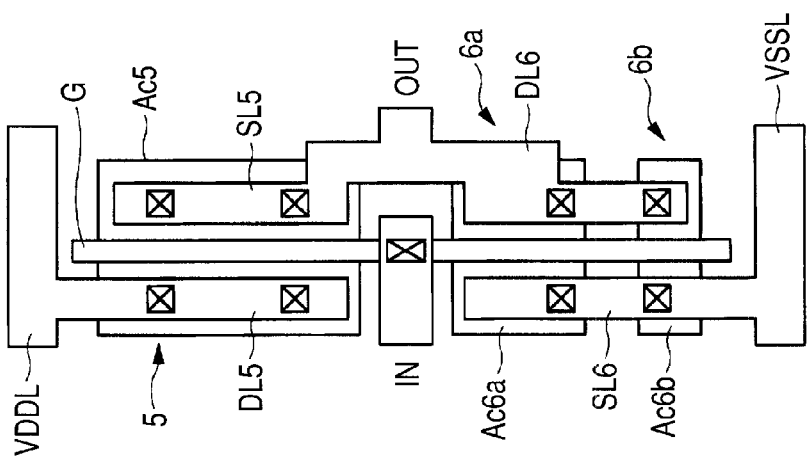
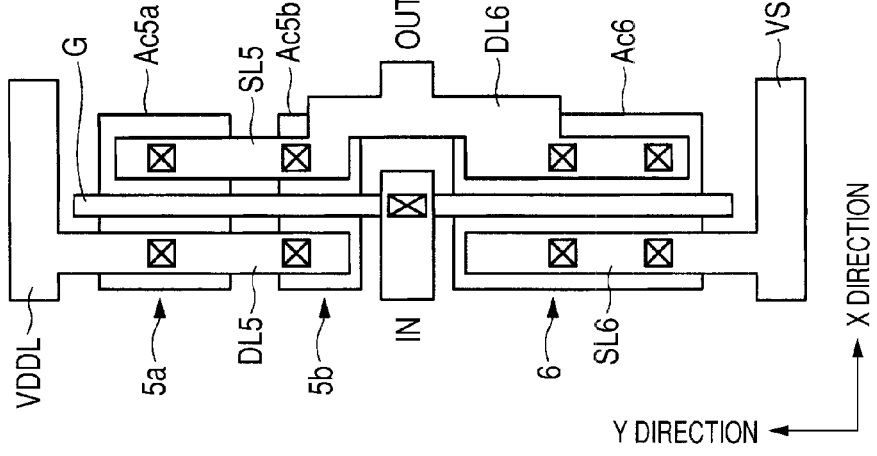

| A | B | OUT |
|---|---|-----|
| H | H | L |
| H | L | H |
| L | H | H |
| L | L | H |

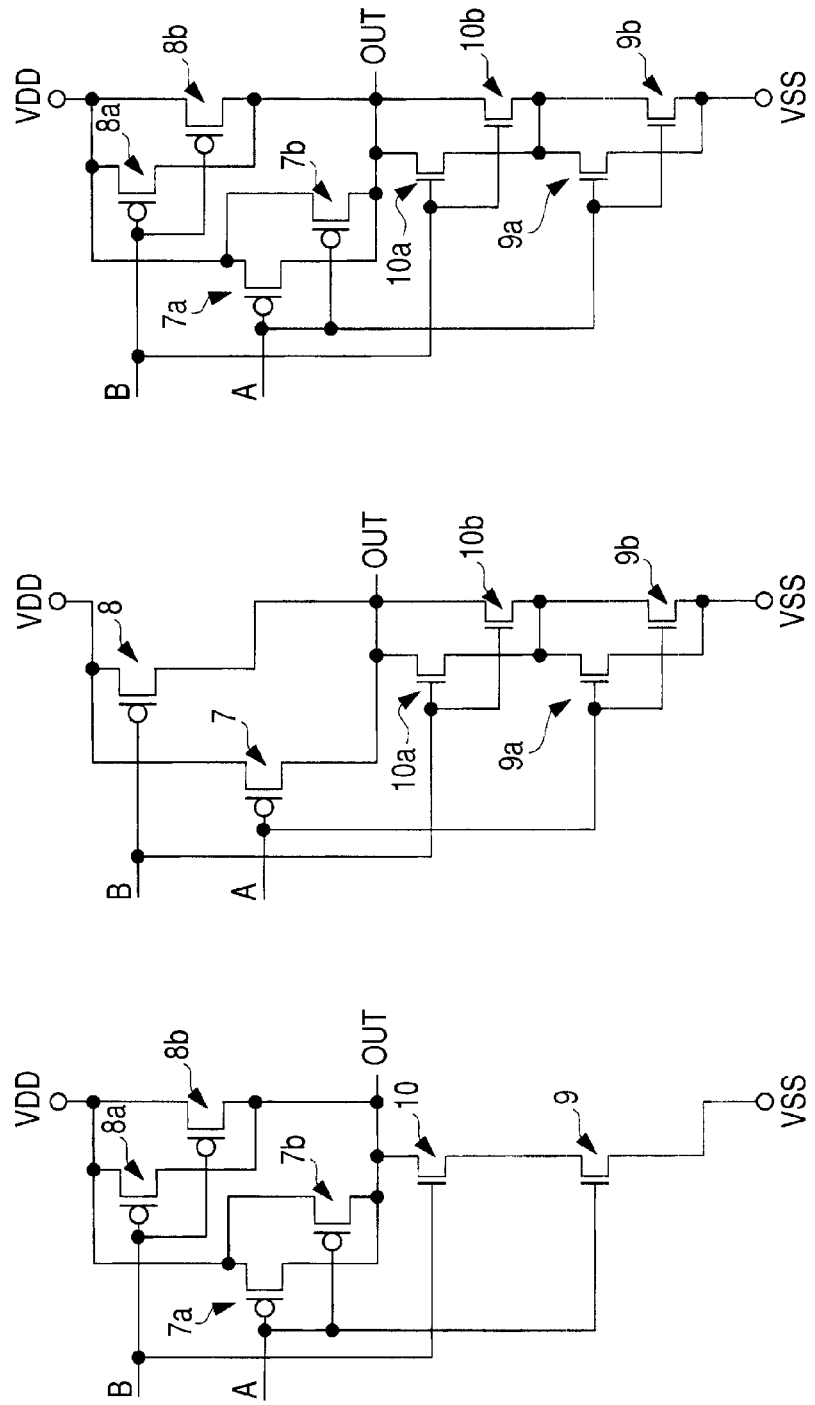

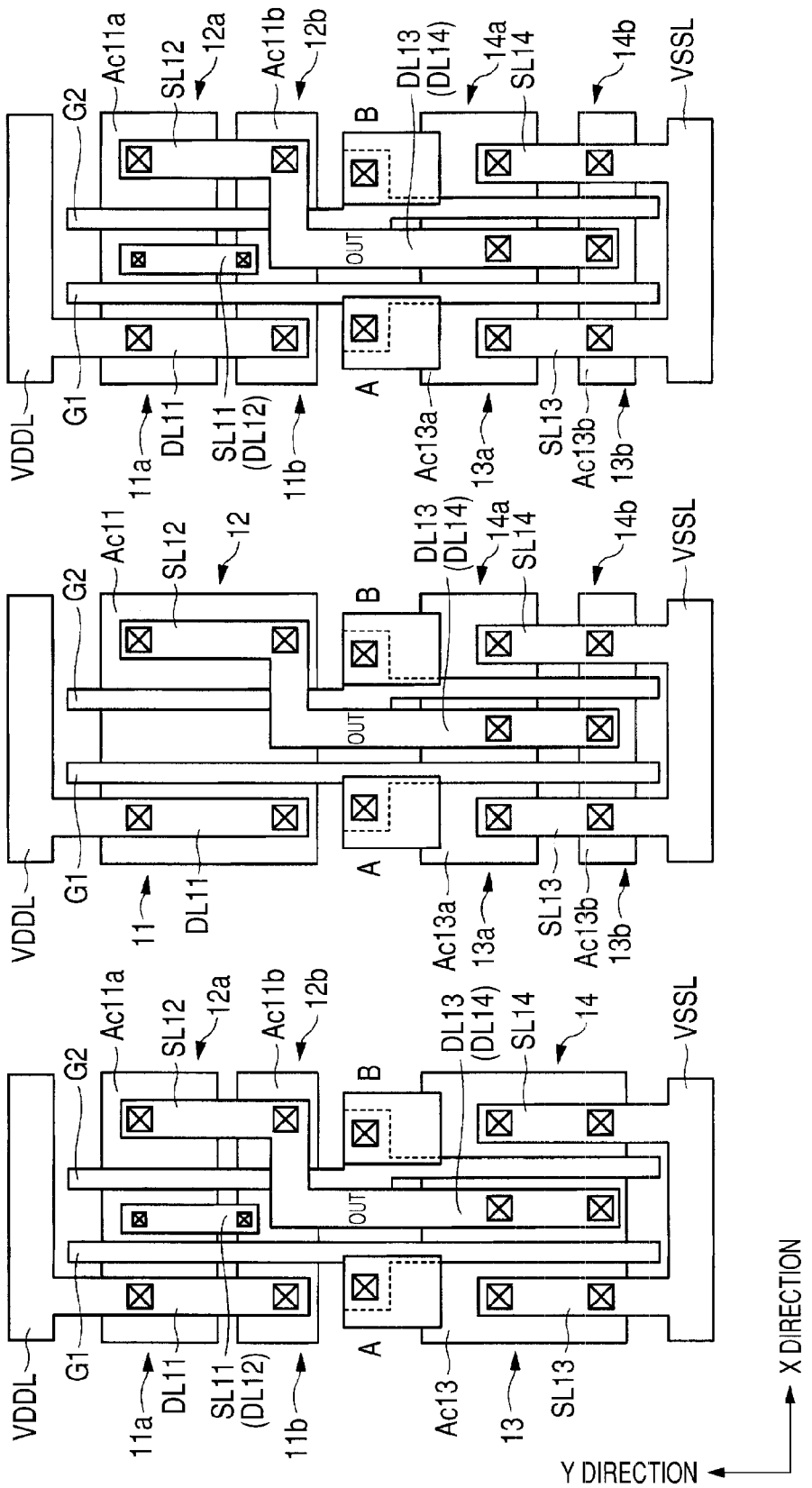

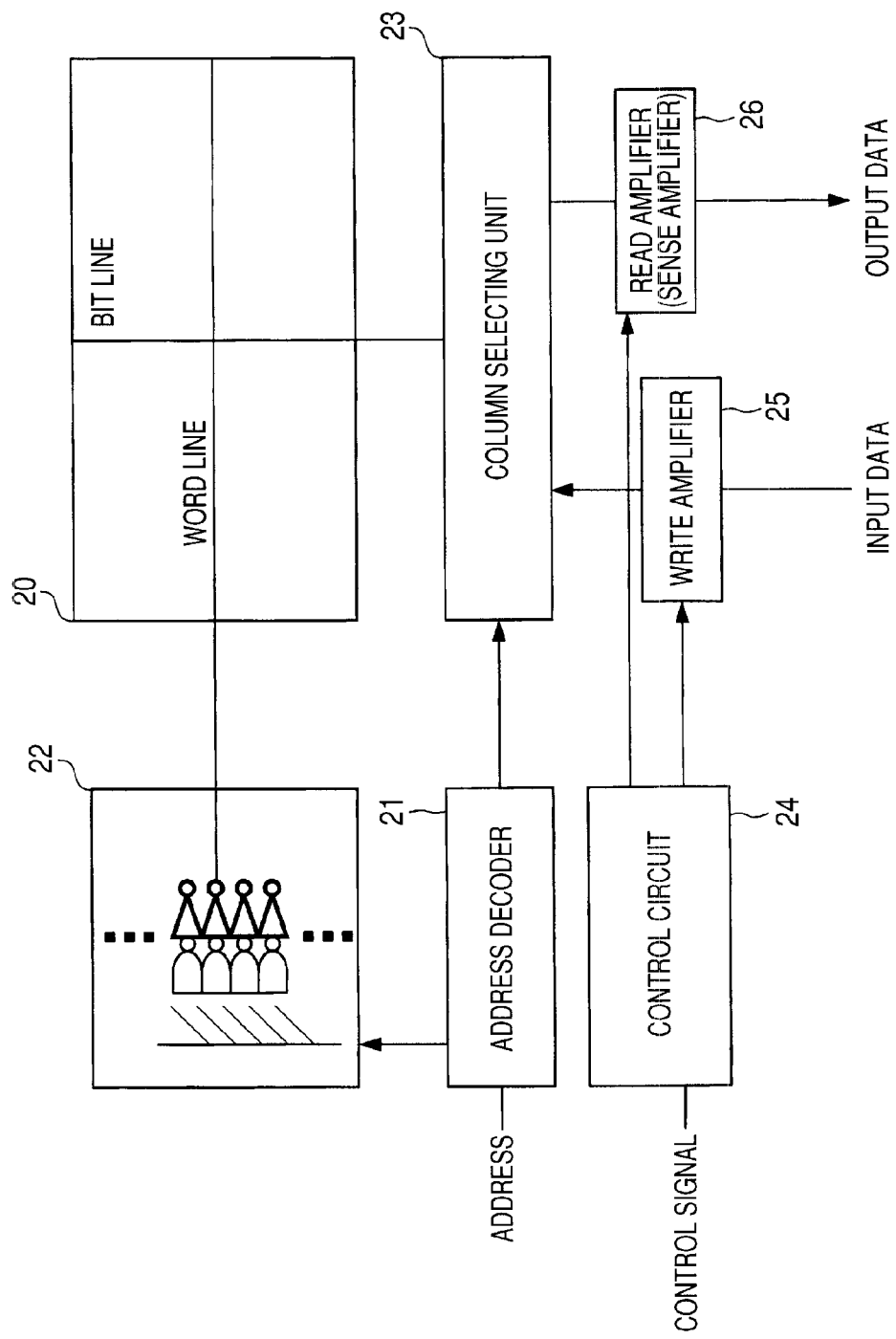

SEMICONDUCTOR DEVICE

CROSS REFERENCE TO RELATED APPLICATIONS

This application is a divisional application of U.S. Ser. No. 12/323,573, filed Nov. 26, 2008, the entire disclosure of which is incorporated herein by reference. The disclosure of Japanese Patent Application No. 2008-20080 filed on Jan. 31, 2008 including the specification, drawings and abstract is incorporated herein by reference in its entirety.

BACKGROUND OF THE INVENTION

The present invention relates to a semiconductor device, in particular, to technology which is effective when applied to a semiconductor device aiming at realization of improvement of operating speed and reduction of a leakage current of the semiconductor device, and also aiming at realization of miniaturization of the semiconductor device.

Patent Document 1 (Japanese Unexamined Patent Publication No. Hei 11(1999)-17522) discloses the technology of providing a logic book which mixes a low-voltage threshold (Vt) device and a regular-voltage threshold (Vt) device in order to improve performance, without increasing the standby power requirement of the logic book. In the technology, the low-Vt device is used in order to raise speed, and the regular-Vt device is used in order to cut off an off-state current of the logic book. The technical idea described in Document 1 is that, in the circuit which is comprised of regular-Vt devices, a low-Vt device is used in lieu of a part of the regular-Vt devices.

SUMMARY OF THE INVENTION

In an integrated circuit as a semiconductor device, "speediness of processing speed" and "low power consumption" may be required. These requirements are realized by adjusting the configuration of an MISFET (a Metal Insulator Semiconductor Field Effect Transistor) which configures the integrated circuit, for every integrated circuit with different performances. For example, in the integrated circuit in which priority is given to the speediness of processing speed, an MISFET with a low threshold voltage is mainly used. That is, when the threshold voltage of an MISFET is decreased, a high-speed operation will become possible. However, when the threshold voltage of an MISFET is decreased, the leakage current which flows between a source region and a drain region of the MISFET at the time of OFF will increase. Namely, for the integrated circuit which gives priority to the speediness of processing speed, the employment of an MISFET of a low threshold voltage allows the realization of the speediness of processing speed, however, the employment of an MISFET of a low threshold voltage causes the increase of the leakage current at the same time. Consequently, even for the integrated circuit which gives priority to the speediness of processing speed, it is desirable to suppress the leakage current below a certain value, in order to attain low power consumption. From this reason, the circuit which gives priority to the speediness of processing speed employs an MISFET with a low threshold voltage and, at the same time, makes the gate width of the MISFET small, in order to keep the leakage current below a specified value.

Here, in order to clarify the definition of the gate width of the MISFET, the explanation is given with reference to a drawing. FIG. 1 is a chart illustrating an example of the plane configuration of an MISFET. As illustrated in FIG. 1, an active region Ac is surrounded by an element isolation region STI, and a gate electrode G is arranged so as to cross over the active region Ac. The gate electrode G is arranged so as to extend in the x direction. A source region S and a drain region D are formed in the active region Ac so as to match with the gate electrode G. The MISFET is comprised of the gate electrode G, the source region S, and the drain region D. In such MISFET, the gate length L of the gate electrode G is defined as the width of the gate electrode G in the y direction. On the other hand, the gate width W of the gate electrode G is defined as the width of the gate electrode G overlapping with the active region Ac in the x direction.

Consequently, for example, the integrated circuit which gives priority to the speediness of processing speed employs an MISFET of a low threshold voltage, and makes the gate width W of the MISFET illustrated in FIG. 1 small. Since the leakage current at the time when the MISFET is turned off can be made small by making the gate width of the MISFET small, the integrated circuit which gives priority to the speediness of processing speed can also keep the magnitude of the leakage current below a specified value. In this way, in the case of the integrated circuit which gives priority to the speediness of processing speed, an MISFET of a low threshold voltage capable of improving the processing speed fundamentally is employed, and the reduction of a leakage current is coped with by making the gate width W of the MISFET small.

On the other hand, for example, in the case of the integrated circuit which gives priority to the reduction of a leakage current, an MISFET with a high threshold voltage is mainly used. That is, when the threshold voltage of the MISFET is increased, the leakage current can be reduced. However, when the threshold voltage of the MISFET is increased, the processing speed will fall. Namely, although the integrated circuit which gives priority to the reduction of a leakage current can realize the reduction of a leakage current by employing an MISFET of a high threshold voltage, the employment of the MISFET of a high threshold voltage causes the fall of the processing speed at the same time. Therefore, even for the integrated circuit which gives priority to the reduction of a leakage current, it is desirable to keep the operating speed of the MISFET beyond a specified value, in order to improve the processing capacity. From this reason, the circuit which gives priority to the reduction of leakage current employs an MISFET with a high threshold voltage and, at the same time, makes the gate width of the MISFET large, in order to keep the operating speed of the MISFET beyond a specified value. That is, in the case of the integrated circuit which gives priority to the reduction of a leakage current, an MISFET of a high threshold voltage capable of reducing the leakage current fundamentally is employed, and the improvement of operating speed is coped with by enlarging the gate width W of the MISFET.

However, the miniaturization of a semiconductor device is required in recent years, and the miniaturization of an MISFET has been advanced in order to respond to this requirement. When the miniaturization of an MISFET advances, it will become difficult to satisfy both of the improvement of operating speed and the reduction of a leakage current of the integrated circuit using the method described above. For example, although an MISFET of a low threshold voltage is employed in the integrated circuit which gives priority to the speediness of processing speed, the leakage current of the MISFET of a low threshold voltage increases by the miniaturization of the MISFET. Namely, when the MISFET is miniaturized, as a result of the fact that the gate length L (corresponding to the channel length) illustrated in FIG. 1 becomes small, the distance between the source region S and the drain region D becomes small, leading to the increase of the leakage current. Therefore, it is becoming difficult to control the leakage current below a specified value, only by decreasing the gate width W of the MISFET as in the method described above. Namely, in the past, in the integrated circuit which gives priority to the speediness of processing speed, both of the improvement of operating speed and the reduction of a leakage current has been satisfied, by employing an MISFET of a low threshold voltage and making the gate width W of the MISFET small. However, when the miniaturization of a semiconductor device advances, the leakage current of the MISFET of a low threshold voltage increases, rendering it difficult to fully attain reduction of the leakage current only by making the gate width of the MISFET small.

On the other hand, also in the integrated circuit which gives priority to the reduction of a leakage current, it is becoming difficult to satisfy both of the reduction of a leakage current and the improvement of operating speed, and to realize the miniaturization of the semiconductor device. Namely, in the past, in the integrated circuit which gives priority to the reduction of a leakage current, both of the reduction of a leakage current and the improvement of operating speed has been satisfied by employing an MISFET of a high threshold voltage and by enlarging the gate width W of the MISFET. Namely, in the MISFET of a high threshold voltage, it is necessary to enlarge the gate width W of the MISFET in order to attain the operating speed exceeding a specified value. This corresponds to enlarging the occupied area of the MISFET, and implies that the occupied area of the integrated circuit becomes large. Consequently, even in the integrated circuit which gives priority to the reduction of a leakage current, it becomes difficult to satisfy both of the improvement of operating speed and the reduction of a leakage current, and to realize the miniaturization of the semiconductor device.

The present invention has been made in view of the above circumstances and provides an MISFET in which both of the improvement of processing speed and the reduction of a leakage current of the MISFET configuring an integrated circuit can be satisfied. The present invention also provides the technology in which the reduction of a leakage current and the miniaturization of a semiconductor device can be attained. The present invention further provides the technology in which both of the improvement of the processing speed of the MISFET and the reduction of a leakage current can be satisfied, and the miniaturization of the semiconductor device can be attained.

The other purposes and the new feature of the present invention will become clear from the description of the present specification and the accompanying drawings.

The following explains briefly the outline of a typical invention among the inventions disclosed in the present application.

A semiconductor device according to a typical embodiment includes a first MISFET and a second MISFET which are formed over a semiconductor substrate and have the same conductive type. In this case, the first MISFET has (a1) a first gate insulating film arranged over the semiconductor substrate, (b1) a first gate electrode arranged over the first gate insulating film, and (c1) a first source region and a first drain region. The second MISFET has (a2) a second gate insulating film arranged over the semiconductor substrate, (b2) a second gate electrode arranged over the second gate insulating film, and (c2) a second source region and a second drain region. Here, the first gate electrode and the second gate electrode are electrically coupled, the first source region and the second source region are electrically coupled, and the first drain region and the second drain region are electrically coupled. Accordingly, the first MISFET and the second MISFET are coupled in parallel. In addition, a threshold voltage of the first MISFET differs from a threshold voltage of the second MISFET.

According to a typical embodiment, a semiconductor device can be formed by common-node transistors which include plural MISFETs having one node in common, and by common-node transistors which employ an MISFET of a high threshold voltage and an MISFET of a low threshold voltage. (The common-node transistors are defined as plural MISFETs in which each gate electrode, each source region, each drain region, and each substrate potential are electrically coupled mutually.) Therefore, the leakage current can be reduced rather than the case where one node is comprised of an MISFET of a low threshold voltage. On the other hand, the operating speed can be improved rather than the case where one node is comprised of an MISFET of a high threshold voltage. That is, in comparison with the case where one node is comprised of an MISFET of a low threshold voltage, or the case where one node is comprised of an MISFET of a high threshold voltage, in the case where a circuit element is comprised of the common-node transistors and where the common-node transistors employ an MISFET of a high threshold voltage and an MISFET of a low threshold voltage, it becomes easier to satisfy both of the improvement of operating speed and the reduction of a leakage current. By intermingling in the common-node transistors an MISFET of a high threshold voltage and an MISFET of a low threshold voltage, the occupied area can be reduced rather than in the case where the common-node transistors are comprised of only MISFETs of a high threshold voltage.

The following explains briefly the effect acquired by the typical invention among the inventions disclosed in the present application.

It is possible to satisfy both of the improvement of the processing speed and the reduction of the leakage current of an MISFET which configures an integrated circuit. It is possible to attain the reduction of the leakage current and the miniaturization of the semiconductor device. Furthermore, it is possible to produce an effect that both of the improvement of the processing speed and the reduction of the leakage current of the MISFET are satisfied, and that the miniaturization of the semiconductor device is attained.

BRIEF DESCRIPTION OF THE DRAWINGS

FIG. 12A is a chart illustrating the layout configuration corresponding to the circuit diagram of FIG. 11A;

FIG. 12B is a chart illustrating the layout configuration corresponding to the circuit diagram of FIG. 11B;

FIG. 12C is a chart illustrating the layout configuration corresponding to the circuit diagram of FIG. 11C;

FIG. 19A is a circuit diagram illustrating a NAND circuit according to Embodiment 3, more specifically illustrating an example of employing common-node transistors with different threshold voltages in lieu of a p-channel type MISFET of a single body;

FIG. 19B is a circuit diagram illustrating a NAND circuit according to Embodiment 3, more specifically illustrating an example of employing common-node transistors with different threshold voltages in lieu of an n-channel type MISFET of a single body;

FIG. 19C is a circuit diagram illustrating a NAND circuit according to Embodiment 3, more specifically illustrating an example of employing common-node transistors with different threshold voltages in lieu of both of a p-channel type MISFET of a single body and an n-channel type MISFET of a single body;

FIG. 24A is a chart illustrating the layout configuration corresponding to the circuit diagram of FIG. 23A;

FIG. 24B is a chart illustrating the layout configuration corresponding to the circuit diagram of FIG. 23B;

FIG. 24C is a chart illustrating the layout configuration corresponding to the circuit diagram of FIG. 23C;

FIG. 25 is a chart illustrating the configuration of a memory module according to Embodiment 5;

DETAILED DESCRIPTION OF PREFERRED EMBODIMENTS

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step etc.) is not necessarily indispensable, except for the case where it is clearly specified in particular and where it is considered to be clearly indispensable from a theoretical point of view, etc.

Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

In all the drawings for explaining embodiments, the same symbol is attached to the same member, as a principle, and the repeated explanation thereof is omitted. In order to make a drawing intelligible, hatching may be attached even if it is a plan view.

Embodiment 1

Figure 1:
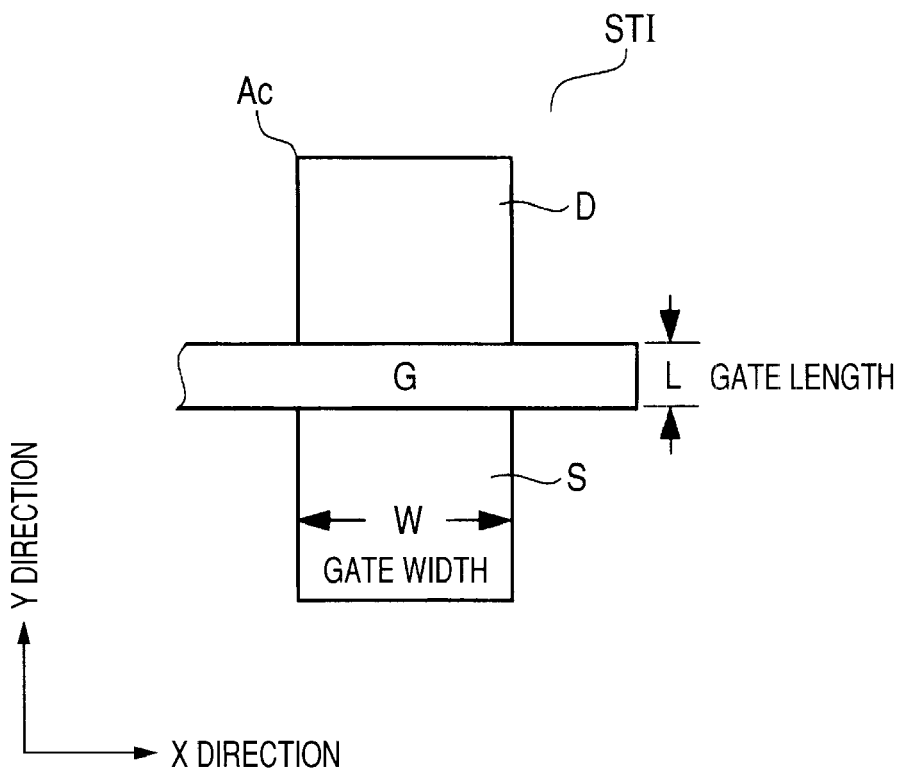
FIG. 1 is a chart illustrating an example of the plane configuration of an MISFET, more specifically illustrating a gate length and a gate width of a gate electrode.
Figure 2:
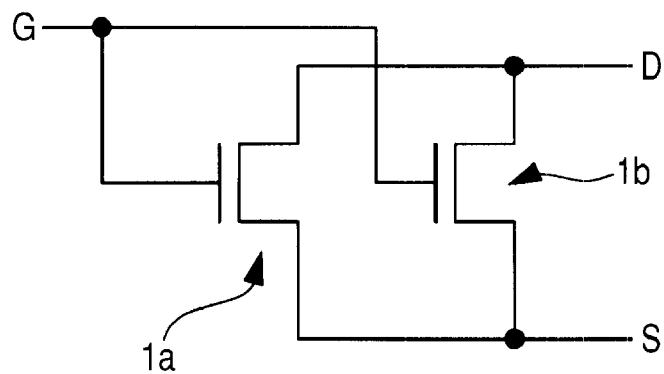
FIG. 2 is a circuit diagram illustrating common-node transistors according to Embodiment 1 of the present invention.

First, referring to drawings, an MISFET according to Embodiment 1 is explained. FIG. 2 is a circuit diagram illustrating an MISFET in the present embodiment 1. As illustrated in FIG. 2, an n-channel type MISFET 1a and an n-channel type MISFET 1b are coupled in parallel, and gate electrodes G are electrically coupled. That is, a source region S of the n-channel type MISFET 1a and a source region S of the n-channel type MISFET 1b are electrically coupled, and a drain region D of the n-channel type MISFET 1a and a drain region D of the n-channel type MISFET 1b are electrically coupled. Further, a gate electrode G of the n-channel type MISFET 1a and a gate electrode G of the n-channel type MISFET 1b are also electrically coupled. Plural MISFETs which have in common the source region S, the drain region D, and the gate electrode G in this way is called common-node transistors in the present specification.

FIG. 2 illustrates the circuit diagram of the common-node transistors which have in common the source region S, the drain region D, and the gate electrode G. The circuit element illustrated in FIG. 2 is formed by common-node transistors (plural transistors) instead of what is originally configured by one MISFET. Namely, in the present embodiment 1 as illustrated in FIG. 2, one of the features lies in the point that a single MISFET is configured by the common-node transistors which include plural MISFETs. Furthermore, another one of the features of the present embodiment 1 lies in the point that threshold voltages may differ mutually in the n-channel type MISFET 1a and the n-channel type MISFET 1b included in the common-node transistors.

For example, in order to configure a circuit element by one MISFET and to improve operating speed, a low-Vth MISFET of a low threshold voltage is employed as the circuit element. This is because a high-speed operation becomes possible by employing a low-Vth MISFET of a low threshold voltage. However, the low-Vth MISFET has the property that the operating speed can be improved, but the leakage current at the time of OFF becomes large. Namely, when a low-Vth MISFET is employed as a circuit element of an integrated circuit, it is possible to make the integrated circuit perform high-speed operation, but on the other hand, the leakage current of the integrated circuit increases, causing increase of power consumption of the integrated circuit. Consequently, it is not always desirable to configure all the circuit elements included in the integrated circuit by low-Vth MISFETs, from a viewpoint that both of the improvement of operating speed and the reduction of a leakage current should be satisfied.

On the other hand, in order to configure a circuit element by one MISFET and to reduce a leakage current, a high-Vth MISFET of a high threshold voltage can be employed as the circuit element. The high-Vth MISFET can reduce the leakage current at the time of OFF. However, the high-Vth MISFET has the property that the leakage current can be reduced, but the operating speed becomes slow. Namely, when a high-Vth MISFET is employed as a circuit element of an integrated circuit, it is possible to reduce the leakage current of the integrated circuit; but on the other hand, the operating speed of the integrated circuit will fall. Consequently, it is not always desirable to configure all the circuit elements included in the integrated circuit by high-Vth MISFETs, from a viewpoint that both of the improvement of operating speed and the reduction of a leakage current should be satisfied.

As described above, in order to satisfy both of the improvement of operating speed and the reduction of a leakage current, which are in a trade-off relationship, it is understandable that it is difficult to configure an integrated circuit by a circuit element in units of a single MISFET.

Accordingly, in the present embodiment 1, the integrated circuit is comprised of a circuit element in units of plural MISFETs. Namely, the source region, the drain region, and the gate electrode of two MISFETs are electrically coupled, respectively, so that common-node transistors may be formed. Here, two MISFETs which configure the common-node transistors are rendered so as to have different threshold voltages each other. That is, in the present embodiment 1, the common-node transistors are comprised of a low-Vth MISFET and a high-Vth MISFET. By composing an integrated circuit by the common-node transistors as a unit of the circuit element, the improvement of the operating speed due to the low-Vth MISFET and the reduction of the leakage current due to the high-Vth MISFET can be attained. Namely, in the common-node transistors as illustrated in FIG. 2, since the source region S, the drain region D, and the gate electrode G are electrically coupled respectively, one function is shared by the common-node transistors. Consequently, the operating speed of the common-node transistors is higher than the operating speed of a single high-Vth MISFET. Therefore, the operating speed of the common-node transistors improves. On the other hand, the leakage current is shared by the low-Vth MISFET and the high-Vth MISFET which are coupled in parallel. Since the leakage current can be suppressed by the high-Vth MISFET, the leakage current of the whole common-node transistors coupled in parallel becomes smaller than the leakage current of the circuit element configured by a single low-Vth MISFET. In this way, by composing the circuit element by the common-node transistors, and by composing the common-node transistors by a low-Vth MISFET and a high-Vth MISFET, it becomes possible to satisfy both of the improvement of the operating speed and the reduction of the leakage current.

Figure 3:
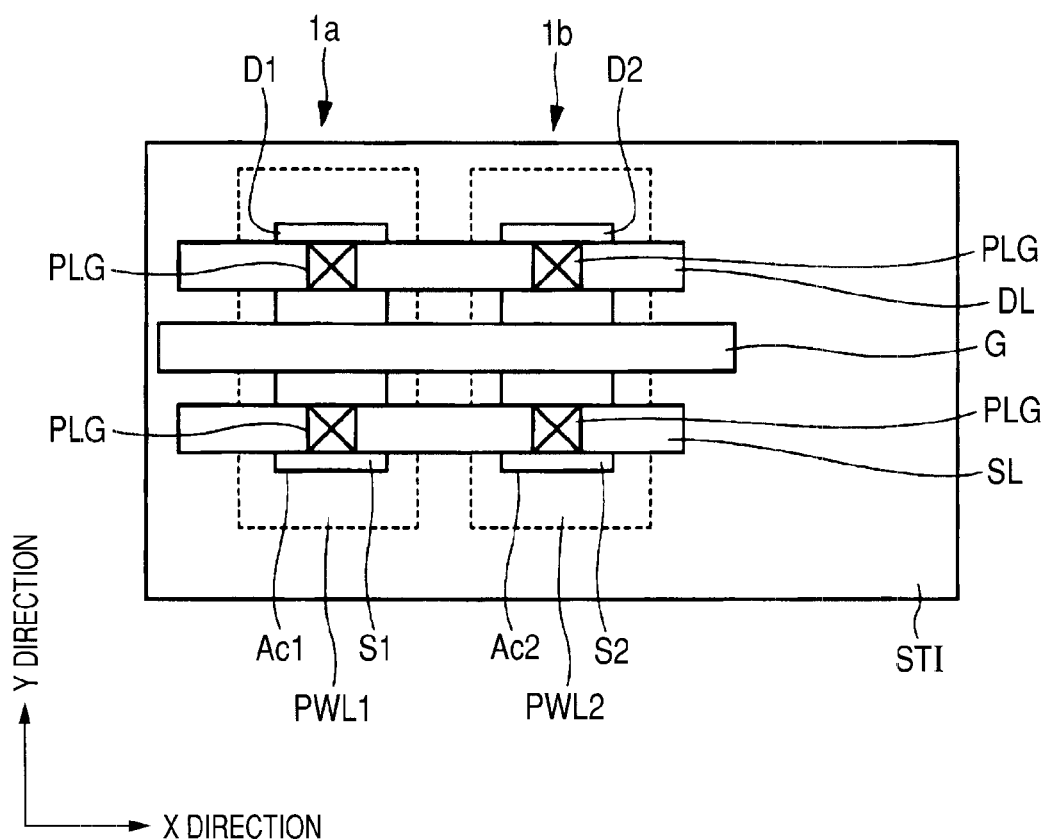
FIG. 3 is a chart illustrating the layout configuration of the common-node transistors illustrated in FIG. 2.

Next, the layout configuration of the common-node transistors illustrated in FIG. 2 is explained. FIG. 3 is a plan view illustrating the layout configuration of the n-channel type MISFET 1a and the n-channel type MISFET 1b, illustrated in FIG. 2. As illustrated in FIG. 3, in a semiconductor substrate, a rectangle active region Ac1 and a rectangle active region Ac2 are arranged side by side so that they may line up in the x direction. An element isolation region STI is formed in the circumference of the active region Ac1 and the active region Ac2, and the active region Ac1 and the active region Ac2 are separated from each other by the element isolation region STI. The element isolation region STI is formed by embedding an insulator layer, such as a silicon oxide film, in a groove which is formed in the semiconductor substrate.

In the semiconductor substrate, a p-type well PWL1 comprised of a p-type semiconductor region is formed so as to encompass the active region Ac1. The p-type well PWL1 is formed ranging from the active region Ac1 to a part of a lower layer of the element isolation region STI. Similarly, in the semiconductor substrate, a p-type well PWL2 comprised of a p-type semiconductor region is formed so as to encompass the active region Ac2. The p-type well PWL2 is formed ranging from the active region Ac2 to a part of a lower layer of the element isolation region STI. The p-type well PWL1 and the p-type well PWL2 are also arranged side by side, but mutually separated, in the x direction. Subsequently, over the active region Ac1 and the active region Ac2, a gate electrode G is formed so as to extend in the x direction, passing over the active region Ac1 and the active region Ac2. An n-channel type MISFET 1a is configured by the active region Ac1 and the gate electrode G, and an n-channel type MISFET 1b is configured by the active region Ac2 and the gate electrode G.

First, the configuration of the n-channel type MISFET 1a is explained. Over the active region Ac1, the gate electrode G extends in the x direction, and the present gate electrode G functions as a gate electrode of the n-channel type MISFET 1a. A pair of areas which are in the active region Ac1 and sandwich the gate electrode G are a source region S1 and a drain region D1. To be specific, in FIG. 3, among the areas which sandwich the gate electrode G within the active region Ac1, the area of the lower paper side is the source region S1 and the area of the upper paper side is the drain region D1. The source region S1 and the drain region D1 are formed from the n-type semiconductor region in which an n-type impurity, such as phosphorus and arsenic, is introduced into the active region Ac1.

Between the source region S1 and the drain region D1, a channel region (an area formed directly under the gate electrode G) is formed. Over the active region Ac1 in which the present channel region is formed, the gate electrode G is formed through an interposed gate insulating film (not shown). In this manner, the n-channel type MISFET 1a is formed in the active region Ac1.

Next, the configuration of the n-channel type MISFET 1b is explained. Over the active region Ac2, the gate electrode G extends in the x direction, and the present gate electrode G functions as a gate electrode of the n-channel type MISFET 1b. Namely, the gate electrode G not only functions as a gate electrode of the n-channel type MISFET 1a, but functions as a gate electrode of the n-channel type MISFET 1b. A pair of areas which are in the active region Ac2 and sandwich the gate electrode G are a source region S2 and a drain region D2. To be specific, in FIG. 3, among the areas which sandwich the gate electrode G within the active region Ac2, the area of the lower paper side is the source region S2 and the area of the upper paper side is the drain region D2. The source region S2 and the drain region D2 are formed from the n-type semiconductor region in which an n-type impurity, such as phosphorus and arsenic, is introduced into the active region Ac2.

Between the source region S2 and the drain region D2, a channel region (an area formed directly under the gate electrode G) is formed. Over the active region Ac2 in which the present channel region is formed, the gate electrode G is formed through an interposed gate insulating film (not shown). In this manner, the n-channel type MISFET 1b is formed in the active region Ac2.

Next, the coupling relation of the n-channel type MISFET 1a and the n-channel type MISFET 1b which are configured as described above is explained. First, the gate electrode G is formed so as to extend in the x direction over the active region Ac1 and the active region Ac2. This gate electrode G functions as a gate electrode of the n-channel type MISFET 1a over the active region Ac1, and functions as a gate electrode of the n-channel type MISFET 1b over the active region Ac2. Consequently, this fact means that the gate electrode of the n-channel type MISFET 1a and the gate electrode of the n-channel type MISFET 1b are comprised of the common gate electrode G, and that the gate electrode of the n-channel type MISFET 1a and the gate electrode of the n-channel type MISFET 1b are electrically coupled.

Furthermore, the source region S1 of the n-channel type MISFET 1a and the source region S2 of the n-channel type MISFET 1b are electrically coupled by a source line SL via a plug PLG. Similarly, the drain region D1 of the n-channel type MISFET 1a and the drain region D2 of the n-channel type MISFET 1b are also electrically coupled by a drain line DL via a plug PLG. The above fact indicates that the n-channel type MISFET 1a and the n-channel type MISFET 1b configure common-node transistors.

Here, in the n-channel type MISFET 1a and the n-channel type MISFET 1b, the gate electrode (the gate electrode G), the source region (the source region S1 and the source region S2), and the drain region (the drain region D1 and the drain region D2) are electrically coupled, respectively. Therefore, it is conceivable that the active region Ac1 and the active region Ac2 may be formed by one active region, without separating them. However, it is necessary to separate the active region Ac1 and the active region Ac2 by the element isolation region STI in the present embodiment 1. This point is explained.

The common-node transistors are comprised of the n-channel type MISFET 1a and the n-channel type MISFET 1b in the present embodiment 1. At this time, in the present embodiment 1, the n-channel type MISFET 1a and the n-channel type MISFET 1b are not made to have the same threshold voltage. On the contrary, the n-channel type MISFET 1a and the n-channel type MISFET 1b are made to have different threshold voltages. This is one of the features of the present embodiment. That is, in the present embodiment 1, simultaneous satisfaction is attained for both of the improvement of the operating speed and the reduction of the leakage current, by composing the common-node transistors by a low-Vth MISFET and a high-Vth MISFET. For example, in the present embodiment 1, the n-channel type MISFET 1a is formed by a high-Vth MISFET of a high threshold voltage and the n-channel type MISFET 1b is formed by a low-Vth MISFET of a low threshold voltage.

In the present embodiment 1, one of the features is to make the common-node transistors have different threshold voltages. Imparting the different threshold voltages is practiced by changing the concentration of impurity introduced into the channel region of the MISFET. Namely, the impurity concentration of the impurity introduced into the channel region of the n-channel type MISFET 1a and the impurity concentration of the impurity introduced into the channel region of the n-channel type MISFET 1b are different. Specifically, since the n-channel type MISFET 1a and the n-channel type MISFET 1b are n-channel type MISFETs, the impurity introduced into the channel region for adjustment of the threshold voltage is a p-type impurity, such as boron. When the n-channel type MISFET 1a is formed by a high-Vth MISFET and, the n-channel type MISFET 1b is formed by a low-Vth MISFET, for example, the impurity concentration of the p-type impurity introduced into the channel region of the n-channel type MISFET 1a is set to be less than the impurity concentration of the p-type impurity introduced into the channel region of the n-channel type MISFET 1b.

Introduction of the impurity to the channel region is carried out by implanting an impurity by an ion injection method to the whole surface of the active region Ac1 and to the whole surface of the active region Ac2. Consequently, when the active region Ac1 and the active region Ac2 are formed by one active region without separation, an impurity will be introduced all over this one active region. From this reason, in one active region, it is difficult to change the impurity concentration of the impurity introduced into a forming region of the n-channel type MISFET 1a and a forming region of the n-channel type MISFET 1b.

On the other hand, when the active region Ac1 to form the n-channel type MISFET 1a and the active region Ac2 to form the n-channel type MISFET 1b are separated as in the present embodiment 1, the impurity can be introduced individually in each of the active region Ac1 and the active region Ac2. Namely, as a result of the fact that the impurity can be introduced into the active region Ac1 and the active region Ac2 with different impurity concentration, it becomes easy to differentiate the threshold voltage of the n-channel type MISFET 1a and the threshold voltage of the n-channel type MISFET 1b. For example, when the common-node transistors are configured by plural MISFETs which have the same threshold voltage, it is possible to form in common the active region of the common-node transistors. However, in the present embodiment 1, since the common-node transistors are comprised of plural MISFETs with different threshold voltages, the active region which configures each MISFET is separated.

Figure 4:
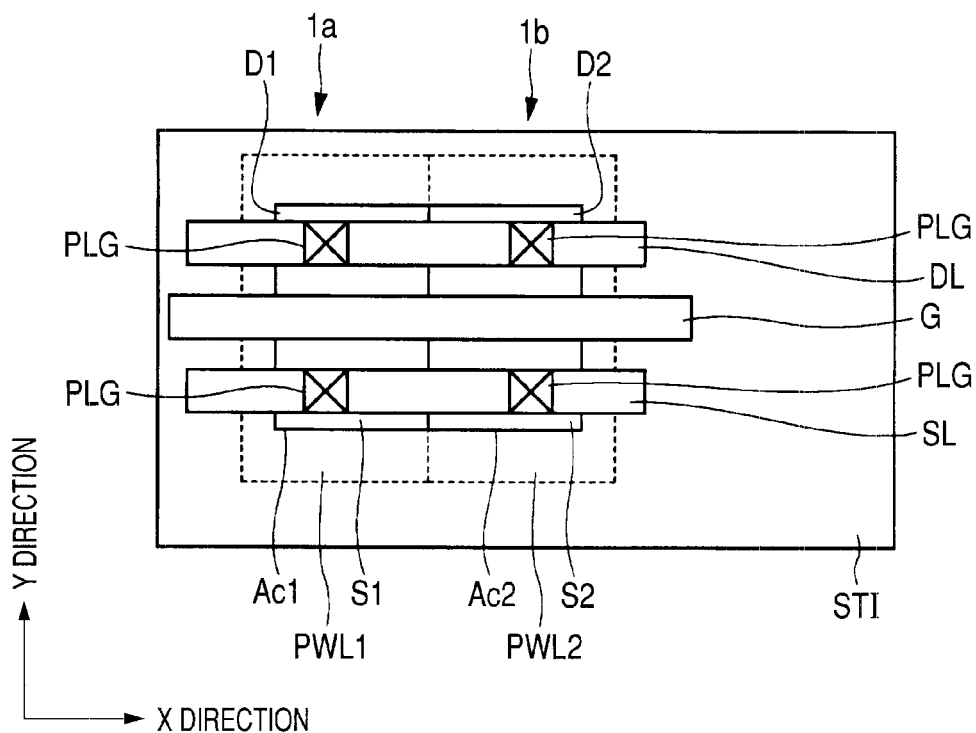
FIG. 4 is a chart illustrating the layout configuration of the common-node transistors illustrated in FIG. 2.

FIG. 4 illustrates the embodiment in cases where the active region Ac1 and the active region Ac2 are arranged adjoining each other without separation. In FIG. 4, the symbols used are the same as in FIG. 3, and the explanation thereof is omitted. As explained in FIG. 3, an impurity can be introduced into the active region Ac1 and the active region Ac2 with a different impurity concentration, by separating the active region Ac1 and the active region Ac2. As a result, it becomes easy to differentiate the threshold voltage of the n-channel type MISFET 1a and the threshold voltage of the n-channel type MISFET 1b. However, the layout of FIG. 4 becomes realizable only when a layout rule allows the active region Ac1 and the active region Ac2 to adjoin according to process conditions. That is, the layout as illustrated in FIG. 4 becomes possible, in which the p-type well PWL1 and the p-type well PWL2 are arranged in contact with each other, and the active region Ac1 and the active region Ac2 are arranged in contact with each other. In this case, the element isolation region STI between the p-type well PWL1 and the p-type well PWL2, as illustrated in FIG. 3, can be omitted, producing the effect that the area can be reduced as much.

In the present embodiment 1, the circuit element which has been formed by one MISFET is formed by the common-node transistors including plural MISFETs with different threshold voltages. From this, a simple thinking will lead to the fact that the occupied area of the circuit element may increase since the number of MISFET increases. However, the occupied area of the common-node transistors including plural MISFETs with different threshold voltages can be made in fact smaller than the occupied area of one high-Vth MISFET, for example. This point is explained.

Figure 5:
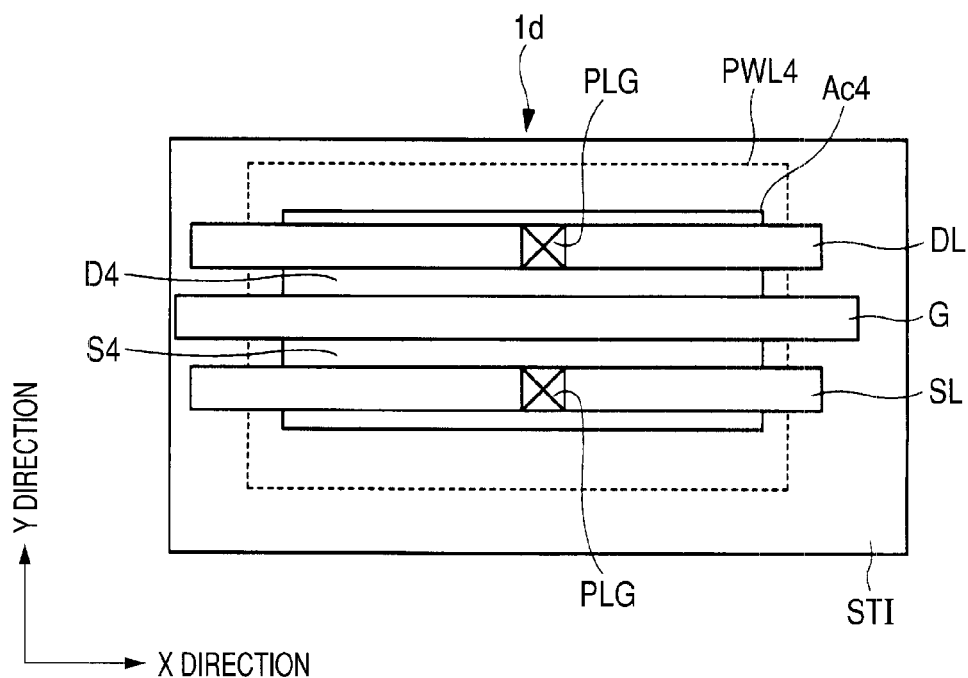
FIG. 5 is a chart illustrating the layout configuration of a high-Vth MISFET of a single body for comparison with the common-node transistors according to Embodiment 1.

FIG. 5 is a plan view illustrating the layout configuration of the n-channel type MISFET 1d comprised of a high-Vth MISFET. The configuration of the n-channel type MISFET 1d is explained using FIG. 5. As illustrated in FIG. 5, an active region Ac4 of a rectangular shape is formed in a semiconductor substrate, and an element isolation region STI is formed in the circumference of the active region Ac4. In the semiconductor substrate, a p-type well PWL4 comprised of a p-type semiconductor region is formed so as to encompass the active region Ac4. The p-type well PWL4 is formed ranging from the active region Ac4 to a part of a lower layer of the element isolation region STI.

Subsequently, a gate electrode G is formed so as to extend in the x direction passing over the active region Ac4. A pair of areas which are in the active region Ac4 and sandwich the gate electrode G are a source region S4 and a drain region D4. The source region S4 is electrically coupled with a source line SL via a plug PLG, and the drain region D4 is electrically coupled with a drain line DL via a plug PLG. A channel region is formed the in active region Ac4 between the source region S4 and the drain region D4. In other words, the channel region is formed in the active region Ac4 directly under the gate electrode G. In the n-channel type MISFET 1d configured in this way, the impurity concentration of the impurity introduced into the channel region is adjusted so that a threshold voltage may become high. Namely, the n-channel type MISFET 1d acts as a high-Vth MISFET.

Consequently, according to the n-channel type MISFET 1d, while there is an advantage that the leakage current can be reduced, there is a disadvantage that the operating speed falls. Accordingly, when the single-body n-channel type MISFET 1d is employed for a circuit element, it is desirable to improve the operating speed even a little. For this purpose, the gate width of the n-channel type MISFET 1d is often expanded. Namely, when the gate width of the n-channel type MISFET 1d is expanded, the operating speed improves compared with the case where the gate width is narrow. In this way, the gate width is expanded in order to improve the operating speed, in employing the single-body high-Vth MISFET (the n-channel type MISFET 1d) as a circuit element. However, since a wider gate width means a broader width of the active region Ac4 in the x direction, the occupied area of the n-channel type MISFET 1d becomes large.

On the other hand, in the present embodiment 1 (refer to FIG. 3), the common-node transistors comprised of a high-Vth MISFET (the n-channel type MISFET 1a) and a low-Vth MISFET (the n-channel type MISFET 1b) are employed in place of the single-body high-Vth MISFET (the n-channel type MISFET 1d). In this case, the gate width of the high-Vth MISFET (the n-channel type MISFET 1a) can be made narrower than the gate width of the single-body high-Vth MISFET (the n-channel type MISFET 1d). This is because the operating speed improves due to the low-Vth MISFET (the n-channel type MISFET 1b) when the common-node transistors are employed as in the present embodiment 1. Namely, in the present embodiment 1, by employing the common-node transistors, the improvement of the operating speed is realized by the low-Vth MISFET (the n-channel type MISFET 1b), and the reduction of the leakage current is realized by the high-Vth MISFET (the n-channel type MISFET 1a). Namely, when a single-body MISFET is employed, it is necessary to adopt the configuration which satisfies fully both of the improvement of the operating speed and the reduction of the leakage current of the single-body MISFET. However, when the common-node transistors are employed as in the present embodiment 1, the improvement of the operating speed and the reduction of the leakage current can be both promoted, by combining the high-Vth MISFET (the n-channel type MISFET 1a) and the low-Vth MISFET (the n-channel type MISFET 1b). Therefore, it is possible to ease the compatibility condition of the improvement of the operating speed and the reduction of the leakage current, which are desirable for each of the high-Vth MISFET (the n-channel type MISFET 1a) and the low-Vth MISFET (the n-channel type MISFET 1b), composing the common-node transistors.

For example, in the high-Vth MISFET (the n-channel type MISFET 1a) which configures the common-node transistors, specification can be fully satisfied, even if the high-Vth MISFET (the n-channel type MISFET 1a) itself does not promote the improvement of the operating speed as the single-body high-Vth MISFET (the n-channel type MISFET 1d), because the operating speed can be improved by the low-Vth MISFET (the n-channel type MISFET 1b). Consequently, as seen from the comparison of FIG. 3 and FIG. 5, the magnitude of the gate width of the high-Vth MISFET (the n-channel type MISFET 1a) plus the gate width of the low-Vth MISFET (the n-channel type MISFET 1b) can be made smaller than the gate width of the single-body high-Vth MISFET (the n-channel type MISFET 1d), wherein the high-Vth MISFET (the n-channel type MISFET 1a) and the low-Vth MISFET (the n-channel type MISFET 1b) configure the common-node transistors. From the fact described above, it is understood that the occupied area of the common-node transistors configured by plural MISFETs with different threshold voltages can be made smaller than the occupied area of the single-body high-Vth MISFET (the n-channel type MISFET 1d).

Here, consideration will be given to the case where a low-Vth MISFET of a single body is employed. In the single-body low-Vth MISFET, since the threshold voltage is low, the operating speed can be improved, but the disadvantage is that the leakage current increases. In the single-body low-Vth MISFET, in order to reduce the leakage current, the gate width is made narrower. Consequently, when the single-body low-Vth MISFET is employed, it seems that the occupied area of a circuit element can be made small since the gate width becomes small. Namely, it seems that the occupied area of the single-body low-Vth MISFET can be made smaller than the occupied area of the common-node transistors.

To be sure, when the single-body low-Vth MISFET is employed, the occupied area of the circuit element can be reduced. However, when the single-body low-Vth MISFET is employed, it becomes difficult to satisfy specification, with difficulties in satisfying both of the improvement of the operating speed and the reduction of the leakage current, as the miniaturization of MISFET advances. Advancement of the miniaturization of MISFET implies that the width of the channel region formed between a source region and a drain region becomes smaller, and that the source region and the drain region approach each other, resulting in increase of the leakage current. That is, the leakage current can be reduced by narrowing the gate width in the single-body low-Vth MISFET, however, even if the gate width is reduced, it is becoming difficult to realize the reduction of the leakage current which satisfies specification, due to the increase of the leakage current by the miniaturization of MISFET.

From the above fact, when the single-body low-Vth MISFET is employed, the occupied area can be made small, but both of the improvement of the operating speed and the reduction of the leakage current can not be satisfied, therefore, the specification cannot be satisfied. On the other hand, when the high-Vth MISFET (the n-channel type MISFET 1d) of a single body is employed, it is desirable to enlarge the gate width, in order to satisfy specification as well as both of the improvement of the operating speed and the reduction of the leakage current. That is, pursuing the compatibility of the improvement of the operating speed and the reduction of the leakage current leads to the increase of the occupied area.

On the other hand, when the common-node transistors including plural MISFETs with different threshold voltages are employed as in the present embodiment 1, it is possible to satisfy the specification, as well as both of the improvement of the operating speed and the reduction of the leakage current, even when the miniaturization of MISFET is advanced. Further, as described above, the occupied area can be made smaller than the single-body high-Vth MISFET (the n-channel type MISFET 1d). Namely, according to the common-node transistors in the present embodiment 1, even if the miniaturization of MISFET advances, it is possible to satisfy both of the improvement of the operating speed and the reduction of the leakage current, and the occupied area of the circuit element can be made small in the range where both of the improvement of the operating speed and the reduction of the leakage current are satisfied.

Next, it will be explained that the optimal layout configuration of the common-node transistors including plural MISFETs with different threshold voltages is the layout configuration illustrated in FIG. 3. As illustrated in FIG. 3, the active region Ac1 serving as the source region S1 and the drain region D1 of the n-channel type MISFET 1a, and the active region Ac2 serving as the source region S2 and the drain region D2 of the n-channel type MISFET 1b are arranged in the x direction. The common gate electrode G which serves as the gate electrode of the n-channel type MISFET 1a and the gate electrode of the n-channel type MISFET 1b also extends in the x direction. In such configuration, the direction where the active region Ac1 and the active region Ac2 are arranged side by side (the x direction), and the direction where the gate electrode G extends (the x direction) is in agreement. Consequently, as illustrated in FIG. 3, the gate electrode G is arranged on a straight line. Similarly, in the case of the layout configuration illustrated in FIG. 3, the source line SL and the drain line DL are arranged in the shape of a straight line in the x direction.

Figure 6:
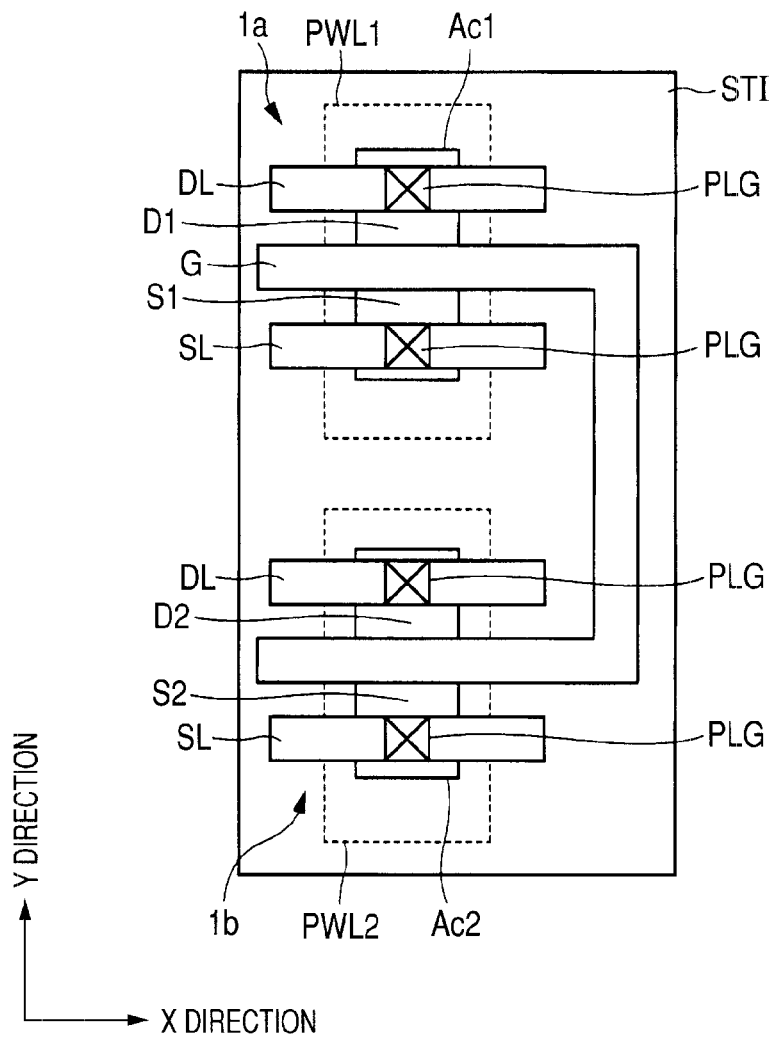
FIG. 6 is a chart illustrating another example of a layout arrangement of common-node transistors used in explaining the superiority of the layout arrangement of the common-node transistors according to Embodiment 1.

On the other hand, FIG. 6 is a chart illustrating another layout configuration of the common-node transistors. As illustrated in FIG. 6, an active region Ac1 and an active region Ac2 are arranged side by side in the y direction. On the other hand, a gate electrode G is arranged extending in the x direction along each central part of the active region Ac1 and the active region Ac2. That is, the direction where the active region Ac1 and the active region Ac2 are arranged side by side (the y direction) and the direction where the gate electrode G extends over the active region Ac1 and the active region Ac2 (the x direction) are substantially orthogonal. In this case, the gate electrode G of the n-channel type MISFET 1a and the gate electrode G of the n-channel type MISFET 1b are formed, extending in parallel, respectively. Therefore, in order to couple these gate electrodes G, it is necessary to make the gate electrode G in a laterally-facing U-shape, as illustrated in FIG. 6. Similarly, it is necessary to make the source line SL and the drain line DL as well, in a laterally-facing U-shape (not shown in FIG. 6). Accordingly, in the layout configuration illustrated in FIG. 6, in order to couple the gate electrodes G, it is necessary to make the gate electrode G in a laterally-facing U-shape, resulting in a larger occupied area, compared with the case where the gate electrode G is arranged in the shape of a straight line such as in the layout configuration illustrated in FIG. 3. Therefore, as the layout configuration of the common-node transistors, the arrangement in which the direction where the active region Ac1 and the active region Act are arranged side by side (the x direction) and the direction where the gate electrode G extends (the x direction) are substantially in agreement turns out to be desirable from a viewpoint of reducing the occupied area of the common-node transistors.

In the present embodiment 1, the use of the common-node transistors including plural MISFETs with different threshold voltages as a circuit element produces a prominent effect that both of the improvement of the operating speed and the reduction of the leakage current can be satisfied, and the occupied area of the circuit element can be reduced, even when the miniaturization of MISFET is advanced. Namely, in employing a single-body MISFET as a circuit element, usually either one of the low-Vth MISFET of a low threshold voltage or the high-Vth MISFET of a high threshold voltage is selected, and the gate width of the selected MISFET is adjusted so that both of the improvement of the operating speed and the reduction of the leakage current may be satisfied. However, it is becoming difficult to satisfy both of the improvement of the operating speed and the reduction of the leakage current, which are in a trade-off relationship, only by the adjustment of the gate width in connection with the miniaturization of MISFET.

On the other hand, by using the common-node transistors including the low-Vth MISFET of a low threshold voltage and the high-Vth MISFET of a high threshold voltage, as a circuit element as in the present embodiment 1, the advantage of the high speed performance of the operating speed in the low-Vth MISFET and the reduction performance of the leakage current in the high-Vth MISFET can be enjoyed. Moreover, it becomes easy to satisfy both of the improvement of the operating speed and the reduction of the leakage current, which are in a trade-off relationship, even when the miniaturization of MISFET is advanced. In this way, the speediness of the operating speed and the reduction nature of the leakage current can be adjusted by providing the low-Vth MISFET of a low threshold voltage and the high-Vth MISFET of a high threshold voltage. Moreover, the speediness of the operating speed and the reduction nature of the leakage current can be adjusted in detail by changing the gate width in each MISFET. For example, in a module (an integrated circuit) which employs the common-node transistors including the low-Vth MISFET of a low threshold voltage and the high-Vth MISFET of a high threshold voltage, as a circuit element, adjustment of enlarging the gate width of the low-Vth MISFET is also possible, when further improvement of the operating speed is desired. Moreover, for example, in a module (an integrated circuit) which employs the common-node transistors including the low-Vth MISFET of a low threshold voltage and the high-Vth MISFET of a high threshold voltage, as a circuit element, adjustment of narrowing the gate width of the low-Vth MISFET is also possible, when further reduction of the leak current is desired. In this way, detailed adjustment of the performance of the circuit element becomes possible by employing the common-node transistors including the low-Vth MISFET of a low threshold voltage and the high-Vth MISFET of a high threshold voltage, as the circuit element, and adjusting the gate width of each MISFET.

In the present embodiment 1, the common-node transistors, which include two MISFETs (the n-channel type MISFET 1a and the n-channel type MISFET 1b) with different threshold voltages, are explained. However, the present invention is not restricted to the embodiment explained, but can also be applied to the case of the common-node transistors including three or more MISFETs with different threshold voltages.

Figure 7:
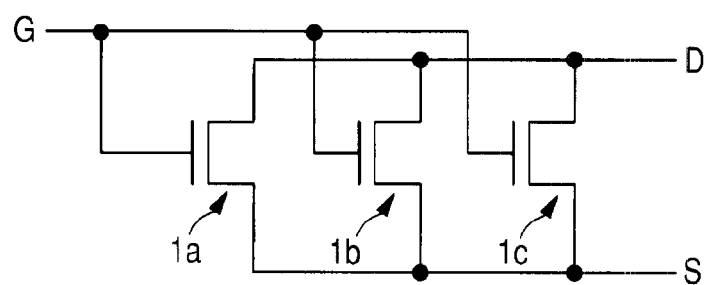
FIG. 7 is a circuit diagram illustrating common-node transistors according to a modification of Embodiment 1.

As a modification of the present embodiment 1, the common-node transistors including three MISFETs with different threshold voltages are explained in the following. FIG. 7 is a circuit diagram illustrating the common-node transistors including three MISFETs with different threshold voltages. As illustrated in FIG. 7, an n-channel type MISFET 1a, an n-channel type MISFET 1b, and an n-channel type MISFET 1c are coupled in parallel, and gate electrodes G are electrically coupled. Namely, a source region S of the n-channel type MISFET 1a, a source region S of the n-channel type MISFET 1b, and a source region S of the n-channel type MISFET 1c are electrically coupled, and a drain region D of the n-channel type MISFET 1a, a drain region D of the n-channel type MISFET 1b, and a drain region D of the n-channel type MISFET 1c are electrically coupled. Furthermore, a gate electrode G of the n-channel type MISFET 1a, a gate electrode G of the n-channel type MISFET 1b, and a gate electrode G of the n-channel type MISFET 1c are also electrically coupled.

The threshold voltages of three MISFETs differ at this time. For example, the threshold voltage of the n-channel type MISFET 1a is the highest, and the threshold voltage of the n-channel type MISFET 1b is the second highest, and the threshold voltage of the n-channel type MISFET 1c is the lowest.

Figure 8:
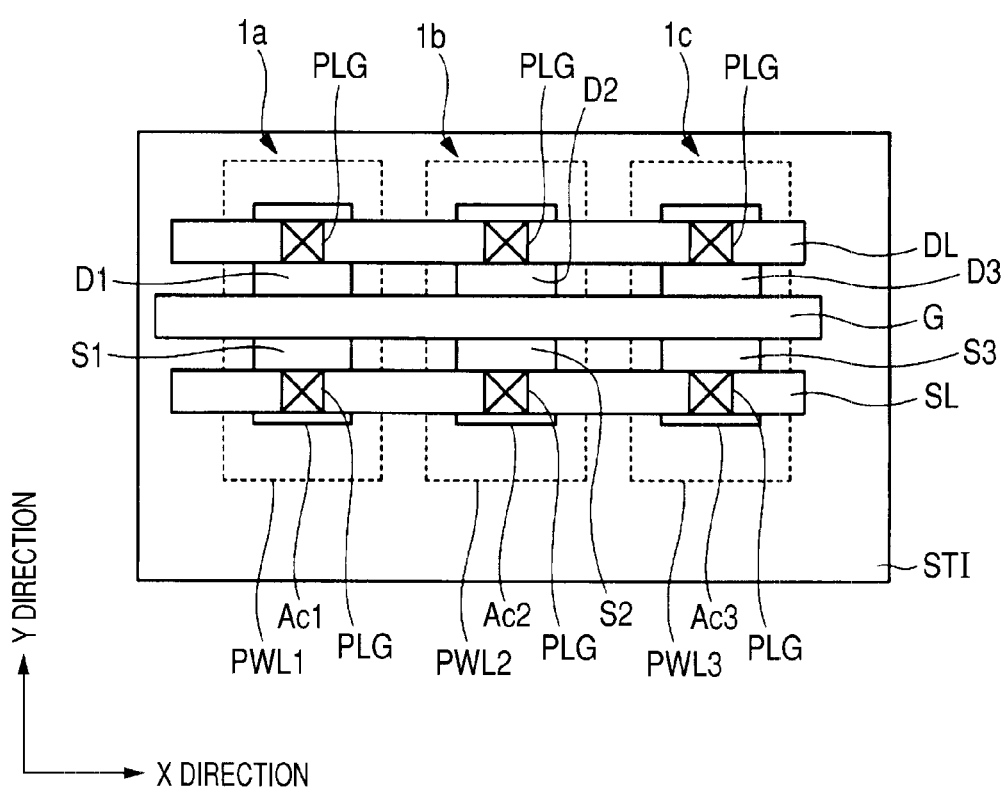
FIG. 8 is a chart illustrating the layout configuration of common-node transistors according to a modification of Embodiment 1.

Next, the layout configuration of the common-node transistors illustrated in FIG. 7 is explained. FIG. 8 is a chart illustrating the layout configuration of the common-node transistors illustrated in FIG. 7. In FIG. 8, the layout configuration of the n-channel type MISFET 1a and the n-channel type MISFET 1b is the same as that of FIG. 3. That is, an active region Ac1 and an active region Ac2 are arranged side by side in the x direction, and the gate electrode G is also arranged over the active region Ac1 and the active region Ac2, and extends in the x direction. The layout configuration of the n-channel type MISFET 1c is added in FIG. 8. This point is explained.

An active region Ac3 is arranged additionally so that it may line up in the x direction where the active region Ac1 and the active region Ac2 are arranged side by side. Namely, the active regions Ac1, Ac2, and Ac3 are arranged so as to line up in the x direction in the shape of a straight line.

The gate electrode G, which extends over the active regions Ac1 and Ac2 in the x direction, further extends in the x direction, and reaches over the active region Ac3. The gate electrode G which reaches the active region Ac3 functions also as a gate electrode of the n-channel type MISFET 1c. Namely, the gate electrode G not only functions as the gate electrode of the n-channel type MISFET 1a and the gate electrode of the n-channel type MISFET 1b, but also functions as the gate electrode of the n-channel type MISFET 1c. In this way, the gate electrode G also extends in the shape of a straight line in the x direction where the active regions Ac1, Ac2, and Ac3 are arranged.

A pair of areas which are in the active region Ac3 and sandwich the gate electrode G are a source region S3 and a drain region D3. The source region S3 and the drain region D3 are formed from the n-type semiconductor region in which an n-type impurity, such as phosphorus and arsenic, is introduced into the active region Ac3.

Between the source region S3 and the drain region D3, a channel region (an area formed directly under the gate electrode G) is formed. Over the active region Ac3 in which the present channel region is formed, the gate electrode G is formed through an interposed gate insulating film (not shown). In this manner, the n-channel type MISFET 1c is formed in the active region Ac3.

The present source region S3 is also electrically coupled with the source line SL via a plug PLG. Similarly, the drain region D3 is also electrically coupled with the drain line DL via a plug PLG. In this way, the source region S3 of the n-channel type MISFET 1c is also electrically coupled with the source region S1 of the n-channel type MISFET 1a and the source region S2 of the n-channel type MISFET 1b via the source line SL. Similarly, the drain region D3 of the n-channel type MISFET 1c is also electrically coupled with the drain region D1 of the n-channel type MISFET 1a and the drain region D2 of the n-channel type MISFET 1b via the drain line DL.

Also in the modification of the present embodiment 1 in which the common-node transistors including three MISFETs with different threshold voltages, as a circuit element, the effect similar to that of the present embodiment 1 can be acquired. Namely, by using the common-node transistors including plural MISFETs with different threshold voltages as a circuit element, it is possible to produce the prominent effect that both of the improvement of the operating speed and the reduction of the leakage current can be satisfied, and that the occupied area of the circuit element can be reduced, even when the miniaturization of MISFET is advanced.

In the present embodiment 1, the common-node transistors including plural n-channel type MISFETs with different threshold voltages are explained. However, the present embodiment is applicable not only to the case described above, but also to the common-node transistors including plural p-channel type MISFETs with different threshold voltages, for example.

Embodiment 2

Figures 9, 10:
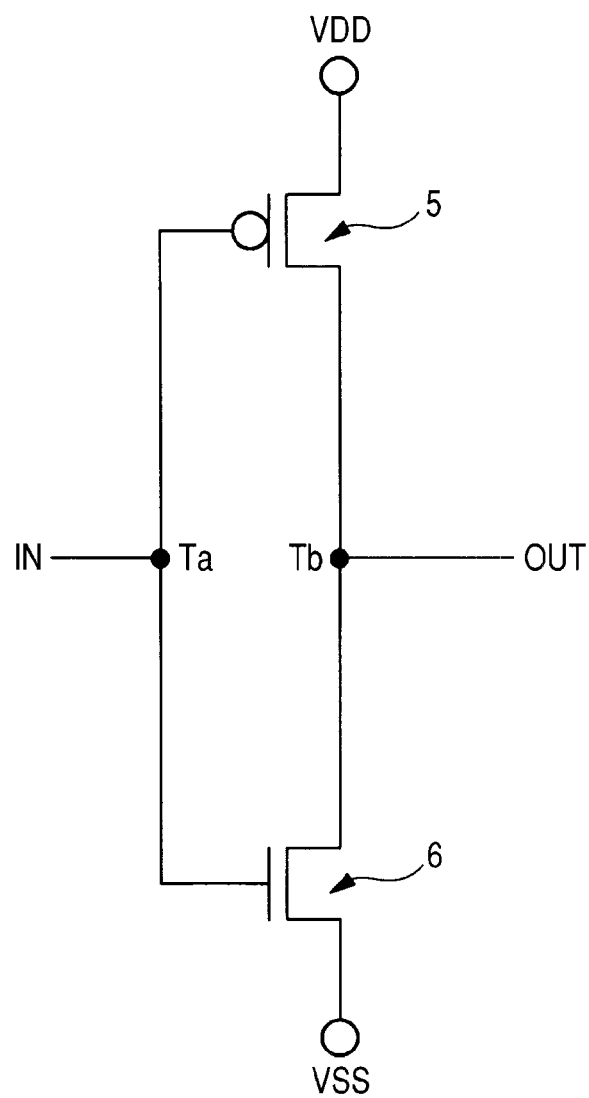
FIG. 9 is a circuit diagram illustrating a general inverter circuit.
FIG. 10 is a chart illustrating the relationship of input/output of the inverter circuit.

Embodiment 2 explains an example in which the present invention is applied to an inverter circuit. FIG. 9 is a circuit diagram illustrating a general inverter circuit. As illustrated in FIG. 9, the inverter circuit includes a p-channel type MISFET 5 and an n-channel type MISFET 6 which are coupled in series between power supply potential VDD and reference potential VSS. The p-channel type MISFET 5 is coupled to the power supply potential side, and the n-channel type MISFET 6 is coupled to the reference potential side. A gate electrode of the p-channel type MISFET 5 and a gate electrode of the n-channel type MISFET 6 are electrically coupled, and the gate electrodes serve as an input (Ta) of the inverter circuit. On the other hand, an output (Tb) of the inverter circuit serves as a coupling part of the p-channel type MISFET 5 and the n-channel type MISFET 6.

Next, operation of the inverter circuit is explained with reference to FIGS. 9 and 10. FIG. 10 is a chart illustrating the relationship of the input signal and output signal of the inverter circuit. In FIG. 9, when "H" (a high-level signal) is inputted into the input (IN) of the inverter circuit, the p-channel type MISFET 5 remains turned off, but the n-channel type MISFET 6 is turned on. Therefore, the output of the inverter circuit is pulled down to the reference potential VSS via the conducted n-channel type MISFET 6. Consequently, the output of the inverter circuit is set to "L" (a low-level signal). On the other hand, when "L" (a low-level signal) is inputted into the input (IN) of the inverter circuit, the n-channel type MISFET 6 remains turned off, but the p-channel type MISFET 5 is turned on. Therefore, the output of the inverter circuit is pulled up to the power supply potential VDD via the conducted p-channel type MISFET 5. Consequently, the output of the inverter circuit is set to "H" (a high-level signal). In this way, in the inverter circuit, it is seen that an output signal opposite to an input signal is outputted.

Figure 11A:
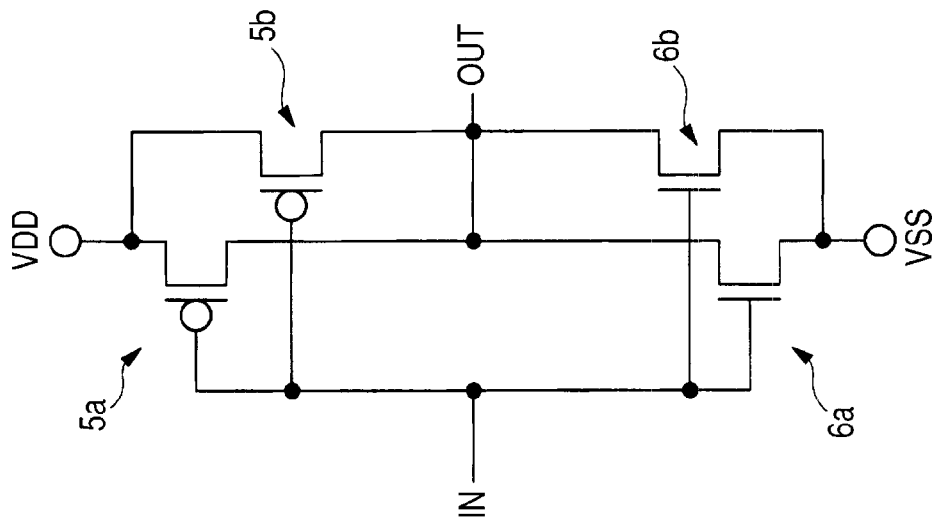
FIG. 11A is a circuit diagram illustrating an inverter circuit according to Embodiment 1, more specifically illustrating an example of employing common-node transistors with different threshold voltages in lieu of a p-channel type MISFET of a single body.
Figure 11B:
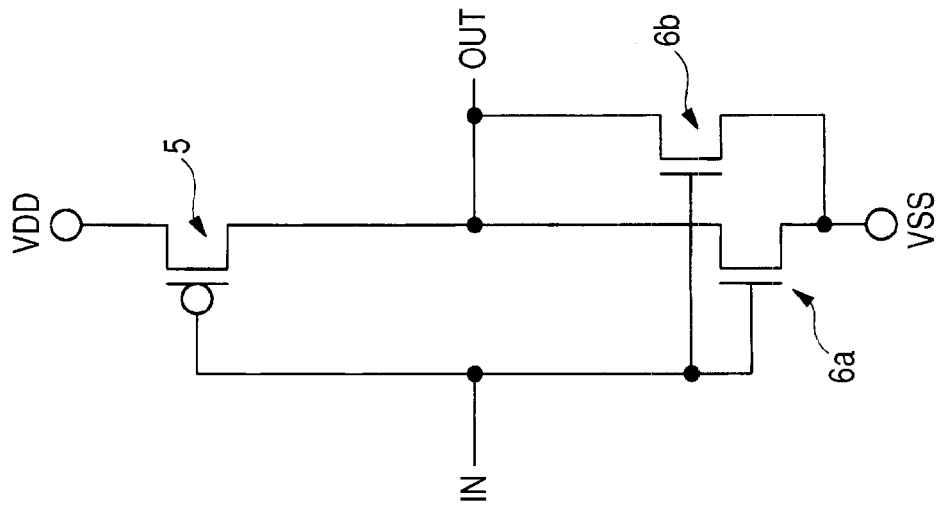
FIG. 11B is a circuit diagram illustrating an inverter circuit according to Embodiment 1, more specifically illustrating an example of employing common-node transistors with different threshold voltages in lieu of an n-channel type MISFET of a single body.
Figure 11C:
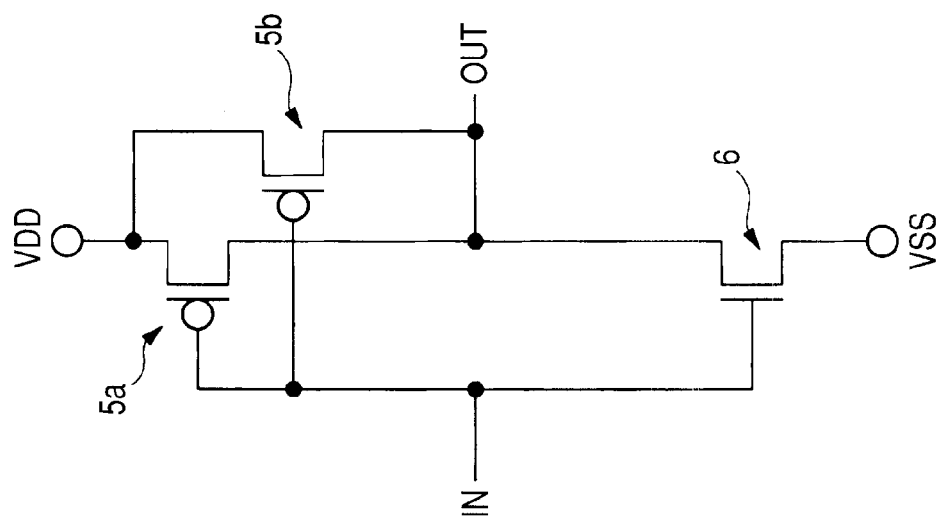
FIG. 11C is a circuit diagram illustrating an inverter circuit according to Embodiment 1, more specifically illustrating an example of employing common-node transistors with different threshold voltages in lieu of both of a p-channel type MISFET of a single body and an n-channel type MISFET of a single body.

Next, the following explains the example in which the common-node transistors in the present embodiment 2 are applied to the inverter circuit. FIGS. 11A, 11B, and 11C are circuit diagrams illustrating various illustrative embodiments in which the common-node transistors are applied as a circuit element which configures the inverter circuit. For example, FIG. 11A illustrates an example in which a p-channel type MISFET 5a and a p-channel type MISFET 5b as common-node transistors are applied to a p-channel type MISFET composing an inverter circuit. That is, in FIG. 11A, the circuit element comprised of the p-channel type MISFET 5 illustrated in FIG. 9 is comprised of the common-node transistors which include the p-channel type MISFET 5a and the p-channel type MISFET 5b. At this time, a drain region of the p-channel type MISFET 5a and a drain region of the p-channel type MISFET 5b are electrically coupled to the power supply potential VDD. A source region of the p-channel type MISFET 5a and a source region of the p-channel type MISFET 5b are electrically coupled and serve as the output of the inverter circuit. Moreover, a gate electrode of the p-channel type MISFET 5a and a gate electrode of the p-channel type MISFET 5b are electrically coupled.

The threshold voltage of the p-channel type MISFET 5a and the threshold voltage of the p-channel type MISFET 5b are set to be different. For example, the p-channel type MISFET 5a is a high-Vth MISFET of a high threshold voltage, and the p-channel type MISFET 5b is a low-Vth MISFET of a low threshold voltage.

FIG. 11B illustrates an example in which an n-channel type MISFET 6a and an n-channel type MISFET 6b as common-node transistors are applied to an n-channel type MISFET composing an inverter circuit. That is, in FIG. 11B, the circuit element comprised of the n-channel type MISFET 6 illustrated in FIG. 9 is comprised of the common-mode transistors which include the n-channel type MISFET 6a and the n-channel type MISFET 6b. At this time, a drain region of the n-channel type MISFET 6a and a drain region of the n-channel type MISFET 6b are electrically coupled and serve as the output of the inverter circuit. On the other hand, a source region of the n-channel type MISFET 6a and a source region of the n-channel type MISFET 6b are electrically coupled mutually and further coupled to the reference potential VSS. Moreover a gate electrode of the n-channel type MISFET 6a and a gate electrode of the n-channel type MISFET 6b are electrically coupled.

The threshold voltage of the n-channel type MISFET 6a and the threshold voltage of the n-channel type MISFET 6b are set to be different. For example, the n-channel type MISFET 6a is formed by the high-Vth MISFET of a high threshold voltage and the n-channel type MISFET 6b is formed by the low-Vth MISFET of a low threshold voltage.

FIG. 11C illustrates an example in which the configuration of FIG. 11A and the configuration of FIG. 11B are combined. That is, the common-node transistors which are the circuit element of the present embodiment 2 are applied to both the p-channel type MISFET and the n-channel type MISFET, which configure an inverter circuit.

FIGS. 12A, 12B, and 12C are charts illustrating the layout configuration of the inverter circuits corresponding to the circuit diagrams illustrating in FIGS. 11A, 11B, and 11C, respectively. FIG. 12A illustrates the layout configuration corresponding to FIG. 11A, FIG. 12B illustrates the layout configuration corresponding to FIG. 11B, and FIG. 12C illustrates the layout configuration corresponding to FIG. 11C.

FIG. 12A is explained. As illustrated in FIG. 12A, in a semiconductor substrate, an active region Ac5a and an active region Ac5b are formed separately and arranged side by side in the y direction. An active region Ac6 is arranged so as to line up with the active region Ac5b in the y direction. A gate electrode G extends in the y direction in the shape of a straight line, passing over the active region Ac5a and the active region Ac5b, and crossing over the active region Ac6. The present gate electrode G serves as an input (IN) of the inverter circuit.

The active region Ac5a is a forming region of the p-channel type MISFET 5a, and the active region Ac5b is a forming region of the p-channel type MISFET 5b. The active region Ac6 is a forming region of the n-channel type MISFET 6. Here, a source region and a drain region of the p-channel type MISFET 5a are formed in a pair of areas which sandwich the gate electrode G in the active region Ac5a. Specifically, the drain region is formed in the left side area of the gate electrode G, and the source region is formed in the right side area of the gate electrode G. Similarly, a source region and a drain region of the p-channel type MISFET 5b are formed in a pair of areas which sandwich the gate electrode G in the active region Ac5b. Specifically, the drain region is formed in the left side area of the gate electrode G, and the source region is formed in the right side area of the gate electrode G. A source region and a drain region of the n-channel type MISFET 6 are formed in a pair of areas which sandwich the gate electrode G in the active region Ac6. Specifically, the source region is formed in the left side area of the gate electrode G, and the drain region is formed in the right side area of the gate electrode G.

The drain region of the p-channel type MISFET 5a and the drain region of the p-channel type MISFET 5b are electrically coupled by a drain line DL5 via a plug, and the present drain line DL5 is electrically coupled with the power supply line VDDL which supplies the power supply potential. On the other hand, the source region of the p-channel type MISFET 5a and the source region of the p-channel type MISFET 5b are electrically coupled by a source line SL5 via a plug, and the output of the present source line SL5 serves as an output (OUT) of the inverter circuit.

A drain region of the n-channel type MISFET 6 is coupled to a drain line DL6 via a plug, and the present drain line DL6 is electrically coupled with the source line SL5 used as the output (OUT) of the inverter circuit. On the other hand, a source region of the n-channel type MISFET 6 is coupled to a source line SL6 via a plug, and the present source line SL6 is electrically coupled with the reference line VSSL which supplies the reference potential.

In the active region Ac5a in which the p-channel type MISFET 5a is formed, a channel region is formed directly under the gate electrode G through an interposed gate insulating film (not shown). Similarly, in the active region Ac5b in which the p-channel type MISFET 5b is formed, a channel region is formed directly under the gate electrode G through an interposed gate insulating film (not shown). Furthermore, in the active region Ac6 in which the n-channel type MISFET 6 is formed, a channel region is formed directly under the gate electrode G through an interposed gate insulating film (not shown).

The impurity concentration of an impurity introduced into the channel region of the p-channel type MISFET 5a and the impurity concentration of an impurity introduced into the channel region of the p-channel type MISFET 5b are set to be different. Consequently, the threshold voltage of the p-channel type MISFET 5a and the threshold voltage of the p-channel type MISFET 5b are different. For example, the p-channel type MISFET 5a is formed by the high-Vth MISFET of a high threshold voltage and the p-channel type MISFET 5b is formed by the low-Vth MISFET of a low threshold voltage.

The p-channel type MISFET of the inverter circuit in the present embodiment 2, configured in this way, employs the common-node transistors which include the p-channel type MISFET 5a (high-Vth MISFET) and the p-channel type MISFET 5b (low-Vth MISFET) with different threshold voltages. Consequently, as explained in Embodiment 1, even when the miniaturization of MISFET is advanced, it is possible to produce the prominent effect that both of the improvement of the operating speed and the reduction of the leakage current of the p-channel type MISFET composing the inverter circuit can be satisfied, and that the occupied area of the p-channel type MISFET can be reduced.

Next, FIG. 12B is explained. As illustrated in FIG. 12B, in the semiconductor substrate, an active region Ac6a and an active region Ac6b are formed separately and arranged side by side in the y direction. An active region Ac5 is arranged so as to line up with the active region Ac6a in the y direction.

A gate electrode G extends in the y direction in the shape of a straight line, passing over the active region Ac6b and the active region Ac6a, and crossing over the active region Ac5. The present gate electrode G serves as an input (IN) of the inverter circuit.

The active region Ac6a is a forming region of the n-channel type MISFET 6a, and the active region Ac6b is a forming region of the n-channel type MISFET 6b. The active region Ac5 is a forming region of the p-channel type MISFET 5. Here, a source region and a drain region of the n-channel type MISFET 6a are formed in a pair of areas which sandwich the gate electrode G in the active region Ac6a. Specifically, the source region is formed in the left side area of the gate electrode G, and the drain region is formed in the right side area of the gate electrode G. Similarly, a source region and a drain region of the n-channel type MISFET 6b are formed in a pair of areas which sandwich the gate electrode G in the active region Ac6b. Specifically, the source region is formed in the left side area of the gate electrode G, and the drain region is formed in the right side area of the gate electrode G. A source region and a drain region of the p-channel type MISFET 5 are formed in a pair of areas which sandwich the gate electrode G in the active region Ac5. Specifically, the drain region is formed in the left side area of the gate electrode G, and the source region is formed in the right side area of the gate electrode G.

The drain region of the n-channel type MISFET 6a and the drain region of the n-channel type MISFET 6b are electrically coupled by a drain line DL6 via a plug, and the present drain line DL6 serves as an output of the inverter circuit. On the other hand, the source region of the n-channel type MISFET 6a and the source region of the n-channel type MISFET 6b are electrically coupled by a source line SL6 via a plug, and the present source line SL6 is coupled to the reference line VSSL which supplies the reference potential.

The drain region of the p-channel type MISFET 5 is coupled to a drain line DL5 via a plug, and the present drain line DL5 is electrically coupled with the power supply line VDDL which supplies the power supply potential. On the other hand, a source region of the p-channel type MISFET 5 is coupled to a source line SL5 via a plug, and the present source line SL5 is electrically coupled with the drain line DL6 serving as the output of the inverter circuit.

In the active region Ac6a in which the n-channel type MISFET 6a is formed, a channel region is formed directly under the gate electrode G through an interposed gate insulating film (not shown). Similarly, in the active region Ac6b in which the n-channel type MISFET 6b is formed, a channel region is formed directly under the gate electrode G through an interposed gate insulating film (not shown). Furthermore, in the active region Ac5 in which the p-channel type MISFET 5 is formed, a channel region is formed directly under the gate electrode G through an interposed gate insulating film (not shown).

The impurity concentration of an impurity introduced into the channel region of the n-channel type MISFET 6a, and the impurity concentration of an impurity introduced into the channel region of the n-channel type MISFET 6b are set to be different. Consequently, the threshold voltage of the n-channel type MISFET 6a and the threshold voltage of the n-channel type MISFET 6b are different. For example, the n-channel type MISFET 6a is formed by the high-Vth MISFET of a high threshold voltage and the n-channel type MISFET 6b is formed by the low-Vth MISFET of a low threshold voltage.

The n-channel type MISFET of the inverter circuit in the present embodiment 2, configured in this way, employs the common-node transistors which include the n-channel type MISFET 6a (high-Vth MISFET) and the n-channel type MISFET 6b (low-Vth MISFET) with different threshold voltages. Consequently, as explained in Embodiment 1, even when the miniaturization of MISFET is advanced, it is possible to produce the prominent effect that both of the improvement of the operating speed and the reduction of the leakage current of the n-channel type MISFET composing the inverter circuit can be satisfied, and that the occupied area of the n-channel type MISFET can be reduced.

Next, FIG. 12C is explained. The layout configuration illustrated in FIG. 12C is what combines the layout configuration of the p-channel type MISFET illustrated in FIG. 12A and the layout configuration of the n-channel type MISFET illustrated in FIG. 12B. Namely, in FIG. 12C, the common-node transistors in the present embodiment 2 are employed for both the p-channel type MISFET and the n-channel type MISFET, which compose an inverter circuit. Here, the cross-section structure of the p-channel type MISFETs 5a and 5b and the n-channel type MISFETs 6a and 6b, illustrated in FIG. 12C, is explained.

Figure 13:
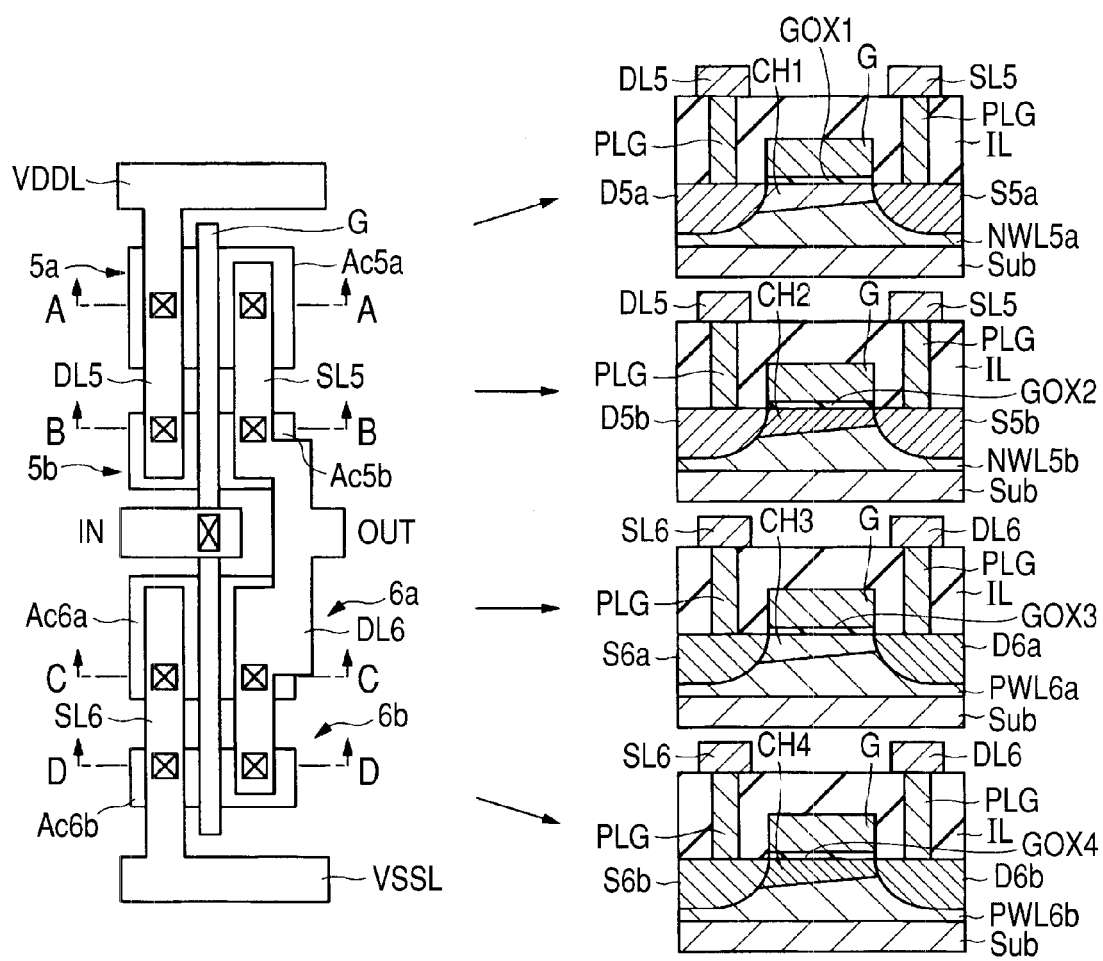
FIG. 13 is a chart illustrating the layout configuration when common-node transistors with different threshold voltages are employed, in lieu of both of a p-channel type MISFET of a single body and an n-channel type MISFET of a single body (left figure), and illustrating the sectional views cut along a line A-A, a line B-B, a line C-C, and a line D-D of the left figure, respectively (right figures)

FIG. 13 is an explanatory chart illustrating the cross-section structure of the p-channel type MISFETs 5a and 5b and the n-channel type MISFETs 6a and 6b, illustrated in the layout configuration of FIG. 12C. With reference to FIG. 13, the cross-section structure of the p-channel type MISFET 5a is explained first. The cross section cut along a line A-A of FIG. 13 corresponds to the cross section of the p-channel type MISFET 5a. As illustrated in the cross section cut along the line A-A of FIG. 13, an n-type well NWL5a is formed over a semiconductor substrate Sub, and a source region S5a and a drain region D5a are formed over the surface of the semiconductor substrate Sub in the n-type well NWL5a. The source region S5a and the drain region D5a are formed by the p-type semiconductor region, and a channel region CH1 is formed between the source region S5a and the drain region D5a. An n-type impurity is introduced into the channel region CH1.

Over the channel region CH1 formed over the semiconductor substrate Sub, a gate electrode G is formed via an interposed gate insulating film GOX1. In this manner, the p-channel type MISFET 5a is formed. An interlayer insulation film IL is formed so as to cover the p-channel type MISFET 5a, and a plug PLG is formed, penetrating the interlayer insulation film IL. There are two plugs as the plug PLG, one coming down to the source region S5a of the p-channel type MISFET 5a, and the other coming down to the drain region D5a of the p-channel type MISFET 5a. The source region S5a is electrically coupled with a source line SL5 formed over the interlayer insulation film IL, via a plug PLG. The drain region D5a is electrically coupled with a drain line DL5 formed over the interlayer insulation film IL, via a plug PLG.

Next, the cross-section structure of the p-channel type MISFET 5b is explained. The cross section cut along a line B-B of FIG. 13 corresponds to the cross section of the p-channel type MISFET 5b illustrated in FIG. 13. As illustrated in the cross section cut along the line B-B of FIG. 13, an n-type well NWL5b is formed over a semiconductor substrate Sub, and a source region S5b and a drain region D5b are formed over the surface of the semiconductor substrate Sub in the n-type well NWL5b. The source region S5b and the drain region D5b are formed by the p-type semiconductor region, and a channel region CH2 is formed between the source region S5b and the drain region D5b. An n-type impurity is introduced into the channel region CH2.

Over the channel region CH2 formed over the semiconductor substrate Sub, a gate electrode G is formed via an interposed gate insulating film GOX2. In this manner, the p-channel type MISFET 5b is formed. An interlayer insulation film IL is formed so as to cover the p-channel type MISFET 5b, and a plug PLG is formed, penetrating the interlayer insulation film IL. There are two plugs as the plug PLG, one coming down to the source region S5b of the p-channel type MISFET 5b, and the other coming down to the drain region D5b of the p-channel type MISFET 5b. The source region S5b is electrically coupled with a source line SL5 formed over the interlayer insulation film IL, via a plug PLG. The drain region D5b is electrically coupled with a drain line DL5 formed over the interlayer insulation film IL, via a plug PLG.

The threshold voltage of the p-channel type MISFET 5a and the threshold voltage of the p-channel type MISFET 5b are different. To be specific, the p-channel type MISFET 5a is formed by the high-Vth MISFET of a high threshold voltage and the p-channel type MISFET 5b is formed by the low-Vth MISFET of a low threshold voltage. Adjustment of the threshold voltage in these MISFETs is performed by adjusting the impurity concentration of the impurity introduced into the channel region. Namely, the impurity concentration of the n-type impurity introduced into the channel region CH1 of the p-channel type MISFET 5a is set lower than the impurity concentration of the n-type impurity introduced into the channel region CH2 of the p-channel type MISFET 5b. Accordingly, the p-channel type MISFET 5a can be formed by the high-Vth MISFET of a high threshold voltage, and the p-channel type MISFET 5b can be formed by the low-Vth MISFET of a low threshold voltage.

Subsequently, the cross-section structure of the n-channel type MISFET 6a is explained. The cross section cut along a line C-C of FIG. 13 corresponds to the cross section of the n-channel type MISFET 6a illustrated in FIG. 13. As illustrated in the cross section cut along the line C-C of FIG. 13, a p-type well PWL6a is formed over a semiconductor substrate Sub, and a source region S6a and a drain region D6a are formed over the surface of the semiconductor substrate Sub in the p-type well PWL6a. The source region S6a and the drain region D6a are formed by the n-type semiconductor region, and a channel region CH3 is formed between the source region S6a and the drain region D6a. A p-type impurity is introduced into the channel region CH3.

Over the channel region CH3 formed over the semiconductor substrate Sub, a gate electrode G is formed via an interposed gate insulating film GOX3. In this manner, the n-channel type MISFET 6a is formed. An interlayer insulation film IL is formed so as to cover the n-channel type MISFET 6a, and a plug PLG is formed, penetrating the interlayer insulation film IL. There are two plugs as the plug PLG, one coming down to the source region S6a of the n-channel type MISFET 6a, and the other coming down to the drain region D6a of the n-channel type MISFET 6a. The source region S6a is electrically coupled with a source line SL6 formed over the interlayer insulation film IL, via a plug PLG. The drain region D6a is electrically coupled with a drain line DL6 formed over the interlayer insulation film IL, via a plug PLG.

Next, the cross-section structure of the n-channel type MISFET 6b is explained. The cross section cut along a line D-D of FIG. 13 corresponds to the cross section of the n-channel type MISFET 6b illustrated in FIG. 13. As illustrated in the cross section cut along the line D-D of FIG. 13, a p-type well PWL6b is formed over a semiconductor substrate Sub, and a source region S6b and a drain region D6b are formed over the surface of the semiconductor substrate Sub in the p-type well PWL6b. The source region S6b and the drain region D6b are formed by the n-type semiconductor region, and a channel region CH4 is formed between the source region S6b and the drain region D6b. A p-type impurity is introduced into the channel region CH4.

Over the channel region CH4 formed over the semiconductor substrate Sub, a gate electrode G is formed via an interposed gate insulating film GOX4. In this manner, the n-channel type MISFET 6b is formed. An interlayer insulation film IL is formed so as to cover the n-channel type MISFET 6b, and a plug PLG is formed, penetrating the interlayer insulation film IL. There are two plugs as the plug PLG, one coming down to the source region S6b of the n-channel type MISFET 6b, and the other coming down to the drain region D6b of the n-channel type MISFET 6b. The source region S6b is electrically coupled with a source line SL6 formed over the interlayer insulation film IL, via a plug PLG. The drain region D6b is electrically coupled with a drain line DL6 formed over the interlayer insulation film IL, via a plug PLG.

The threshold voltage of the n-channel type MISFET 6a and the threshold voltage of the n-channel type MISFET 6b are different. To be specific, the n-channel type MISFET 6a is formed by the high-Vth MISFET of a high threshold voltage and the n-channel type MISFET 6b is formed by the low-Vth MISFET of a low threshold voltage. Adjustment of the threshold voltage in these MISFETs is performed by adjusting the impurity concentration of the impurity introduced into the channel region. Namely, the impurity concentration of the p-type impurity introduced into the channel region CH3 of the n-channel type MISFET 6a is set lower than the impurity concentration of the p-type impurity introduced into the channel region CH4 of the n-channel type MISFET 6b. Accordingly, the n-channel type MISFET 6a can be formed by the high-Vth MISFET of a high threshold voltage, and the n-channel type MISFET 6b can be formed by the low-Vth MISFET of a low threshold voltage.

The p-channel type MISFET and the n-channel type MISFET of the inverter circuit in the present embodiment 2, configured in this way, employ the common-node transistors which include the high-Vth MISFET and the low-Vth MISFET with different threshold voltages, respectively. Consequently, as explained in Embodiment 1, even when the miniaturization of MISFET is advanced, it is possible to produce the prominent effect that both of the improvement of the operating speed and the reduction of the leakage current are satisfied in both the p-channel type MISFET and the n-channel type MISFET composing the inverter circuit, and that the occupied area of the inverter circuit can be reduced.

In the present embodiment 2, both of the improvement of the operating speed and the reduction of the leakage current of the inverter circuit can be satisfied, and the occupied area of the inverter circuit can be reduced. This is explained still in detail.

There is technology which employs a ring oscillator to measure the operating speed of an inverter circuit. In the following, the operating speed and the leakage current of an inverter circuit are measured using the ring oscillator.

Figure 14:
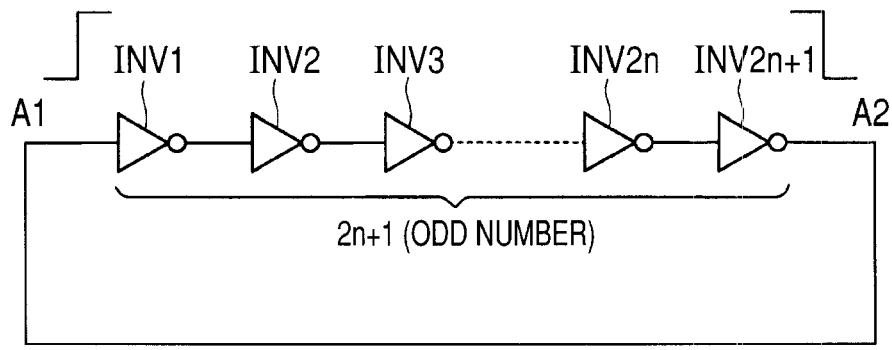
FIG. 14 is a chart illustrating the circuit configuration of a ring oscillator.
Figure 15:
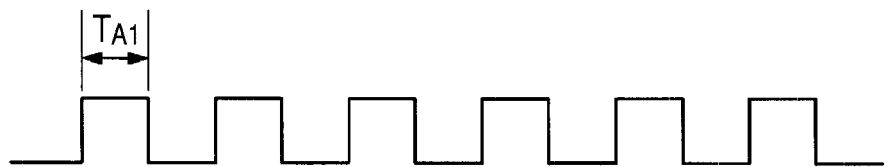
FIG. 15 is a chart illustrating temporal change of a signal at Point A1 of the ring oscillator illustrated in FIG. 14.

FIG. 14 is an explanatory view illustrating a ring oscillator. As illustrated in FIG. 14, the ring oscillator includes plural inverter circuits INV1, INV2 ... INV2n+1, coupled in series. The number of the inverter circuits coupled in series is set to an odd number at this time. When a rising signal is inputted into a terminal A1 of the ring oscillator configured in this way, the present rising signal is inverted to a falling signal by passing through the inverter circuit INV1. Namely, the output of the inverter circuit INV1 turns into a falling signal. The falling signal outputted from the inverter circuit INV1 is inverted to a rising signal, by passing the inverter circuit INV2. Namely, a signal is inverted whenever it passes an inverter circuit. In the ring oscillator, since an odd number of inverter circuits are coupled, the signal outputted from the last inverter circuit INV2n+1 becomes a falling signal. Namely, a falling signal is outputted at a terminal A2. The falling signal outputted from the last inverter circuit INV2n+1 is again inputted into the first inverter circuit INV1. This operation is repeated in the ring oscillator. Consequently, when the temporal change of the signal is observed at the terminal A1, namely at the input of the first inverter circuit INV1, a rising signal and a falling signal are repeated as illustrated in FIG. 15, oscillating at a specific frequency. Here, time $T_{A1}$ from the rising signal to the falling signal indicates a time after the signal enters into the inverter circuit INV1 from the terminal A1 until the signal passes through the inverter circuits INV1-INV2n+1 and returns to the terminal A1 again. Namely, time $T_{A1}$ indicates the time when the signal is processed by the inverter circuits INV1-INV2n+1, and time $T_{A1}$ will become short when the operating speed in each inverter circuit becomes quick. On the other hand, time $T_{A1}$ will become long when the operating speed in each inverter circuit becomes slow. Therefore, by observing the oscillating frequency of the signal (oscillation signal) at the terminal A1, indicated in FIG. 15, the operating speed of the inverter circuit will be known. For example, when the oscillating frequency is high, the operating speed of the inverter circuit is fast, and when the oscillating frequency is low, the operating speed of the inverter circuit is slow. From the fact, it is seen that the operating speed of an inverter circuit is measurable by employing the ring oscillator.

Figure 16:
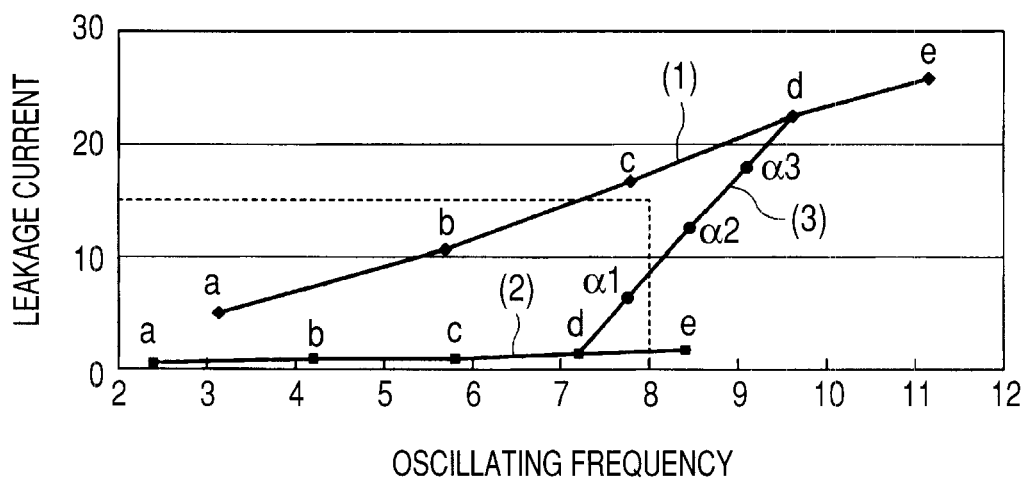
FIG. 16 is a chart illustrating relationship between a leakage current and an oscillating frequency of an inverter circuit comprised of a low-Vth MISFET of a single body, an inverter circuit comprised of a high-Vth MISFET of a single body, and an inverter circuit comprised of common-node transistors with different threshold voltages.

FIG. 16 illustrates the relationship between the oscillating frequency (corresponding to the operating speed of an inverter circuit) and the leakage current, where the oscillating frequency is measured by employing the ring oscillator. In FIG. 16, the vertical axis indicates the leakage current and the horizontal axis indicates the oscillating frequency.

First, a line chart (1) in FIG. 16 is explained. The line chart (1) indicates the case where a low-Vth MISFET is employed for an inverter circuit. Symbols "a"-"e" attached to the line chart (1) correspond to changes of the gate width. That is, the symbol "a" of the line chart (1) corresponds to a case where the low-Vth MISFET with the structure of the narrowest gate width is employed, and in the order of the symbols "a" to "e", the corresponding gate width becomes larger. When the line chart (1) is observed in consideration of the above point, it is seen that the leakage current and the oscillating frequency increase in the order of the symbols "a" to "e." The line chart (1) indicates the fact that when the structure has a narrow gate width, the leakage current can be reduced but the operating speed becomes slow, and when the structure has a wide gate width, the leakage current increases but the operating speed can be increased.

Next, a line chart (2) is explained. The line chart (2) indicates the case where a high-Vth MISFET is employed for an inverter circuit. Symbols "a"-"e" attached to the line chart (2) correspond to changes of the gate width. That is, the symbol "a" of the line chart (2) corresponds to a case where the high-Vth MISFET with the structure of the narrowest gate width is employed, and in the order of the symbols "a" to "e", the gate width becomes larger. It is seen that also in the line chart (2), in the order of the symbols "a" to "e", the leakage current and the oscillating frequency increase. This is the same as that of the line chart (1). However, in the line chart (2), since the high-Vth MISFET is employed for the inverter circuit, it is seen that the reduction of the leakage current is realized rather than for the low-Vth MISFET indicated in the line chart (1). However, when the properties of the same symbol (corresponding to the same gate width) of the symbols "a" to "e" attached to the line chart (1) and the symbols "a" to "e" attached to the line chart (2) are compared (or when the properties for the same gate width are compared), it is seen that the oscillating frequency is lower and the operating speed is slower for the high-Vth MISFET indicated by the line chart (2) than for the low-Vth MISFET indicated by the line chart (1).

Here, how to satisfy both of the reduction of the leakage current and the improvement of the operating speed is explained. When the condition is set up such that the leakage current should be 15 or less and the oscillating frequency should be eight or more, it is seen from FIG. 16 that the low-Vth MISFET indicated by the line chart (1) cannot fulfill this condition, even if the gate width is changed from the symbol "a" to the symbol "e."

On the other hand, the high-Vth MISFET indicated by the line chart (2) can fulfill the condition of the leakage current in all the symbols "a" to "e", but can not fulfill the condition of the oscillating frequency (eight or more) in the symbols "a" to "d." Consequently, the high-Vth MISFET indicated by the line chart (2) can fulfill the condition that the leakage current should be 15 or less and the oscillating frequency should be eight or more, only in the symbol "e" for which the gate width is made widest.

Subsequently, the line chart (3) is explained. The line chart (3) indicates the case where each circuit element (the n-channel type MISFET or the p-channel type MISFET) included in an inverter circuit is configured by common-node transistors including plural low-Vth MISFETs and plural high-Vth MISFETs. Here, the whole gate width of the low Vth MISFET and the high-Vth MISFET is set to the state of the symbol "d." When the percentage of the low-Vth MISFET and the high-Vth MISFET, which configure the common-node transistors, is changed in this state, the line chart (3) is obtained. For example, in the line chart (3), a symbol "α1" indicates the state where the percentage of the high-Vth MISFET is set higher than the percentage of the low-Vth MISFET, in the common-node transistors. A symbol "α2" indicates the state where the percentage of the high-Vth MISFET and the percentage of the low-Vth MISFET are set equal, in the common-node transistors. A symbol "α3" indicates the state where the percentage of the low-Vth MISFET is set higher than the percentage of the high-Vth MISFET, in the common-node transistors.

It is seen from FIG. 16 that in the line chart (3), the symbol "α2", which indicates the state where the percentage of the high-Vth MISFET and the percentage of the low-Vth MISFET are set equal in the common-node transistors, fulfills the condition that the leakage current should be 15 or less and the oscillating frequency should be eight or more. In the state of the symbol "α2", the gate width of the whole common-node transistors is set to the gate width in the state of the symbol "d", which is smaller than the gate width in the state of the symbol "e". Consequently, in the inverter circuit which employs common-node transistors, in order to fulfill the condition that the leakage current should be 15 or less and the oscillating frequency should be eight or more, the gate width of the whole common-node transistors (corresponding to the symbol "d") can be made smaller than the gate width in the case of composing each circuit element of the inverter circuit only by the high-Vth MISFET (corresponding to the symbol "e"). This fact implies that the occupied area of the circuit element can be made smaller. Namely, in the present embodiment 2, by employing the common-node transistors including the low-Vth MISFET and the high-Vth MISFET to each circuit element of the inverter circuit, it is understood that both of the improvement of the operating speed and the reduction of the leakage current of the inverter circuit can be satisfied, and that the occupied area of the inverter circuit can be reduced.

Embodiment 3

Figures 17, 18:
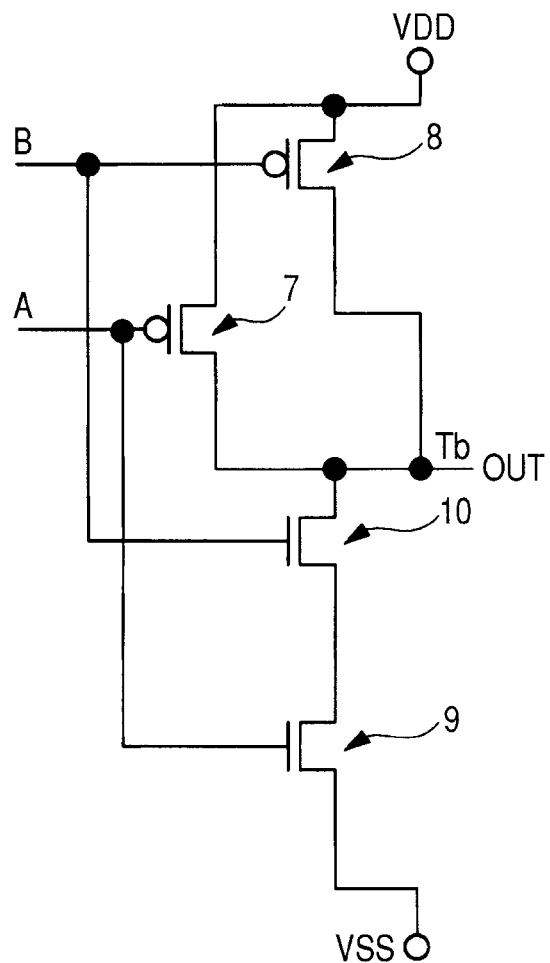
FIG. 17 is a circuit diagram illustrating a general NAND circuit.
FIG. 18 is a chart illustrating the relationship of input/output of the NAND circuit.

Embodiment 3 explains an example in which the present invention is applied to a NAND circuit. FIG. 17 is a circuit diagram illustrating a general NAND circuit. As illustrated in FIG. 17, the NAND circuit has two p-channel type MISFETs and two n-channel type MISFETs between power supply potential VDD and reference potential VSS. A drain region of a p-channel type MISFET 7 and a drain region of a p-channel type MISFET 8 are coupled to the power supply potential VDD. A source region of the p-channel type MISFET 7 and a source region of the p-channel type MISFET 8 are coupled mutually and serve as an output (Tb) of the NAND circuit.

An n-channel type MISFET 10 and an n-channel type MISFET 9 are coupled in series between the output (Tb) of the NAND circuit and the reference potential VSS. That is, a drain region of the n-channel type MISFET 10 is coupled to the output of the NAND circuit (the source region of the p-channel type MISFET 7, and the source region of the p-channel type MISFET 8). A source region of the n-channel type MISFET 10 and a drain region of the n-channel type MISFET 9 are coupled, and a source region of the n-channel type MISFET 9 is coupled to the reference potential VSS.

A gate electrode of the p-channel type MISFET 7 and a gate electrode of the n-channel type MISFET 9 are electrically coupled and serve as an input A of the NAND circuit. On the other hand, a gate electrode of the p-channel type MISFET 8 and a gate electrode of the n-channel type MISFET 10 are electrically coupled and serve as an input B of the NAND circuit.

Next, operation of the NAND circuit is explained with reference to FIGS. 17 and 18. FIG. 18 is a chart illustrating the relationship of the input signal and output signal of the NAND circuit. In FIG. 17, when "H" (a high-level signal) is inputted into the input A of the NAND circuit and "H" (a high-level signal) is inputted into the input B of the NAND circuit, the p-channel type MISFET 7 and the p-channel type MISFET 8 remain turned off, but the n-channel type MISFET 9 and the n-channel type MISFET 10 are turned on. Therefore, the output (OUT) of the NAND circuit is pulled down to the reference potential VSS via the n-channel type MISFET 9 and the n-channel type MISFET 10 which have been conducted. Consequently, the output of the NAND circuit is set to "L" (a low-level signal).

Subsequently, when "H" (a high-level signal) is inputted into the input A of the NAND circuit and "L" (a low-level signal) is inputted into the input B of the NAND circuit, the p-channel type MISFET 7 remains turned off, the n-channel type MISFET 9 is turned on, the p-channel type MISFET 8 is turned on, and the n-channel type MISFET 10 is turned off. Therefore, the output (OUT) of the NAND circuit is pulled up to the power supply potential VDD via the p-channel type MISFET 8 which has been conducted. Consequently, the output of the NAND circuit is set to "H" (a high-level signal).

Next, when "L" (a low-level signal) is inputted into the input A of the NAND circuit and "H" (a high-level signal) is inputted into the input B of the NAND circuit, the p-channel type MISFET 7 is turned on, the n-channel type MISFET 9 is turned off, the p-channel type MISFET 8 is turned off, and the n-channel type MISFET 10 is turned on. Therefore, the output (OUT) of the NAND circuit is pulled up to the power supply potential VDD via the p-channel type MISFET 7 which has been conducted. Consequently, the output of the NAND circuit is set to "H" (a high-level signal).

Finally, when "L" (a low-level signal) is inputted into the input A of the NAND circuit and "L" (a low-level signal) is inputted into the input B of the NAND circuit, the p-channel type MISFET 7 and the p-channel type MISFET 8 are turned on, but the n-channel type MISFET 10 and the n-channel type MISFET 9 remain turned off. Therefore, the output (OUT) of the NAND circuit is pulled up to the power supply potential VDD via the p-channel type MISFET 7 and the p-channel type MISFET 8 which have been conducted. Consequently, the output of the NAND circuit is set to "H" (a high-level signal).

Next, the following explains the example in which the common-node transistors in the present embodiment 3 are applied to the NAND circuit. FIGS. 19A, 19B, and 19C are circuit diagrams illustrating various illustrative embodiments in which the common-node transistors are applied as a circuit element which configures the NAND circuit. For example, FIG. 19A illustrates an example in which each of two p-channel type MISFETs composing a NAND circuit is comprised of common-node transistors. That is, in FIG. 19A, the circuit element comprised of the p-channel type MISFET 7 illustrated in FIG. 17 is comprised of the common-node transistors which include a p-channel type MISFET 7a and a p-channel type MISFET 7b. Similarly, in FIG. 19A, the circuit element comprised of the p-channel type MISFET 8 illustrated in FIG. 17 is comprised of the common-mode transistors which include a p-channel type MISFET 8a and a p-channel type MISFET 8b.

At this time, a drain region of the p-channel type MISFET 7a and a drain region of the p-channel type MISFET 7b are electrically coupled to the power supply potential VDD. A source region of the p-channel type MISFET 7a and a source region of the p-channel type MISFET 7b are electrically coupled and serve as the output of the NAND circuit. Similarly, a drain region of the p-channel type MISFET 8a and a drain region of the p-channel type MISFET 8b are electrically coupled to the power supply potential VDD. A source region of the p-channel type MISFET 8a and a source region of the p-channel type MISFET 8b are electrically coupled and serve as the output of the NAND circuit.

A gate electrode of the p-channel type MISFET 7a and a gate electrode of the p-channel type MISFET 7b are electrically coupled and serve as an input A of the NAND circuit. Similarly, a gate electrode of the p-channel type MISFET 8a and a gate electrode of the p-channel type MISFET 8b are electrically coupled and serve as an input B of the NAND circuit.

The threshold voltage of the p-channel type MISFET 7a and the threshold voltage of the p-channel type MISFET 7b are set to be different. For example, the p-channel type MISFET 7a is a high-Vth MISFET of a high threshold voltage, and the p-channel type MISFET 7b is a low-Vth MISFET of a low threshold voltage. Similarly, the threshold voltage of the p-channel type MISFET 8a and the threshold voltage of the p-channel type MISFET 8b are set to be different. For example, the p-channel type MISFET 8a is a high-Vth MISFET of a high threshold voltage, and the p-channel type MISFET 8b is a low-Vth MISFET of a low threshold voltage.

FIG. 19B illustrates an example in which each of two n-channel type MISFETs composing a NAND circuit is comprised of common-node transistors. That is, in FIG. 19B, the circuit element comprised of the n-channel type MISFET 9 illustrated in FIG. 17 is comprised of the common-node transistors which include an n-channel type MISFET 9a and an n-channel type MISFET 9b. Similarly, in FIG. 19B, the circuit element comprised of the n-channel type MISFET 10 illustrated in FIG. 17 is comprised of the common-node transistors which include an n-channel type MISFET 10a and an n-channel type MISFET 10b.

At this time, a drain region of the n-channel type MISFET 10a and a drain region of the n-channel type MISFET 10b are electrically coupled to the output (OUT) of the NAND circuit. A source region of the n-channel type MISFET 10a and a source region of the n-channel type MISFET 10b are electrically coupled. A drain region of the n-channel type MISFET 9a and a drain region of the n-channel type MISFET 9b are electrically coupled, and further coupled to the source region of the n-channel type MISFET 10a and the source region of the n-channel type MISFET 10b. A source region of the n-channel type MISFET 9a and a source region of the n-channel type MISFET 9b are electrically coupled to the reference potential VSS.

A gate electrode of the n-channel type MISFET 9a and a gate electrode of the n-channel type MISFET 9b are electrically coupled and serve as an input A of the NAND circuit. Similarly, a gate electrode of the n-channel type MISFET 10a and a gate electrode of the n-channel type MISFET 10b are electrically coupled and serve as an input B of the NAND circuit.

The threshold voltage of the n-channel type MISFET 9a and the threshold voltage of the n-channel type MISFET 9b are set to be different. For example, the n-channel type MISFET 9a is a high-Vth MISFET of a high threshold voltage, and the n-channel type MISFET 9b is a low-Vth MISFET of a low threshold voltage. Similarly, the threshold voltage of the n-channel type MISFET 10a and the threshold voltage of the n-channel type MISFET 10b are set to be different. For example, the n-channel type MISFET 10a is a high-Vth MISFET of a high threshold voltage, and the n-channel type MISFET 10b is a low-Vth MISFET of a low threshold voltage.

FIG. 19C illustrates an example in which the configuration of FIG. 19A and the configuration of FIG. 19B are combined. That is, the common-node transistors which are the circuit element of the present embodiment 3 are applied to both the p-channel type MISFET and the n-channel type MISFET, which configure a NAND circuit.

Figure 20A:
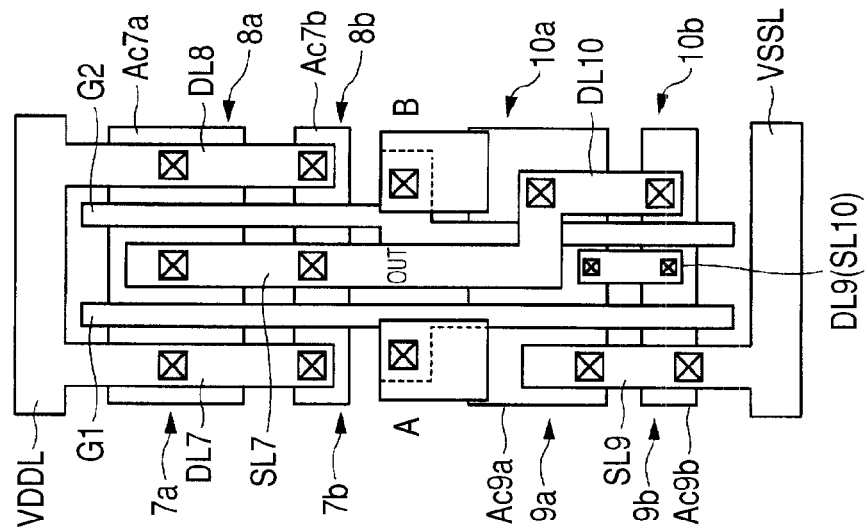
FIG. 20A is a chart illustrating the layout configuration corresponding to the circuit diagram of FIG. 19A.
Figure 20B:
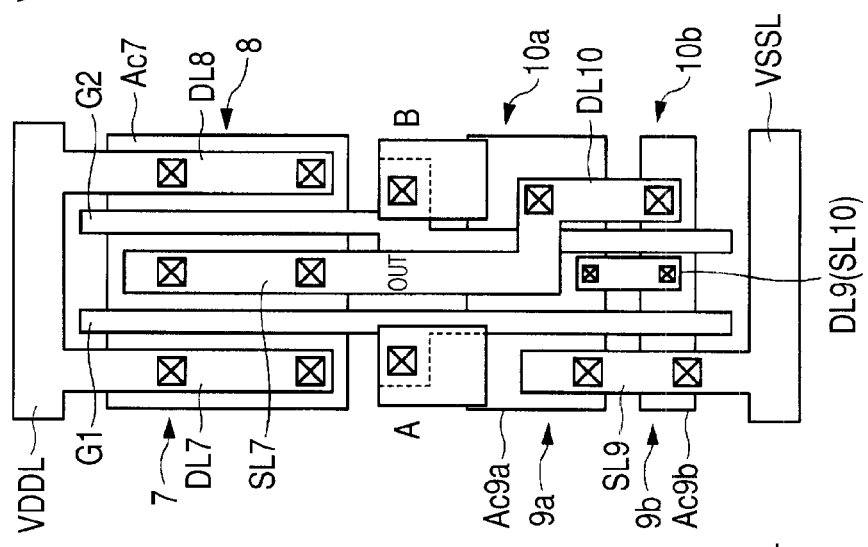
FIG. 20B is a chart illustrating the layout configuration corresponding to the circuit diagram of FIG. 19B.
Figure 20C:
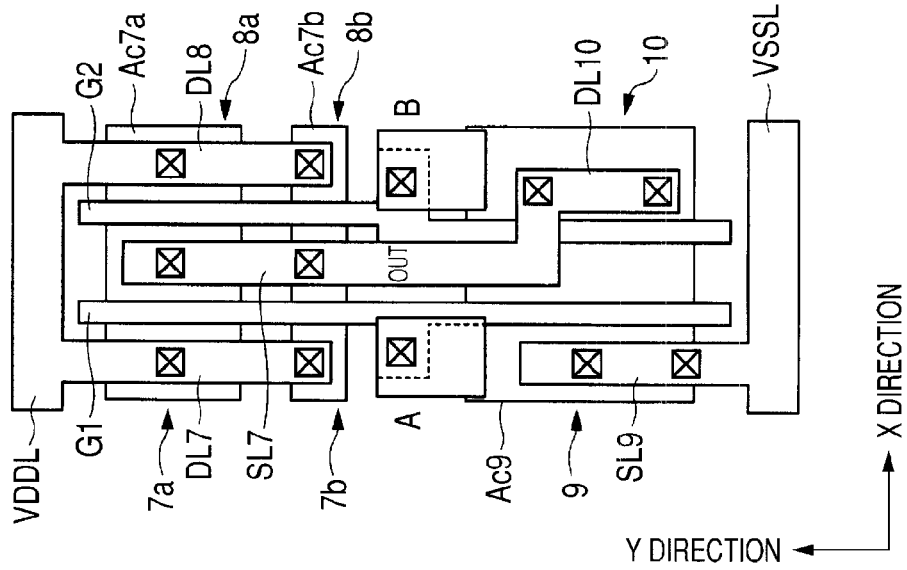
FIG. 20C is a chart illustrating the layout configuration corresponding to the circuit diagram of FIG. 19C.

FIGS. 20A, 20B, and 20C are charts illustrating the layout configuration of the NAND circuits corresponding to the circuit diagrams illustrating in FIGS. 19A, 19B, and 19C, respectively. FIG. 20A illustrates a layout configuration corresponding to FIG. 19A, FIG. 20B illustrates a layout configuration corresponding to FIG. 19B, and FIG. 20C illustrates a layout configuration corresponding to FIG. 19C.

FIG. 20A is explained. As illustrated in FIG. 20A, in the semiconductor substrate, an active region Ac7a and an active region Ac7b are formed separately and arranged side by side in the y direction. An active region Ac9 is arranged so as to line up with the active region Ac7b in the y direction. Two gate electrodes G1 and G2 extend in the y direction, respectively in the shape of a straight line, passing over the active region Ac7a and the active region Ac7b, and crossing over the active region Ac9. The gate electrode G1 is coupled with the input A of the NAND circuit, and the gate electrode G2 is coupled with the input B of the NAND circuit.

The active region Ac7a is a forming region of the p-channel type MISFET 7a and the p-channel type MISFET 8a, and the active region Ac7b is a forming region of the p-channel type MISFET 7b and the p-channel type MISFET 8b. The active region Ac9 is a forming region of the n-channel type MISFET 9 and the n-channel type MISFET 10.

Here, a source region and a drain region of the p-channel type MISFET 7a are formed in a pair of areas which sandwich the gate electrode G1 in the active region Ac7a. Specifically, the drain region is formed in the left side area of the gate electrode G1, and the source region is formed in the right side area of the gate electrode G1. Similarly, a source region and a drain region of the p-channel type MISFET 8a are formed in a pair of areas which sandwich the gate electrode G2 in the active region Ac7a. Specifically, the source region is formed in the left side area of the gate electrode G2, and the drain region is formed in the right side area of the gate electrode G2. Consequently, the area which is sandwiched by the gate electrode G1 and the gate electrode G2 in the active region Ac7a serves as the source region of the p-channel type MISFET 7a and also as the source region of the p-channel type MISFET 8a.

A source region and a drain region of the p-channel type MISFET 7b are formed in a pair of areas which sandwich the gate electrode G1 in the active region Ac7b. Specifically, the drain region is formed in the left side area of the gate electrode G1, and the source region is formed in the right side area of the gate electrode G1. Similarly, a source region and a drain region of the p-channel type MISFET 8b are formed in a pair of areas which sandwich the gate electrode G2 in the active region Ac7b. Specifically, the source region is formed in the left side area of the gate electrode G2, and the drain region is formed in the right side area of the gate electrode G2. Consequently, the area which is sandwiched by the gate electrode G1 and the gate electrode G2 in the active region Ac7b serves as the source region of the p-channel type MISFET 7b and also as the source region of the p-channel type MISFET 8b.

The drain region of the p-channel type MISFET 7a and the drain region of the p-channel type MISFET 7b are electrically coupled by a drain line DL7 via a plug, and the present drain line DL7 is electrically coupled with the power supply line VDDL which supplies the power supply potential. Similarly, the drain region of the p-channel type MISFET 8a and the drain region of the p-channel type MISFET 8b are electrically coupled by a drain line DL8 via a plug, and the present drain line DL8 is electrically coupled with the power supply line VDDL which supplies the power supply potential.

On the other hand, the source region of the p-channel type MISFET 7a and the source region of the p-channel type MISFET 7b are electrically coupled by a source line SL7 via a plug, and the output of the present source line SL7 serves as an output (OUT) of the NAND circuit. In other words, the source region of the p-channel type MISFET 8a and the source region of the p-channel type MISFET 8b are electrically coupled by a source line SL7 via a plug, and the output of the present source line SL7 serves as an output (OUT) of the NAND circuit.

Next, a source region and a drain region of the n-channel type MISFET 9 are formed in a pair of areas which sandwich the gate electrode G1 in the active region Ac9. Specifically, the source region is formed in the left side area of the gate electrode G1, and the drain region is formed in the right side area of the gate electrode G1. Similarly, a source region and a drain region of the n-channel type MISFET 10 are formed in a pair of areas which sandwich the gate electrode G2 in the active region Ac9. Specifically, the source region is formed in the left side area of the gate electrode G2, and the drain region is formed in the right side area of the gate electrode G2. Consequently, the area which is sandwiched by the gate electrode G1 and the gate electrode G2 in the active region Ac9 serves as the drain region of the n-channel type MISFET 9 and also as the source region of the n-channel type MISFET 10.

The drain region of the n-channel type MISFET 10 is coupled to the drain line DL10 via a plug, and the present drain line DL10 is electrically coupled with the source line SL7 used as the output (OUT) of the NAND circuit. On the other hand, the source region of the n-channel type MISFET 9 is coupled to the source line SL9 via a plug, and the present source line SL9 is electrically coupled with the reference line VSSL which supplies the reference potential.

Next, in the active region Ac7a in which the p-channel type MISFET 7a is formed, a channel region is formed directly under the gate electrode G1 through an interposed gate insulating film (not shown). Similarly, in the active region Ac7b in which the p-channel type MISFET 7b is formed, a channel region is formed directly under the gate electrode G1 through an interposed gate insulating film (not shown).

The impurity concentration of an impurity introduced into the channel region of the p-channel type MISFET 7a and the impurity concentration of an impurity introduced into the channel region of p-channel type MISFET 7b are set to be different. Consequently, the threshold voltage of the p-channel type MISFET 7a and the threshold voltage of the p-channel type MISFET 7b are different. For example, the p-channel type MISFET 7a is formed by the high-Vth MISFET of a high threshold voltage and the p-channel type MISFET 7b is formed by the low-Vth MISFET of a low threshold voltage.

Similarly, in the active region Ac7a in which the p-channel type MISFET 8a is formed, a channel region is formed directly under the gate electrode G2 through an interposed gate insulating film (not shown). Similarly, in the active region Ac7b in which the p-channel type MISFET 8b is formed, a channel region is formed directly under the gate electrode G2 through an interposed gate insulating film (not shown).

The impurity concentration of an impurity introduced into the channel region of the p-channel type MISFET 8a and the impurity concentration of an impurity introduced into the channel region of p-channel type MISFET 8b are set to be different. Consequently, the threshold voltage of the p-channel type MISFET 8a and the threshold voltage of the p-channel type MISFET 8b are different. For example, the p-channel type MISFET 8a is formed by the high-Vth MISFET of a high threshold voltage and the p-channel type MISFET 8b is formed by the low-Vth MISFET of a low threshold voltage.

Furthermore, in the active region Ac9 in which the n-channel type MISFET 9 and the n-channel type MISFET 10 are formed, a channel region of the n-channel type MISFET 9 is formed directly under the gate electrode G1 through an interposed gate insulating film (not shown). Similarly, in the active region Ac9, a channel region of the n-channel type MISFET 10 is formed directly under the gate electrode G2 through an interposed gate insulating film (not shown).

As a substitute of one p-channel type MISFET 7 (refer to FIG. 17) composing the NAND circuit in the present embodiment 3, common-node transistors, which include the p-channel type MISFET 7a (a high-Vth MISFET) and the p-channel type MISFET 7b (a low-Vth MISFET) with different threshold voltages, are employed. As a substitute of another p-channel type MISFET 8 (refer to FIG. 17) which configures a NAND circuit, common-node transistors, which include the p-channel type MISFET 8a (a high-Vth MISFET) and the p-channel type MISFET 8b (a low-Vth MISFET) with different threshold voltages, are employed. Consequently, as explained in Embodiment 1, even when the miniaturization of MISFET is advanced, it is possible to produce the prominent effect that both of the improvement of the operating speed and the reduction of the leakage current of the p-channel type MISFET composing the NAND circuit can be satisfied, and that the occupied area of the p-channel type MISFET can be reduced.

Next, FIG. 20B is explained. As illustrated in FIG. 20B, in the semiconductor substrate, an active region Ac9a and an active region Ac9b are formed separately and arranged side by side in the y direction. An active region Ac7 is arranged so as to line up with the active region Ac9a in the y direction. Two gate electrodes G1 and G2 extend in the y direction, respectively in the shape of a straight line, passing over the active region Ac9b and the active region Ac9a, and crossing over the active region Ac7. The gate electrode G1 is coupled with the input A of the NAND circuit, and the gate electrode G2 is coupled with the input B of the NAND circuit.

The active region Ac9a is a forming region of the n-channel type MISFET 9a and the n-channel type MISFET 10a, and the active region Ac9b is a forming region of the n-channel type MISFET 9b and the n-channel type MISFET 10b. The active region Ac7 is a forming region of the p-channel type MISFET 7 and the p-channel type MISFET 8.

Here, a source region and a drain region of the n-channel type MISFET 9a are formed in a pair of areas which sandwich the gate electrode G1 in the active region Ac9a. Specifically, the source region is formed in the left side area of the gate electrode G1, and the drain region is formed in the right side area of the gate electrode G1. Similarly, a source region and a drain region of the n-channel type MISFET 10a are formed in a pair of areas which sandwich the gate electrode G2 in the active region Ac9a. Specifically, the source region is formed in the left side area of the gate electrode G2, and the drain region is formed in the right side area of the gate electrode G2. Consequently, the area which is sandwiched by the gate electrode G1 and the gate electrode G2 in the active region Ac9a serves as the drain region of the n-channel type MISFET 9a and also as the source region of the n-channel type MISFET 10a.

Similarly, a source region and a drain region of the n-channel type MISFET 9b are formed in a pair of areas which sandwich the gate electrode G1 in the active region Ac9b. Specifically, the source region is formed in the left side area of the gate electrode G1, and the drain region is formed in the right side area of the gate electrode G1. Similarly, a source region and a drain region of the n-channel type MISFET 10b are formed in a pair of areas which sandwich the gate electrode G2 in the active region Ac9b. Specifically, the source region is formed in the left side area of the gate electrode G2, and the drain region is formed in the right side area of the gate electrode G2. Consequently, the area which is sandwiched by the gate electrode G1 and the gate electrode G2 in the active region Ac9b serves as the drain region of the n-channel type MISFET 9b and also as the source region of the n-channel type MISFET 10b.

The source region of the n-channel type MISFET 9a and the source region of the n-channel type MISFET 9b are electrically coupled by a source line SL9 via a plug, and the present source line SL9 is electrically coupled to the reference line VSSL which supplies the reference potential. Similarly, the drain region of the n-channel type MISFET 9a and the drain region of the n-channel type MISFET 9b are electrically coupled by a drain line DL9 (a source line SL10) via a plug.

The drain region of the n-channel type MISFET 10a and the drain region of the n-channel type MISFET 10b are electrically coupled by a drain line DL10 via a plug, and the present drain line DL10 serves as an output (OUT) of the NAND circuit.

Next, a source region and a drain region of the p-channel type MISFET 7 are formed in a pair of areas which sandwich the gate electrode G1 in the active region Ac7. Specifically, the drain region is formed in the left side area of the gate electrode G1, and the source region is formed in the right side area of the gate electrode G1. Similarly, a source region and a drain region of the p-channel type MISFET 8 are formed in a pair of areas which sandwich the gate electrode G2 in the active region Ac7. Specifically, the source region is formed in the left side area of the gate electrode G2, and the drain region is formed in the right side area of the gate electrode G2. Consequently, the area which is sandwiched by the gate electrode G1 and the gate electrode G2 in the active region Ac7 serves as the source region of the p-channel type MISFET 7 and also as the source region of the p-channel type MISFET 8.

The drain region of the p-channel type MISFET 7 is coupled to a drain line DL7 via a plug, and the present drain line DL7 is electrically coupled with the power supply line VDDL which supplies the power supply potential. Similarly, the drain region of the p-channel type MISFET 8 is coupled to a drain line DL8 via a plug, and the present drain line DL8 is electrically coupled with the power supply line VDDL which supplies the power supply potential.

The source region of the p-channel type MISFET 7 is coupled to a source line SL7 via a plug, and the present source line SL7 serves as an output (OUT) of the NAND circuit. Consequently, the drain line DL10 and the source line SL7 described above are electrically coupled.

Next, in the active region Ac9a in which the n-channel type MISFET 9a is formed, a channel region is formed directly under the gate electrode G1 through an interposed gate insulating film (not shown). Similarly, in the active region Ac9b in which the n-channel type MISFET 9b is formed, a channel region is formed directly under the gate electrode G1 through an interposed gate insulating film (not shown).

The impurity concentration of an impurity introduced into the channel region of the n-channel type MISFET 9a, and the impurity concentration of an impurity introduced into the channel region of the n-channel type MISFET 9b are set to be different. Consequently, the threshold voltage of the n-channel type MISFET 9a and the threshold voltage of the n-channel type MISFET 9b are different. For example, the n-channel type MISFET 9a is formed by the high-Vth MISFET of a high threshold voltage and the n-channel type MISFET 9b is formed by the low-Vth MISFET of a low threshold voltage.

Similarly, in the active region Ac9a in which the n-channel type MISFET 10a is formed, a channel region is formed directly under the gate electrode G2 through an interposed gate insulating film (not shown). Similarly, in the active region Ac9b in which the n-channel type MISFET 10b is formed, a channel region is formed directly under the gate electrode G2 through an interposed gate insulating film (not shown).

The impurity concentration of an impurity introduced into the channel region of the n-channel type MISFET 10a, and the impurity concentration of an impurity introduced into the channel region of the n-channel type MISFET 10b are set to be different. Consequently, the threshold voltage of the n-channel type MISFET 10a and the threshold voltage of the n-channel type MISFET 10b are different. For example, the n-channel type MISFET 10a is formed by the high-Vth MISFET of a high threshold voltage and the n-channel type MISFET 10b is formed by the low-Vth MISFET of a low threshold voltage.

Furthermore, in the active region Ac7 in which the p-channel type MISFET 7 and the p-channel type MISFET 8 are formed, a channel region of the n-channel type MISFET 7 is formed directly under the gate electrode G1 through an interposed gate insulating film (not shown). Similarly, in the active region Ac7, a channel region of the n-channel type MISFET 8 is formed directly under the gate electrode G2 through an interposed gate insulating film (not shown).

As a substitute of one n-channel type MISFET 9 (refer to FIG. 17) composing the NAND circuit in the present embodiment 3, common-node transistors, which include the n-channel type MISFET 9a (a high-Vth MISFET) and the n-channel type MISFET 9b (a low-Vth MISFET) with different threshold voltages, are employed. As a substitute of another n-channel type MISFET 10 (refer to FIG. 17) which configures a NAND circuit, common-node transistors, which include the n-channel type MISFET 10a (a high-Vth MISFET) and the n-channel type MISFET 10b (a low-Vth MISFET) with different threshold voltages, are employed. Consequently, as explained in Embodiment 1, even when the miniaturization of MISFET is advanced, it is possible to produce the prominent effect that both of the improvement of the operating speed and the reduction of the leakage current of the n-channel type MISFET composing the NAND circuit can be satisfied, and that the occupied area of the n-channel type MISFET can be reduced.

Next, FIG. 20C is explained. The layout configuration illustrated in FIG. 20C is what combines the layout configuration of the p-channel type MISFET illustrated in FIG. 20A and the layout configuration of the n-channel type MISFET illustrated in FIG. 20B. Namely, in FIG. 20C, the common-node transistors in the present embodiment 3 are employed for all of two p-channel type MISFETs and two n-channel type MISFETs, which configure an NAND circuit. Consequently, as explained in Embodiment 1, even when the miniaturization of MISFET is advanced, it is possible to produce the prominent effect that both of the improvement of the operating speed and the reduction of the leakage current are satisfied in all the p-channel type MISFETs and the n-channel type MISFETs composing the NAND circuit, and that the occupied area of the NAND circuit can be reduced.

Embodiment 4

Figures 21, 22:
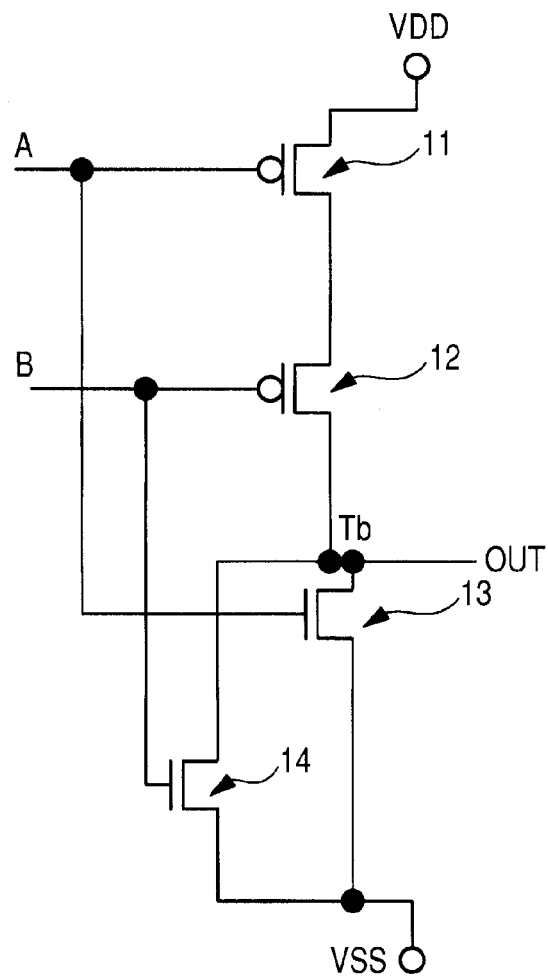
FIG. 21 is a circuit diagram illustrating a general NOR circuit.
FIG. 22 is a chart illustrating the relationship of input/output of the NOR circuit.

Embodiment 4 explains an example in which the present invention is applied to a NOR circuit. FIG. 21 is a circuit diagram illustrating a general NOR circuit. As illustrated in FIG. 21, the NOR circuit has two p-channel type MISFETs and two n-channel type MISFETs between power supply potential VDD and reference potential VSS. A drain region of a p-channel type MISFET 11 is coupled to the power supply potential VDD. A source region of the p-channel type MISFET 11 and a drain region of a p-channel type MISFET 12 are coupled, and a source region of the p-channel type MISFET 12 serves as an output (Tb) of the NOR circuit. That is, the p-channel type MISFET 11 and the p-channel type MISFET 12 are coupled in series between the power supply potential VDD and the output (Tb) of the NOR circuit.

An n-channel type MISFET 13 and an n-channel type MISFET 14 are coupled in parallel between the output (Tb) of the NOR circuit and the reference potential VSS. That is, a drain region of the n-channel type MISFET 13 and a drain region of the n-channel type MISFET 14 are coupled and serve as the output of the NAND circuit. A source region of the n-channel type MISFET 13 and a source region of the n-channel type MISFET 14 are coupled mutually, and further coupled to the reference potential VSS.

A gate electrode of the p-channel type MISFET 11 and a gate electrode of the n-channel type MISFET 13 are electrically coupled and serve as an input A of the NOR circuit. On the other hand, a gate electrode of the p-channel type MISFET 12 and a gate electrode of the n-channel type MISFET 14 are electrically coupled and serve as an input B of the NOR circuit.

Next, operation of the NOR circuit is explained with reference to FIGS. 21 and 22. FIG. 22 is a chart illustrating the relationship of the input signal and output signal of the NOR circuit. In FIG. 21, when "H" (a high-level signal) is inputted into the input A of the NOR circuit and "H" (a high-level signal) is inputted into the input B of the NOR circuit, the p-channel type MISFET 11 and the p-channel type MISFET 12 remain turned off, but the n-channel type MISFET 13 and the n-channel type MISFET 14 are turned on. Therefore, the output (OUT) of the NOR circuit is pulled down to the reference potential VSS via the n-channel type MISFET 13 (the n-channel type MISFET 14) which has been conducted. Consequently, the output of the NOR circuit is set to "L" (a low-level signal).

Subsequently, when "H" (a high-level signal) is inputted into the input A of the NOR circuit and "L" (a low-level signal) is inputted into the input B of the NOR circuit, the p-channel type MISFET 11 remains turned off, the n-channel type MISFET 13 is turned on, the p-channel type MISFET 12 is turned on, and the n-channel type MISFET 14 is turned off. Therefore, the output (OUT) of the NOR circuit is pulled down to the reference potential VSS via the n-channel type MISFET 13 which has been conducted. Consequently, the output of the NOR circuit is set to "L" (a low-level signal).

Next, when "L" (a low-level signal) is inputted into the input A of the NOR circuit and "H" (a high-level signal) is inputted into the input B of the NOR circuit, the p-channel type MISFET 11 is turned on, the n-channel type MISFET 13 is turned off, the p-channel type MISFET 12 is turned off, and the n-channel type MISFET 14 is turned on. Therefore, the output (OUT) of the NOR circuit is pulled down to the reference potential VSS via the n-channel type MISFET 14 which has been conducted. Consequently, the output of the NOR circuit is set to "L" (a low-level signal).

Finally, when "L" (a low-level signal) is inputted into the input A of the NOR circuit and "L" (a low-level signal) is inputted into the input B of the NOR circuit, the p-channel type MISFET 11 and the p-channel type MISFET 12 are turned on, but the n-channel type MISFET 13 and the n-channel type MISFET 14 remain turned off. Therefore, the output (OUT) of the NOR circuit is pulled up to the power supply potential VDD via the p-channel type MISFET 11 and the p-channel type MISFET 12 which have been conducted. Consequently, the output of the NOR circuit is set to "H" (a high-level signal).

Figure 23C:
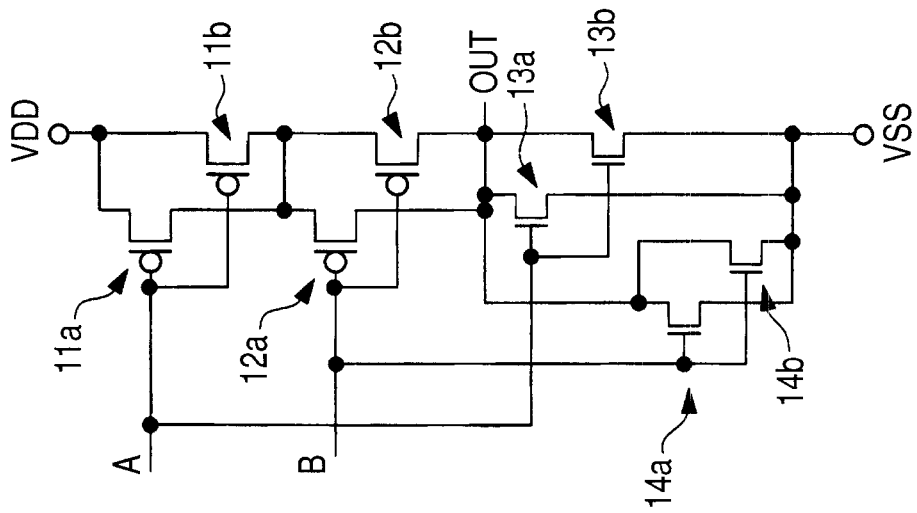
FIG. 23C is a circuit diagram illustrating a NOR circuit according to Embodiment 4, more specifically illustrating an example of employing common-node transistors with different threshold voltages in lieu of both of a p-channel type MISFET of a single body and an n-channel type MISFET of a single body.
Figure 23B:
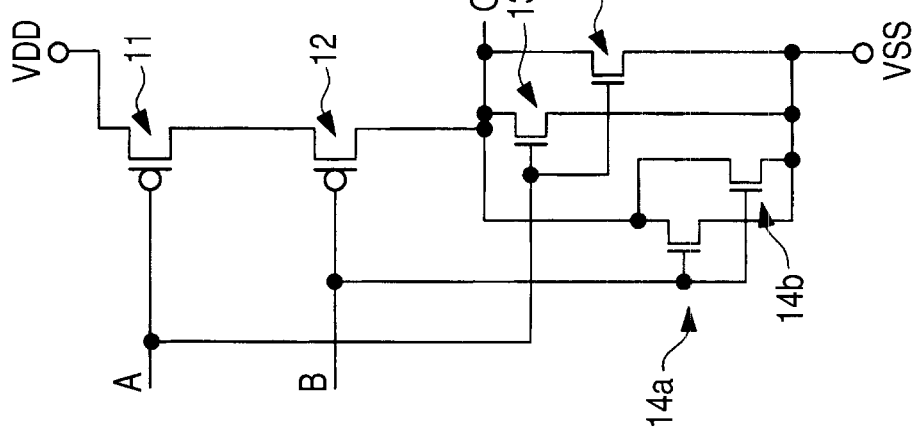
FIG. 23B is a circuit diagram illustrating a NOR circuit according to Embodiment 4, more specifically illustrating an example of employing common-node transistors with different threshold voltages in lieu of an n-channel type MISFET of a single body.
Figure 23A:
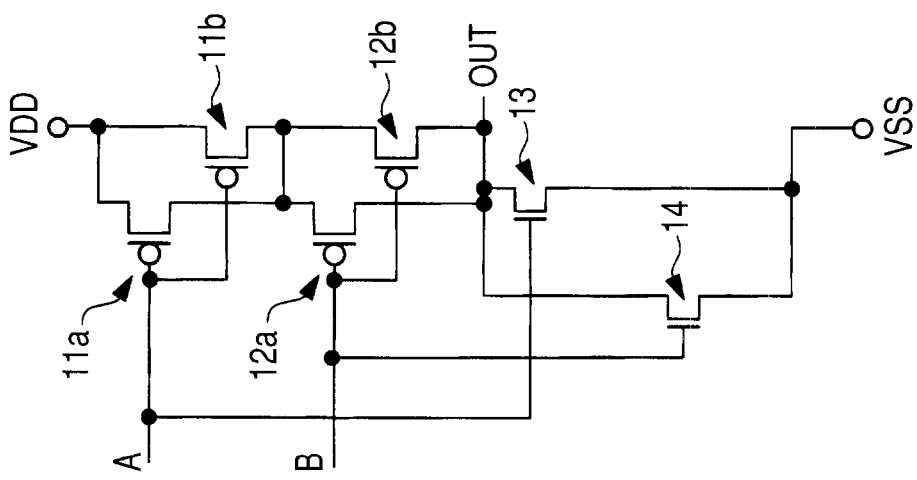
FIG. 23A is a circuit diagram illustrating a NOR circuit according to Embodiment 4, more specifically illustrating an example of employing common-node transistors with different threshold voltages in lieu of a p-channel type MISFET of a single body.

Next, the following explains the example in which the common-node transistors in the present embodiment 4 are applied to the NOR circuit. FIGS. 23A, 23B, and 23C are circuit diagrams illustrating various illustrative embodiments in which the common-node transistors are applied as a circuit element which configures the NOR circuit. For example, FIG. 23A illustrates an example in which each of two p-channel type MISFETs composing a NOR circuit is configured by common-node transistors. That is, in FIG. 23A, the circuit element comprised of the p-channel type MISFET 11 illustrated in FIG. 21 is comprised of the common-node transistors which include the p-channel type MISFET 11a and the p-channel type MISFET 11b. Similarly, in FIG. 23A, the circuit element comprised of the p-channel type MISFET 12 illustrated in FIG. 21 is comprised of the common-node transistors which include the p-channel type MISFET 12a and the p-channel type MISFET 12b.

At this time, a drain region of the p-channel type MISFET 11a and a drain region of the p-channel type MISFET 11b are electrically coupled to the power supply potential VDD. A source region of the p-channel type MISFET 11a and a source region of the p-channel type MISFET 11b are electrically coupled. A drain region of the p-channel type MISFET 12a and a drain region of the p-channel type MISFET 12b are electrically coupled to the electrically-coupled source regions of the p-channel type MISFET 11a and the p-channel type MISFET 11b. Moreover, a source region of the p-channel type MISFET 12a and a source region of the p-channel type MISFET 12b are electrically coupled and serve as the output of the NOR circuit.

A gate electrode of the p-channel type MISFET 11a and a gate electrode of the p-channel type MISFET 11b are electrically coupled and serve as an input A of the NOR circuit. Similarly, a gate electrode of the p-channel type MISFET 12a and a gate electrode of the p-channel type MISFET 12b are electrically coupled and serve as an input B of the NOR circuit.

The threshold voltage of the p-channel type MISFET 11a and the threshold voltage of the p-channel type MISFET 11b are set to be different. For example, the p-channel type MISFET 11a is a high-Vth MISFET of a high threshold voltage, and the p-channel type MISFET 11b is a low-Vth MISFET of a low threshold voltage. Similarly, the threshold voltage of the p-channel type MISFET 12a and the threshold voltage of the p-channel type MISFET 12b are set to be different. For example, the p-channel type MISFET 12a is a high-Vth MISFET of a high threshold voltage, and the p-channel type MISFET 12b is a low-Vth MISFET of a low threshold voltage.

FIG. 23B illustrates an example in which each of two n-channel type MISFETs composing a NOR circuit is configured by common-node transistors. That is, in FIG. 23B, the circuit element comprised of the n-channel type MISFET 13 illustrated in FIG. 21 is comprised of the common-node transistors which include the n-channel type MISFET 13a and the n-channel type MISFET 13b. Similarly, in FIG. 23B, the circuit element comprised of the n-channel type MISFET 14 illustrated in FIG. 21 is comprised of the common-node transistors which include the n-channel type MISFET 14a and the n-channel type MISFET 14b.

At this time, a drain region of the n-channel type MISFET 13a and a drain region of the n-channel type MISFET 13b are electrically coupled to the output (OUT) of the NOR circuit. A source region of the n-channel type MISFET 13a and a source region of the n-channel type MISFET 13b are electrically coupled. Similarly a drain region of the n-channel type MISFET 14a and a drain region of the n-channel type MISFET 14b are electrically coupled to the output (OUT) of the NOR circuit. A source region of the n-channel type MISFET 14a and a source region of the n-channel type MISFET 14b are electrically coupled. Consequently, the n-channel type MISFET 13a, the n-channel type MISFET 13b, the n-channel type MISFET 14a, and the n-channel type MISFET 14b are all coupled in parallel. The source region of the n-channel type MISFET 13a, the source region of the n-channel type MISFET 13b, the source region of the n-channel type MISFET 14a, and the source region of the n-channel type MISFET 14b are all electrically coupled and further coupled to the reference potential VSS.

A gate electrode of the n-channel type MISFET 13a and a gate electrode of the n-channel type MISFET 13b are electrically coupled and serve as an input A of the NOR circuit. Similarly, a gate electrode of the n-channel type MISFET 14a and a gate electrode of the n-channel type MISFET 14b are electrically coupled and serve as an input B of the NOR circuit.

Further, the threshold voltage of the n-channel type MISFET 13a and the threshold voltage of the n-channel type MISFET 13b are set to be different. For example, the n-channel type MISFET 13a is a high-Vth MISFET of a high threshold voltage, and the n-channel type MISFET 13b is a low-Vth MISFET of a low threshold voltage. Similarly, the threshold voltage of the n-channel type MISFET 14a and the threshold voltage of the n-channel type MISFET 14b are set to be different. For example, the n-channel type MISFET 14a is a high-Vth MISFET of a high threshold voltage, and the n-channel type MISFET 14b is a low-Vth MISFET of a low threshold voltage.

FIG. 23C illustrates an example in which the configuration of FIG. 23A and the configuration of FIG. 23B are combined. That is, the common-node transistors which are the circuit element of the present embodiment 4 are applied to both the p-channel type MISFET and the n-channel type MISFET, which configure a NOR circuit.

FIGS. 24A, 24B, and 24C are charts illustrating the layout configuration of the NAND circuits corresponding to the circuit diagrams illustrated in FIGS. 23A, 23B, and 23C, respectively. FIG. 24A is a layout configuration corresponding to FIG. 23A, FIG. 24B is a layout configuration corresponding to FIG. 23B, and FIG. 24C is a layout configuration corresponding to FIG. 23C.

FIG. 24A is explained. As illustrated in FIG. 24A, in the semiconductor substrate, an active region Ac11a and an active region Ac11b are formed separately and arranged side by side in the y direction. An active region Ac13 is arranged so as to line up with the active region Ac11b in the y direction. Two gate electrodes G1 and G2 extend in the y direction, respectively in the shape of a straight line, passing over the active region Ac11a and the active region Ac11b, and crossing over the active region Ac13. The gate electrode G1 is coupled with the input A of the NOR circuit, and the gate electrode G2 is coupled with the input B of the NOR circuit.

The active region Ac11a is a forming region of the p-channel type MISFET 11a and the p-channel type MISFET 12a, and the active region Ac11b is a forming region of the p-channel type MISFET 11b and the p-channel type MISFET 12b. The active region Ac13 is a forming region of the n-channel type MISFET 13 and the n-channel type MISFET 14.

Here, a source region and a drain region of the p-channel type MISFET 11a are formed in a pair of areas which sandwich the gate electrode G1 in the active region Ac11a. Specifically, the drain region is formed in the left side area of the gate electrode G1, and the source region is formed in the right side area of the gate electrode G1. Similarly, a source region and a drain region of the p-channel type MISFET 12a are formed in a pair of areas which sandwich the gate electrode G2 in the active region Ac11a. Specifically, the drain region is formed in the left side area of the gate electrode G2, and the source region is formed in the right side area of the gate electrode G2. Consequently, the area which is sandwiched by the gate electrode G1 and the gate electrode G2 in the active region Ac11a serves as the source region of the p-channel type MISFET 11a and also as the drain region of the p-channel type MISFET 12a.

Similarly, a source region and a drain region of the p-channel type MISFET 11b are formed in a pair of areas which sandwich the gate electrode G1 in the active region Ac11b. Specifically, the drain region is formed in the left side area of the gate electrode G1, and the source region is formed in the right side area of the gate electrode G1. Similarly, a source region and a drain region of the p-channel type MISFET 12b are formed in a pair of areas which sandwich the gate electrode G2 in the active region Ac11b. Specifically, the drain region is formed in the left side area of the gate electrode G2, and the source region is formed in the right side area of the gate electrode G2. Consequently, the area which is sandwiched by the gate electrode G1 and the gate electrode G2 in the active region Ac11b serves as the source region of the p-channel type MISFET 11b and also as the drain region of the p-channel type MISFET 12b.

The drain region of the p-channel type MISFET 11a and the drain region of the p-channel type MISFET 11b are electrically coupled by a drain line DL11 via a plug, and the present drain line DL11 is electrically coupled with the power supply line VDDL which supplies the power supply potential. On the other hand, a source region of the p-channel type MISFET 11a and a source region of p-channel type MISFET 11b are electrically coupled by a source line SL11 (DL12) via a plug. In other words, it can also be said that the drain region of the p-channel type MISFET 12a and the drain region of the p-channel type MISFET 12b are electrically coupled by the drain line DL12 (SL11) via a plug.

On the other hand, the source region of the p-channel type MISFET 12a and the source region of the p-channel type MISFET 12b are electrically coupled by a source line SL12 via a plug, and the output of the present source line S12 serves as an output (OUT) of the NOR circuit.

Next, a source region and a drain region of the n-channel type MISFET 13 are formed in a pair of areas which sandwich the gate electrode G1 in the active region Ac13. Specifically, the source region is formed in the left side area of the gate electrode G1, and the drain region is formed in the right side area of the gate electrode G1. Similarly, a source region and a drain region of the n-channel type MISFET 14 are formed in a pair of areas which sandwich the gate electrode G2 in the active region Ac13. Specifically, the drain region is formed in the left side area of the gate electrode G2, and the source region is formed in the right side area of the gate electrode G2. Consequently, the area which is sandwiched by the gate electrode G1 and the gate electrode G2 in the active region Ac13 serves as the drain region of the n-channel type MISFET 13 and also as the drain region of the n-channel type MISFET 14.

The source region of the n-channel type MISFET 13 is coupled to a source line SL13 via a plug, and the present source line SL13 is electrically coupled with the reference line VSSL which supplies the reference potential. Similarly, the source region of the n-channel type MISFET 14 is coupled to a source line SL14 via a plug, and the present source line SL14 is electrically coupled with the reference line VSSL which supplies the reference potential.

On the other hand, the drain region of the n-channel type MISFET 13 (it can be said also as the drain region of the n-channel type MISFET 14) is coupled to a drain line DL13 (DL14) via a plug. The present drain line DL13 is electrically coupled to the source line SL12 used as the output (OUT) of the NOR circuit.

Next, in the active region Ac11a in which the p-channel type MISFET 11a is formed, a channel region is formed directly under the gate electrode G1 through an interposed gate insulating film (not shown). Similarly, in the active region Ac11b in which the p-channel type MISFET 11b is formed, a channel region is formed directly under the gate electrode G1 through an interposed gate insulating film (not shown).

The impurity concentration of an impurity introduced into the channel region of the p-channel type MISFET 11a and the impurity concentration of an impurity introduced into the channel region of p-channel type MISFET 11b are set to be different. Consequently, the threshold voltage of the p-channel type MISFET 11a and the threshold voltage of the p-channel type MISFET 11b are different. For example, the p-channel type MISFET 11a is formed by the high-Vth MISFET of a high threshold voltage and the p-channel type MISFET 11b is formed by the low-Vth MISFET of a low threshold voltage.

Similarly, in the active region Ac11a in which the p-channel type MISFET 12a is formed, a channel region is formed directly under the gate electrode G2 through an interposed gate insulating film (not shown). Similarly, in the active region Ac11b in which the p-channel type MISFET 12b is formed, a channel region is formed directly under the gate electrode G2 through an interposed gate insulating film (not shown).

The impurity concentration of an impurity introduced into the channel region of the p-channel type MISFET 12a and the impurity concentration of an impurity introduced into the channel region of p-channel type MISFET 12b are set to be different. Consequently, the threshold voltage of the p-channel type MISFET 12a and the threshold voltage of the p-channel type MISFET 12b are different. For example, the p-channel type MISFET 12a is formed by the high-Vth MISFET of a high threshold voltage and the p-channel type MISFET 12b is formed by the low-Vth MISFET of a low threshold voltage.

Furthermore, in the active region Ac13 in which the n-channel type MISFET 13 and the n-channel type MISFET 14 are formed, a channel region of the n-channel type MISFET 13 is formed directly under the gate electrode G1 through an interposed gate insulating film (not shown). Similarly, in the active region Ac13, a channel region of the n-channel type MISFET 14 is formed directly under the gate electrode G2 through an interposed gate insulating film (not shown).

As a substitute of one p-channel type MISFET 11 (refer to FIG. 21) composing the NOR circuit in the present embodiment 4, common-node transistors, which include the p-channel type MISFET 11a (a high-Vth MISFET) and the p-channel type MISFET 11b (a low-Vth MISFET) with different threshold voltages, are employed. As a substitute of another p-channel type MISFET 12 (refer to FIG. 21) composing the NOR circuit, common-node transistors, which include the p-channel type MISFET 12a (a high-Vth MISFET) and the p-channel type MISFET 12b (a low-Vth MISFET) with different threshold voltages, are employed. Consequently, as explained in Embodiment 1, even when the miniaturization of MISFET is advanced, it is possible to produce the prominent effect that both of the improvement of the operating speed and the reduction of the leakage current of the p-channel type MISFET composing the NOR circuit can be satisfied, and that the occupied area of the p-channel type MISFET can be reduced.

Next, FIG. 24B is explained. As illustrated in FIG. 24B, in the semiconductor substrate, an active region Ac13a and an active region Ac13b are formed separately and arranged side by side in the y direction. An active region Ac11 is arranged so as to line up with the active region Ac13a in the y direction. Two gate electrodes G1 and G2 extend in the y direction, respectively in the shape of a straight line, passing over the active region Ac13b and the active region Ac13a, and crossing over the active region Ac11. The gate electrode G1 is coupled with the input A of the NOR circuit, and the gate electrode G2 is coupled with the input B of the NOR circuit.

The active region Ac13a is a forming region of the n-channel type MISFET 13a and the n-channel type MISFET 14a, and the active region Ac13b is a forming region of the n-channel type MISFET 13b and the n-channel type MISFET 14b. The active region Ac11 is a forming region of the p-channel type MISFET 11 and the p-channel type MISFET 12.

Here, a source region and a drain region of the n-channel type MISFET 13a are formed in a pair of areas which sandwich the gate electrode G1 in the active region Ac13a. Specifically, the source region is formed in the left side area of the gate electrode G1, and the drain region is formed in the right side area of the gate electrode G1. Similarly, a source region and a drain region of the n-channel type MISFET 14a are formed in a pair of areas which sandwich the gate electrode G2 in the active region Ac13a. Specifically, the drain region is formed in the left side area of the gate electrode G2, and the source region is formed in the right side area of the gate electrode G2. Consequently, the area which is sandwiched by the gate electrode G1 and the gate electrode G2 in the active region Ac13a serves as the drain region of the n-channel type MISFET 13a and also as the drain region of the n-channel type MISFET 14a.

Similarly, a source region and a drain region of the n-channel type MISFET 13b are formed in a pair of areas which sandwich the gate electrode G1 in the active region Ac13b. Specifically, the source region is formed in the left side area of the gate electrode G1, and the drain region is formed in the right side area of the gate electrode G1. Similarly, a source region and a drain region of the n-channel type MISFET 14b are formed in a pair of areas which sandwich the gate electrode G2 in the active region Ac13b. Specifically, the drain region is formed in the left side area of the gate electrode G2, and the source region is formed in the right side area of the gate electrode G2. Consequently, the area which is sandwiched by the gate electrode G1 and the gate electrode G2 in the active region Ac13b serves as the drain region of the n-channel type MISFET 13b and also as the drain region of the n-channel type MISFET 14b.

The source region of the n-channel type MISFET 13a and the source region of the n-channel type MISFET 13b are electrically coupled by a source line SL13 via a plug, and the present source line SL13 is electrically coupled to the reference line VSSL which supplies the reference potential. Similarly, the source region of the n-channel type MISFET 14a and the source region of the n-channel type MISFET 14b are electrically coupled by a source line SL14 via a plug, and the present source line SL14 is electrically coupled to the reference line VSSL which supplies the reference potential.

On the other hand, the drain region of the n-channel type MISFET 13a and the drain region of the n-channel type MISFET 13b are electrically coupled by a drain line DL13 via a plug, and the present drain line DL13 serves as an output (OUT) of the NOR circuit. In other words, the drain region of the n-channel type MISFET 14a and the drain region of the n-channel type MISFET 14b are electrically coupled by a drain line DL14 via a plug. It can also be said that the present drain line DL14 serves as an output (OUT) of the NOR circuit.

Next, a source region and a drain region of the p-channel type MISFET 11 are formed in a pair of areas which sandwich the gate electrode G1 in the active region Ac11. Specifically, the drain region is formed in the left side area of the gate electrode G1, and the source region is formed in the right side area of the gate electrode G1. Similarly, a source region and a drain region of the p-channel type MISFET 12 are formed in a pair of areas which sandwich the gate electrode G2 in the active region Ac11. Specifically, the drain region is formed in the left side area of the gate electrode G2, and the source region is formed in the right side area of the gate electrode G2. Consequently, the area which is sandwiched by the gate electrode G1 and the gate electrode G2 in the active region Ac11 serves as the source region of the p-channel type MISFET 11 and also as the drain region of the p-channel type MISFET 12.

The drain region of the p-channel type MISFET 11 is coupled to a drain line DL11 via a plug, and the present drain line DL11 is electrically coupled with the power supply line VDDL which supplies the power supply potential. The source region of the p-channel type MISFET 12 is coupled to a source line SL12 via a plug, and the present source line SL12 serves as the output (OUT) of the NOR circuit. Consequently, the drain line DL13 (DL14) and the source line SL12 described above are electrically coupled.

Next, in the active region Ac13a in which the n-channel type MISFET 13a is formed, a channel region is formed directly under the gate electrode G1 through an interposed gate insulating film (not shown). Similarly, in the active region Ac13b in which the n-channel type MISFET 13b is formed, a channel region is formed directly under the gate electrode G1 through an interposed gate insulating film (not shown).

The impurity concentration of an impurity introduced into the channel region of the n-channel type MISFET 13a, and the impurity concentration of an impurity introduced into the channel region of the n-channel type MISFET 13b are set to be different. Consequently, the threshold voltage of the n-channel type MISFET 13a and the threshold voltage of the n-channel type MISFET 13b are different. For example, the n-channel type MISFET 13a is formed by the high-Vth MISFET of a high threshold voltage and the n-channel type MISFET 13b is formed by the low-Vth MISFET of a low threshold voltage.

Similarly, in the active region Ac13a in which the n-channel type MISFET 14a is formed, a channel region is formed directly under the gate electrode G2 through an interposed gate insulating film (not shown). Similarly, in the active region Ac13b in which the n-channel type MISFET 14b is formed, a channel region is formed directly under the gate electrode G2 through an interposed gate insulating film (not shown).

The impurity concentration of an impurity introduced into the channel region of the n-channel type MISFET 14a, and the impurity concentration of an impurity introduced into the channel region of the n-channel type MISFET 14b are set to be different. Consequently, the threshold voltage of the n-channel type MISFET 14a and the threshold voltage of the n-channel type MISFET 14b are different. For example, the n-channel type MISFET 14a is formed by the high-Vth MISFET of a high threshold voltage and the n-channel type MISFET 14b is formed by the low-Vth MISFET of a low threshold voltage.

Furthermore, in the active region Ac11 in which the p-channel type MISFET 11 and the p-channel type MISFET 12 are formed, a channel region of the n-channel type MISFET 11 is formed directly under the gate electrode G1 through an interposed gate insulating film (not shown). Similarly, in the active region Ac11, a channel region of the n-channel type MISFET 12 is formed directly under the gate electrode G2 through an interposed gate insulating film (not shown).

As a substitute of one n-channel type MISFET 13 (refer to FIG. 21) composing the NOR circuit in the present embodiment 4, common-node transistors, which include the n-channel type MISFET 13a (a high-Vth MISFET) and the n-channel type MISFET 13b (a low-Vth MISFET) with different threshold voltages, are employed. As a substitute of another n-channel type MISFET 14 (refer to FIG. 21) which configures a NOR circuit, common-node transistors, which include the n-channel type MISFET 14a (a high-Vth MISFET) and the n-channel type MISFET 14b (a low-Vth MISFET) with different threshold voltages, are employed. Consequently, as explained in Embodiment 1, even when the miniaturization of MISFET is advanced, it is possible to produce the prominent effect that both of the improvement of the operating speed and the reduction of the leakage current of the n-channel type MISFET composing the NOR circuit can be satisfied, and that the occupied area of the n-channel type MISFET can be reduced.

Next, FIG. 24C is explained. The layout configuration illustrated in FIG. 24C is what combines the layout configuration of the p-channel type MISFET illustrated in FIG. 24A and the layout configuration of the n-channel type MISFET illustrated in FIG. 24B. Namely, in FIG. 24C, the common-node transistors in the present embodiment 4 are employed for all of two p-channel type MISFETs and two n-channel type MISFETs, which configure an NOR circuit. Consequently, as explained in Embodiment 1, even when the miniaturization of MISFET is advanced, it is possible to produce the prominent effect that both of the improvement of the operating speed and the reduction of the leakage current are satisfied in all the p-channel type MISFETs and the n-channel type MISFETs composing the NOR circuit, and that the occupied area of the NOR circuit can be reduced.

Embodiment 5

Embodiment 5 explains an example in which the present invention is applied to a word driver composing a memory module. FIG. 25 is a chart illustrating the configuration of a memory module according to the present embodiment 5. In FIG. 25, the memory module according to the present embodiment 5 includes a memory cell array 20, an address decoder 21, a word driver 22, a column selecting unit 23, a control circuit 24, a write amplifier 25, and a read amplifier 26.

The memory cell array 20 includes plural memory cells which are arranged in a matrix. Each memory cell which configures the memory cell array 20 is a memory element which stores information, and mass information can be stored by making the plural memory cells store information. As the memory cell composing the memory cell array 20, a memory cell of DRAM (Dynamic Random Access Memory), a memory cell of SRAM (Static Random Access Memory), or a nonvolatile memory element can be employed for example. As illustrated in FIG. 25, plural word lines are arranged in the row direction, and plural data lines are arranged in the column direction in the memory cell array 20. A memory cell is arranged in the crossing area of a word line and a data line.

The address decoder 21 inputs and analyzes the address, outputs a row component of the analyzed address (row address) to the word driver 22, and outputs a column component of the analyzed address (column address) to the column selecting unit 23.

The word driver 22 inputs the row address from the address decoder 21 and selects a specific word line. The column selecting unit 23 inputs the column address from the address decoder 21 and selects a specific data line.

The control circuit 24 controls writing operation and read operation, to and from the memory cell composing the memory cell array. The write amplifier 25 functions to output the input data to the column selecting unit. On the other hand, the read amplifier 26 inputs and amplifies the data read from the column selecting unit, and outputs the amplified data.

The following explains the operation of the memory module configured as described above, according to the present embodiment 5. First, writing operation is explained. The address decoder 21 analyzes the address and outputs the row address and the column address which are obtained as a result of the analysis, to the word driver 22 and the column selecting unit 23, respectively. The word driver 22 selects a specific word line based on the inputted row address. On the other hand, the column selecting unit 23 selects a specific data line based on the inputted column address. According to these selections, a memory cell arranged to an area in which the specific word line and the specific data line are crossing is selected. At this time, the write amplifier 25 is activated by a signal from the control circuit 24. The activated write amplifier 25 inputs input data and outputs the input data to the column selecting unit 23. The column selecting unit 23 outputs input data to the specific data line, then the input data is outputted to the memory cell selected, accordingly the writing operation is performed.

Next, read operation is explained. The address decoder 21 analyzes the address and outputs the row address and the column address which are obtained as a result of the analysis, to the word driver 22 and the column selecting unit 23, respectively. The word driver 22 selects a specific word line based on the inputted row address. On the other hand, the column selecting unit 23 selects a specific data line based on the inputted column address. According to these selections, a memory cell arranged to an area in which the specific word line and the specific data line are crossing is selected. At this time, the read amplifier 26 is activated by a signal from the control circuit 24. The column selecting unit 23 outputs the output data read from the specific data line to the activated read amplifier 26. The read amplifier 26 amplifies the inputted output data, and outputs the amplified output data externally. In this manner, the read operation is carried out.

Here, when the speediness of the read operation or the writing operation is desired, improvement of the operating speed is required for the word driver 22 which configures the memory module. That is, in order to perform the read operation and the writing operation at high speed, it is necessary to select a memory cell quickly. Therefore, the high-speed operation of the word driver 22 which selects the word line is required. On the other hand, the number of the word lines arranged in the memory cell array 20 is also increasing with high integration of the memory cell array 20. The increasing number of word lines implies that, when a specific word line is selected, word lines which are not selected also increase. Consequently, in the word driver 22 which controls the not-selected word lines, it is necessary to reduce the leakage current of a switch (MISFET) which controls the not-selected word lines. This is because, when the number of word lines increases, the total of the leakage current will also become large, hindering the low power consumption of the word driver 22 so much.

In this way, it is understood that the improvement of the operating speed and the reduction of the leakage current are required at the word driver 22 which configures the memory module. The word driver 22 has an inverter circuit in the final stage, as illustrated in FIG. 25. Consequently, it is necessary to promote the improvement of the operating speed and the reduction of the leakage current of this inverter circuit. Therefore, the inverter circuit according to Embodiment 2 can be employed for the inverter circuit which configures the final stage of the word driver 22. Namely, by employing the common-node transistors including a low-Vth MISFET and a high-Vth MISFET for each circuit element (for example, an n-channel type MISFET and a p-channel type MISFET) composing the inverter circuit, both of the improvement of the operating speed and the reduction of the leakage current of the inverter circuit can be satisfied, and the occupied area of the inverter circuit can be reduced.

In the word driver 22, it is useful in particular to employ the common-node transistors which include a low-Vth MISFET and a high-Vth MISFET in place of the p-channel type MISFET arranged at the power supply potential side. This is because, in the word driver 22, a low level signal is outputted to a word line which is not selected. That is, in the inverter circuit coupled to the word line which is not selected, the p-channel type MISFET arranged at the power source side is turned off. Consequently, it is possible to reduce the leakage current at the time of OFF by replacing the present p-channel type MISFET with the common-node transistors which include a low-Vth MISFET and a high-Vth MISFET. Namely, the low power consumption of the word driver 22 becomes possible, by reducing the leakage current, and also suppressing the fall of the operating speed, in the inverter circuit controlling the not-selected word lines which occupies the most part of the whole word lines. Furthermore, since the occupied area of the word driver can be made small, the miniaturization of the memory module can be promoted.

Figure 26:
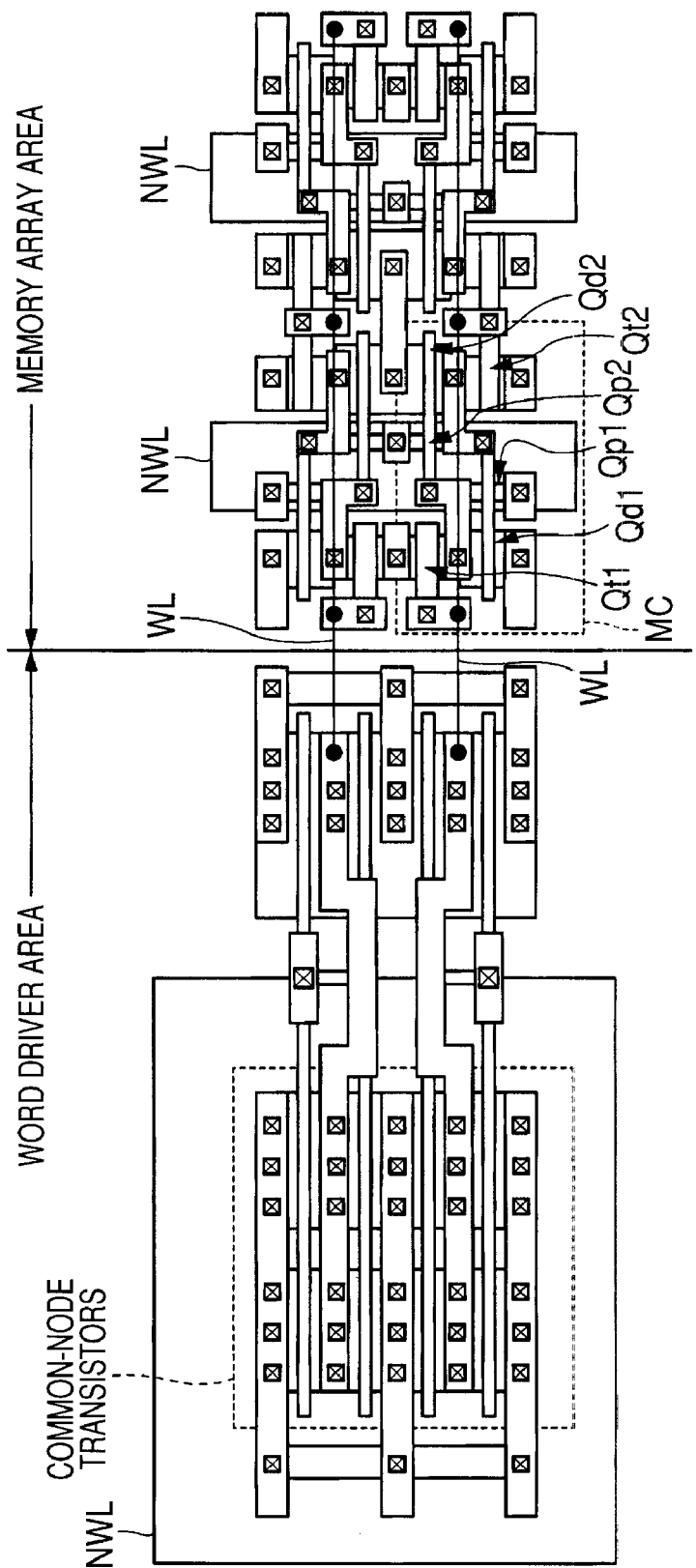
FIG. 26 is a chart illustrating the layout configuration of a word driver and a memory cell array according to Embodiment 5.

Next, the layout configuration of the actual word driver is explained. FIG. 26 is a chart illustrating the layout configuration of SRAM which is an example of the inverter circuit arranged in the final stage of the word driver, and the memory cell array. In FIG. 26, the layout corresponding to the word driver having the word lines in two rows is illustrated, and the memory cell array of two rows by two columns (2×2) is illustrated. In the word driver, a p-channel type MISFET is formed in an n-type well NWL as common-node transistors. Namely, among the p-channel type MISFET and the n-channel type MISFET which configure the inverter circuit, the p-channel type MISFET is comprised of a low-Vth MISFET and a high-Vth MISFET. By composing the p-channel type MISFET in this way, the leakage current at the time of OFF can be reduced compared with the case where only a low-Vth MISFET is employed for the p-channel type MISFET. On the other hand, the fall of the operating speed can be suppressed compared with the case where only a high-Vth MISFET is employed for the p-channel type MISFET. Consequently, by employing the common-node transistors, which is the feature of the present embodiment 5, for the inverter circuit composing the final stage of the word driver, it is possible to realized the low power consumption of the word driver as well as the suppression of the fall of the operating speed in the word driver. Furthermore, since the occupied area of the word driver can be made small, the miniaturization of the memory module can be promoted.

Subsequently, the layout configuration of SRAM composing the memory cell array is explained briefly. In FIG. 26, a memory cell MC of SRAM has, for example, six field-effect transistors including a pair of drive MISFETs Qd1 and Qd2, a pair of load MISFETs Qp1 and Qp2, and a pair transfer MISFETs Qt1 and Qt2, each formed over the semiconductor substrate. At this time, the pair of drive MISFETs Qd1 and Qd2 and the pair of transfer MISFETs Qt1 and Qt2 are configured by an n-channel type MISFET, and the pair of load MISFETs Qp1 and Qp2 are configured by a p-channel type MISFET.

Figure 27:
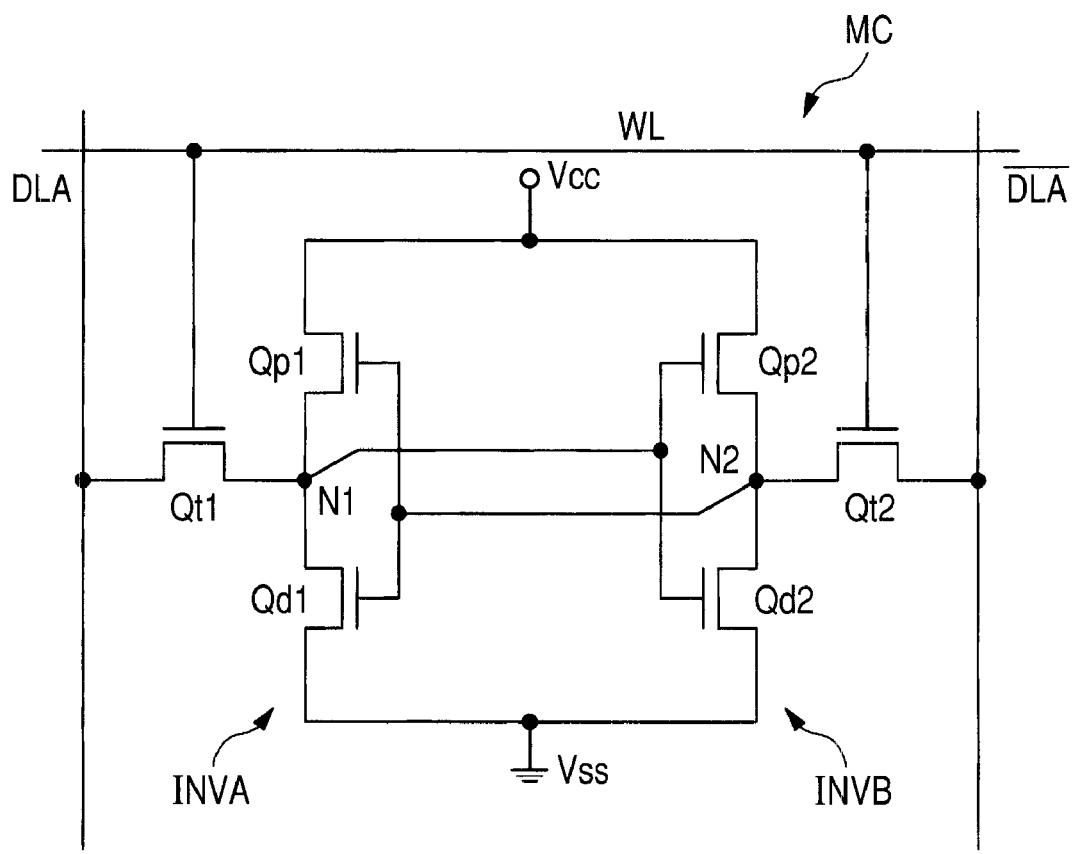
FIG. 27 is a circuit diagram of an SRAM.

In the following, the present SRAM is explained. First, the equivalent circuit of the memory cell MC composing SRAM is explained. FIG. 27 is an equivalent circuit diagram illustrating the memory cell MC of SRAM in the present embodiment 5. As illustrated in FIG. 27, the memory cell MC is arranged at the intersection of a pair of complementary data lines (a data line DLA, a data line DLA) and a word line WL, and includes a pair of drive MISFETs Qd1 and Qd2, a pair of load MISFETs Qp1 and Qp2, and a pair of transfer MISFETs Qt1 and Qt2. The drive MISFETs Qd1 and Qd2 and the transfer MISFETs Qt1 and Qt2 are configured by an n-channel type MISFET, and the load MISFETs Qp1 and Qp2 are configured by a p-channel type MISFET.

Among the six MISFETs composing the memory cell MC, the drive MISFET Qd1 and the load MISFET Qp1 configure a CMOS inverter INVA, and the drive MISFET Qd2 and the load MISFET Qp2 configure a CMOS inverter INVB. The input/output terminals (storage nodes N1, N2) of the pair of CMOS inverters INVA, INVB are mutually coupled in a manner of crossover coupling, thereby, forming a flip-flop circuit as an information storage part which stores one-bit information. One input/output terminal (the storage node N1) of the flip-flop circuit is coupled to one of a source region and a drain region of the transfer MISFET Qt1, and another input/output terminal (the storage node N2) of the flip-flop circuit is coupled to the other one of a source region and a drain region of the transfer MISFET Qt2.

The other one of the source region and the drain region of the transfer MISFET Qt1 is coupled to the data line DLA, and the other one of the source region and the drain region of the transfer MISFET Qt2 is coupled to the data line $\overline{DLA}$. One end of the flip-flop circuit (each source region of the load MISFETs Qp1 and Qp2) is coupled to a supply voltage (Vcc), and the other end of the flip-flop circuit (each source region of the drive MISFETs Qd1 and Qd2) is coupled to a reference voltage (Vss).

Operation of the above-described circuit is explained in the following. When the storage node N1 of one CMOS inverter INVA is at high potential ("H"), the storage node N2 of the other CMOS inverter INVB becomes at low potential ("L"), because the drive MISFET Qd2 is turned on. Therefore, the drive MISFET Qd1 is turned off and the high potential ("H") of the storage node N1 is held. Namely, by use of a latch circuit which is formed by the crossover coupling of a pair of CMOS inverters INVA and INVB, the respective state of the storage nodes N1 and N2 are held, and information is stored while the supply voltage is applied.

The respective gate electrodes of the transfer MISFETs Qt1 and Qt2 are coupled to a word line WL. The present word line WL controls conduction or non-conduction of the transfer MISFETs Qt1, Qt2. Namely, when the word line WL is at high potential ("H"), the transfer MISFETs Qt1, Qt2 are turned on, and the latch circuit and the complementary data lines (the data lines DLA, $\overline{DLA}$) are electrically coupled. Accordingly, the potential state ("H" or "L") of the storage nodes N1 and N2 appears in the data lines DLA, $\overline{DLA}$, allowing information of the memory cell MC to be read.

For writing information in the memory cell MC, the word line WL is set to an "H" potential level and the transfer MISFETs Qt1, Qt2 are rendered into an ON state, and the information on the data lines DLA, $\overline{DLA}$ is transferred to the storage node N1 and N2. SRAM can be operated as described above.

Embodiment 6

Figure 28:
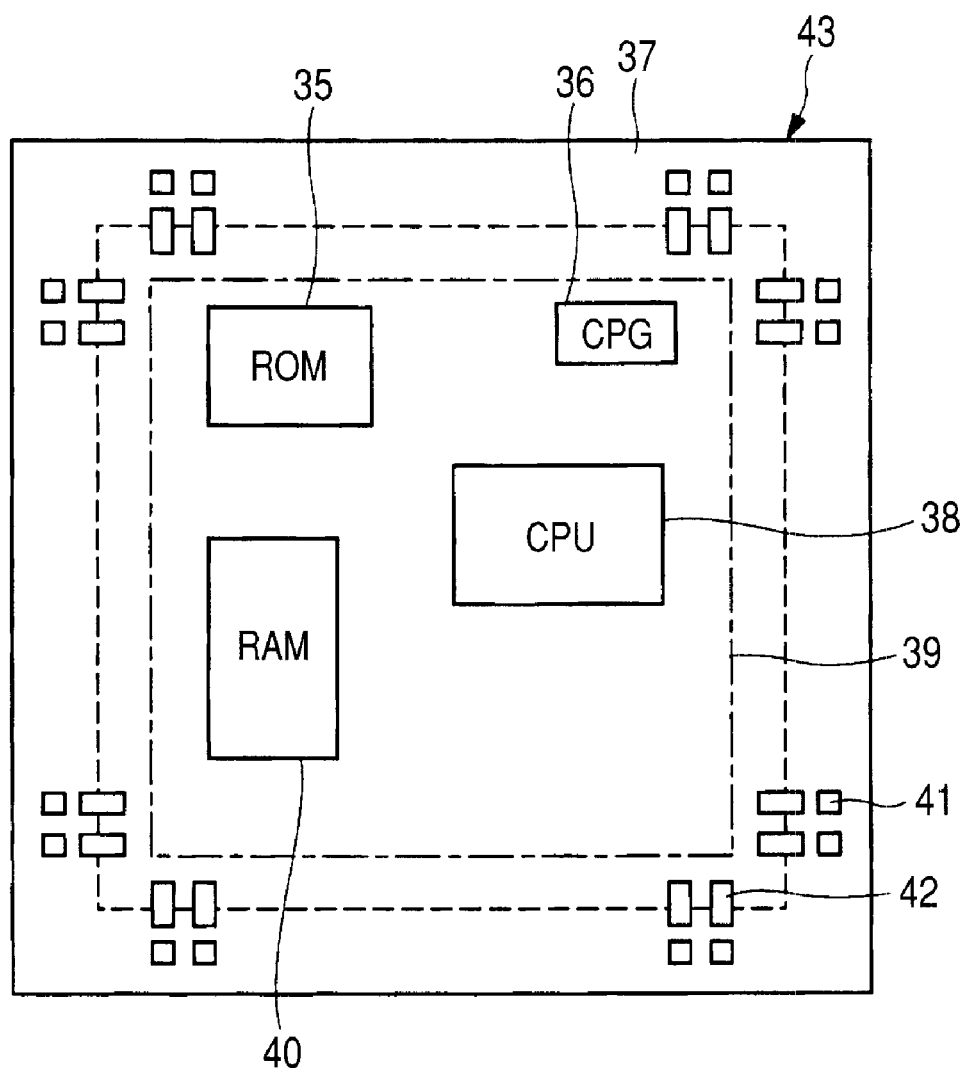
FIG. 28 is a chart illustrating the outline layout configuration of a whole semiconductor chip in which an input/output circuit according to Embodiment 6 is mounted.

In Embodiment 6, an example in which the present invention is applied to an input/output circuit (I/O circuit) is explained. FIG. 28 is a chart illustrating the outline layout configuration of a whole semiconductor chip in which an input/output circuit according to Embodiment 6 is mounted. In FIG. 28, an input/output circuit 42 interfaces between an internal circuit region 39 including an internal circuit (a core circuit) formed in the internal area of a semiconductor chip 43, and an external circuit formed in the exterior of the semiconductor chip 43. The internal circuit region 39 includes a read only memory (ROM) 35, a clock pulse generator (CPG) 36, a central processing unit (CPU) 38, a random access memory (RAM) 40, etc. In the other area, a random logic, a bus, etc. are provided. A bonding pad 41 and an input/output circuit 42 are provided in a bonding pad and input/output circuit region 37, for example.

Specifically, the internal circuit formed in the semiconductor chip 43 is able to operate at a low voltage such as 1.5V for example, and the external circuit is able to operate at a voltage such as 3.3V for example. Therefore, when outputting a signal from the internal circuit to the external circuit, or when inputting a signal from the external circuit to the internal circuit conversely, it is necessary to convert the voltage value of the signal. It is further necessary to secure sufficient current drive power in order to drive the external circuit. The function which can absorb the difference of the input/output speed of the data between the internal circuit and the external circuit is also necessary. For this reason, the input/output circuit 42 which interfaces with the external circuit is formed in the circumference of the internal circuit in the semiconductor chip 43.

Figure 29:
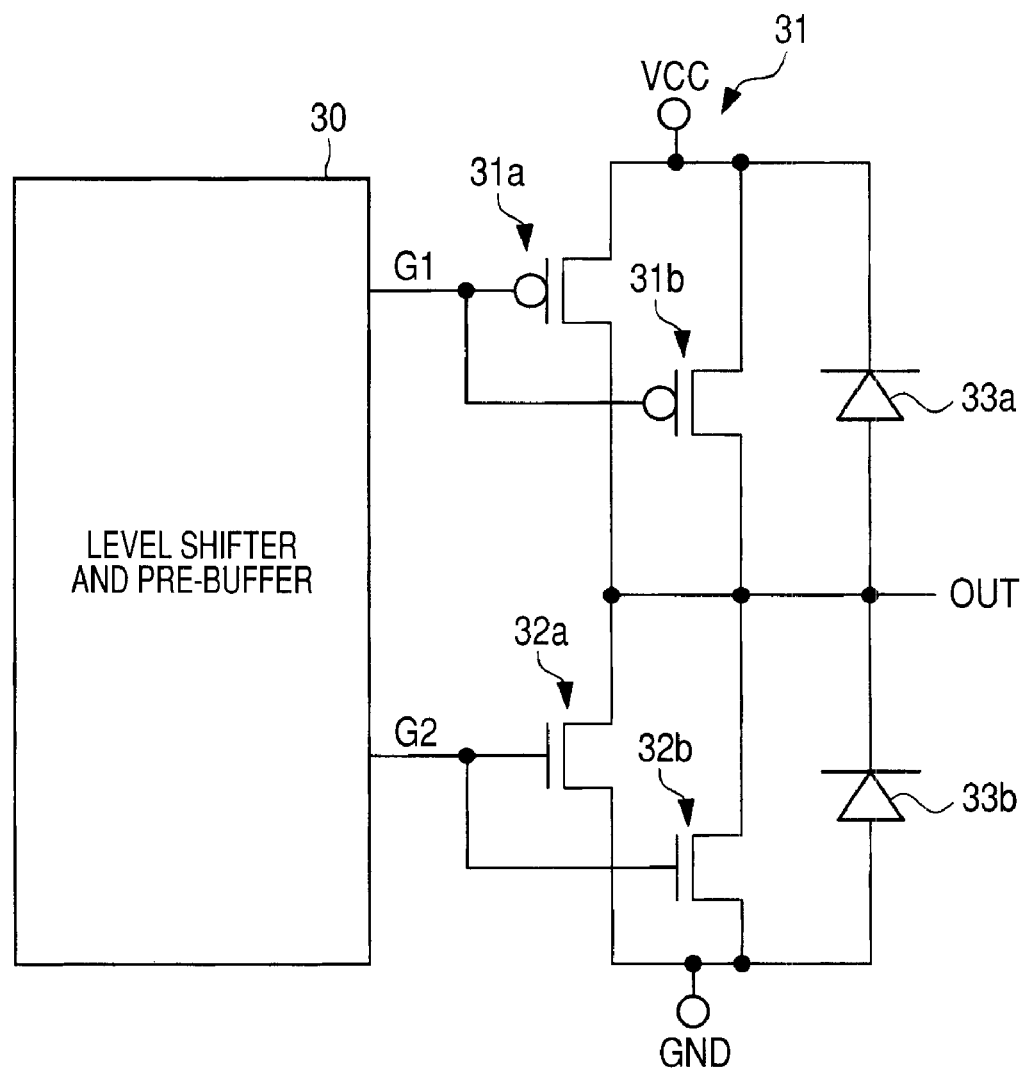
FIG. 29 is a circuit diagram illustrating the configuration of the output circuit according to Embodiment 6.

FIG. 29 is a circuit block diagram illustrating an output circuit included in the input/output circuits in the present embodiment 6. As illustrated in FIG. 29, the output circuit includes a level shifter and pre-buffer 30, an out-buffer 31, and diodes 33a and 33b.

The level shifter and pre-buffer 30 has a level shifter and a pre-buffer. The level shifter has the function to perform voltage conversion of a signal, and, specifically, converts the voltage value of the signal outputted from the internal circuit to the external circuit, for example, from 1.5V, to 3.3V.

The out-buffer 31 is provided in order to obtain the current drive power for fully driving the external circuit (load), and also functions as a delay circuit which absorbs the difference of the input/output speed of the data between the internal circuit and the external circuit.

The pre-buffer is provided to avoid a possibility of the degradation to be caused in the internal circuit, if the out-buffer 31 having a high current drive power is directly coupled to the internal circuit. The pre-buffer has a current drive power higher than the internal circuit, but lower than the out-buffer 31. The degradation of the internal circuit can be avoided by providing the pre-buffer.

The diodes 33a and 33b are circuit elements provided between the output (OUT) and the power supply potential VCC or between the output (OUT) and the reference potential GND, and have the function to protect the internal circuit from an electrostatic discharge.

In the output circuit configured in this way, a single-body p-channel type MISFET and a single-body n-channel type MISFET, which configure the out-buffer 31, are replaced with common-node transistors which include a low-Vth MISFET and a high-Vth MISFET, as the feature of the present embodiment 6. That is, as illustrated in FIG. 29, a p-channel type MISFET 31a and a p-channel type MISFET 31b are coupled in parallel between the power supply potential VCC and the output (OUT), and a gate electrode G1 of the p-channel type MISFET 31a and a gate electrode G1 of the p-channel type MISFET 31b share a common terminal. At this time, the p-channel type MISFET 31a is formed by a high-Vth MISFET of a high threshold voltage, and the p-channel type MISFET 31b is formed by a low-Vth MISFET of a low threshold voltage.

On the other hand, an n-channel type MISFET 32a and an n-channel type MISFET 32b are coupled in parallel between the output (OUT) and the reference potential GND, and a gate electrode G2 of the n-channel type MISFET 32a and a gate electrode G2 of the n-channel type MISFET 32b share a common terminal. At this time, the n-channel type MISFET 32a is formed by a high-Vth MISFET of a high threshold voltage, and the n-channel type MISFET 32b is formed by a low-Vth MISFET of a low threshold voltage.

Accordingly, similarly to what is explained in Embodiment 1, both of the improvement of the operating speed and the reduction of the leakage current of the out-buffer 31 can be satisfied, and the occupied area of the out-buffer 31 can be reduced.

Unlike the inverter circuit, in the out-buffer 31, the common terminal to which the gate electrode G1 of the p-channel type MISFET 31a and the gate electrode G1 of the p-channel type MISFET 31b are coupled, and the common terminal to which the gate electrode G2 of the n-channel type MISFET 32a and the gate electrode G2 of the n-channel type MISFET 32b are coupled, are separately provided. This is because, in the out-buffer 31, it becomes necessary to turn off the p-channel type MISFET 31a and the p-channel type MISFET 31b and, at the same time, to turn off the n-channel type MISFET 32a and the n-channel type MISFET 32b. This situation can not be realized by use of the inverter circuit.

Figure 30:
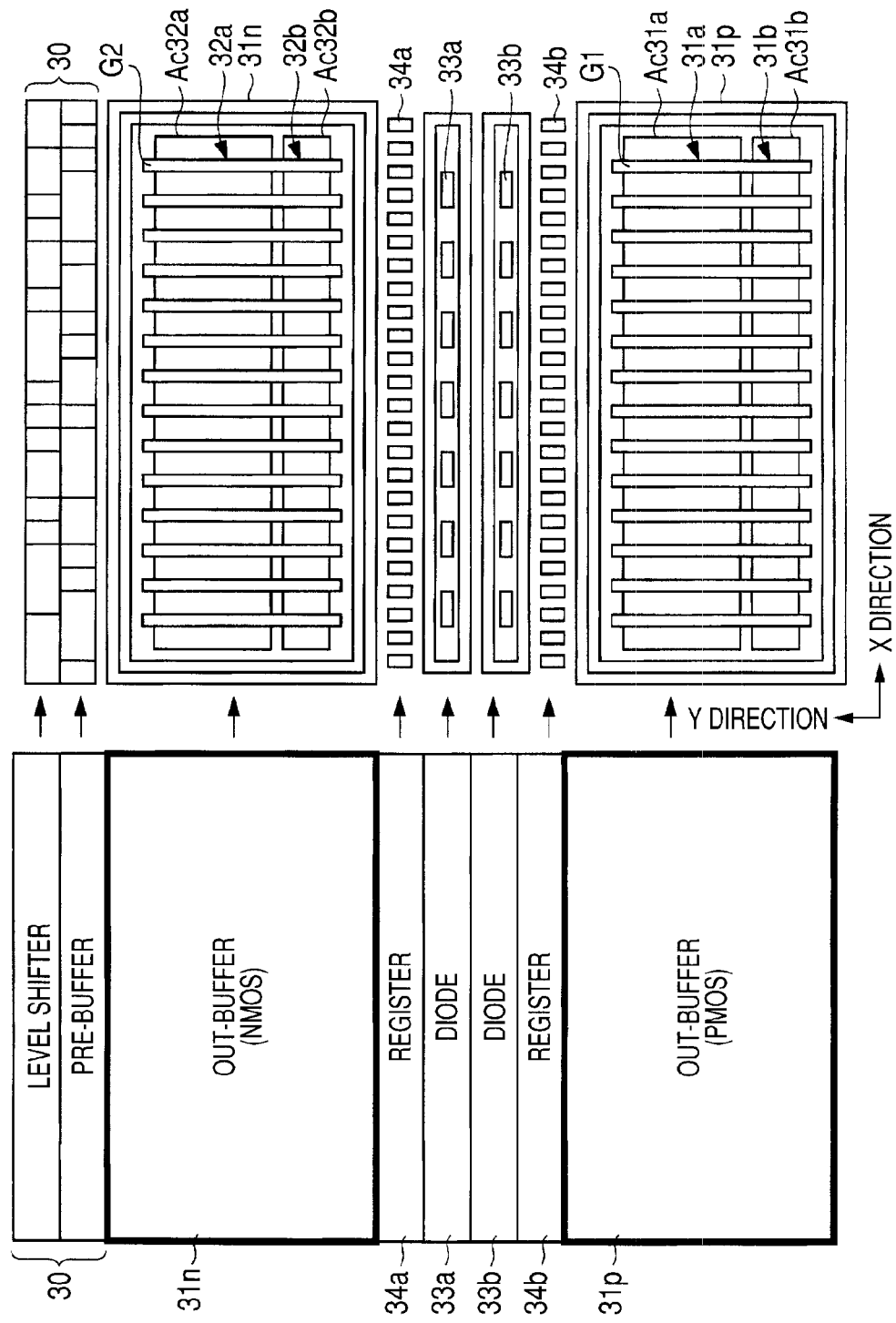
FIG. 30 is a chart illustrating the layout configuration of the output circuit according to Embodiment 6.

Next, the layout configuration of the output circuit is explained. FIG. 30 is a chart illustrating the outline of the layout configuration of the output circuit according to the present embodiment 6. The layouts of the level shifter and pre-buffer 30, the out-buffers 31n and 31p, the diodes 33a and 33b, and registers 34a and 34b are illustrated in FIG. 30.

Since one of the features of the present embodiment 6 lies in the layout configuration of the out-buffers 31n and 31p, the layout configuration of these out-buffers 31n and 31p is explained. The out-buffer 31 illustrated in FIG. 29 is arranged in the semiconductor substrate, divided into an out-buffer 31n and an out-buffer 31p. The out-buffer 31n includes the n-channel type MISFETs and the out-buffer 31p includes the p-channel type MISFETs, as illustrated in FIG. 30.

In the forming region of the out-buffer 31n, an active region Ac32a and an active region Ac32b are formed separately and arranged side by side in the y direction. The circumference of the active region Ac32a and the active region Ac32b is surrounded by an element isolation region. Over the active region Ac32a and the active region Ac32b, plural gate electrodes G2 are arranged side by side in the x direction. The n-channel type MISFET 32a is formed by a gate electrode G2, a source region, and a drain region, the source region and the drain region being formed in a pair of areas which sandwich the gate electrode G2 in the active region Ac32a. Similarly, the n-channel type MISFET 32b is formed by a gate electrode G2, a source region, and a drain region, the source region and the drain region being formed in a pair of areas which sandwich the gate electrode G2 in the active region Ac32b. The gate electrodes G2, the source regions, and the drain regions of the n-channel type MISFET 32a and the n-channel type MISFET 32b are electrically coupled respectively. Accordingly, the common-node transistors are formed by the n-channel type MISFET 32a and the n-channel type MISFET 32b.

A channel region of the n-channel type MISFET 32a is formed directly under the gate electrode G2 of the active region Ac32a, and a channel region of the n-channel type MISFET 32b is formed directly under the gate electrode G2 of the active region Ac32b. The impurity concentration of an impurity introduced into the channel region of the n-channel type MISFET 32a and the impurity concentration of an impurity introduced into the channel region of the n-channel type MISFET 32b are set to be different. Therefore, a threshold voltage of the n-channel type MISFET 32a and a threshold voltage of the n-channel type MISFET 32b are different. For example, the n-channel type MISFET 32a is formed by a high-Vth MISFET of a high threshold voltage, and the n-channel type MISFET 32b is formed by a low-Vth MISFET of a low threshold voltage.

Similarly, in the forming region of the out-buffer 31p, an active region Ac31a and an active region Ac31b are formed separately and arranged side by side in the y direction. The circumference of the active region Ac31a and the active region Ac31b is surrounded by an element isolation region. Over the active region Ac31a and the active region Ac31b, plural gate electrodes G1 are arranged side by side in the x direction. The p-channel type MISFET 31a is formed by a gate electrode G1, a source region, and a drain region, the source region and the drain region being formed in a pair of areas which sandwich the gate electrode G1 in the active region Ac31a. Similarly, the p-channel type MISFET 31b is formed by a gate electrode G1, a source region, and a drain region, the source region and the drain region being formed in a pair of areas which sandwich the gate electrode G1 in the active region Ac31b. The gate electrodes G1, the source regions, and the drain regions of the p-channel type MISFET 31a and the p-channel type MISFET 31b are electrically coupled respectively. Accordingly, the common-node transistors are formed by the p-channel type MISFET 31a and the p-channel type MISFET 31b.

A channel region of the p-channel type MISFET 31a is formed directly under the gate electrode G1 of the active region Ac31a, and a channel region of the p-channel type MISFET 31b is formed directly under the gate electrode G1 of the active region Ac31b. The impurity concentration of an impurity introduced into the channel region of the p-channel type MISFET 31a and the impurity concentration of an impurity introduced into the channel region of the p-channel type MISFET 31b are set to be different. Therefore, a threshold voltage of the p-channel type MISFET 31a and a threshold voltage of the p-channel type MISFET 31b are different. For example, the p-channel type MISFET 31a is formed by a high-Vth MISFET of a high threshold voltage, and the p-channel type MISFET 31b is formed by a low-Vth MISFET of a low threshold voltage.

By adopting such a layout configuration, the out-buffer 31 including the out-buffer 31p and the out-buffer 31n can be comprised of the common-node transistors which include a low-Vth MISFET and a high-Vth MISFET. Accordingly, similarly to what is explained in Embodiment 1, both of the improvement of the operating speed and the reduction of the leakage current of the out-buffers 31n and 31p can be satisfied, and the occupied area of the out-buffers 31n and 31p can be reduced.

Embodiment 7

In Embodiment 7, a designing method is described for a case where the transistor structure described in Embodiment 1 to Embodiment 6 is applied as a standard cell in the design of a logic circuit.

Figure 31:
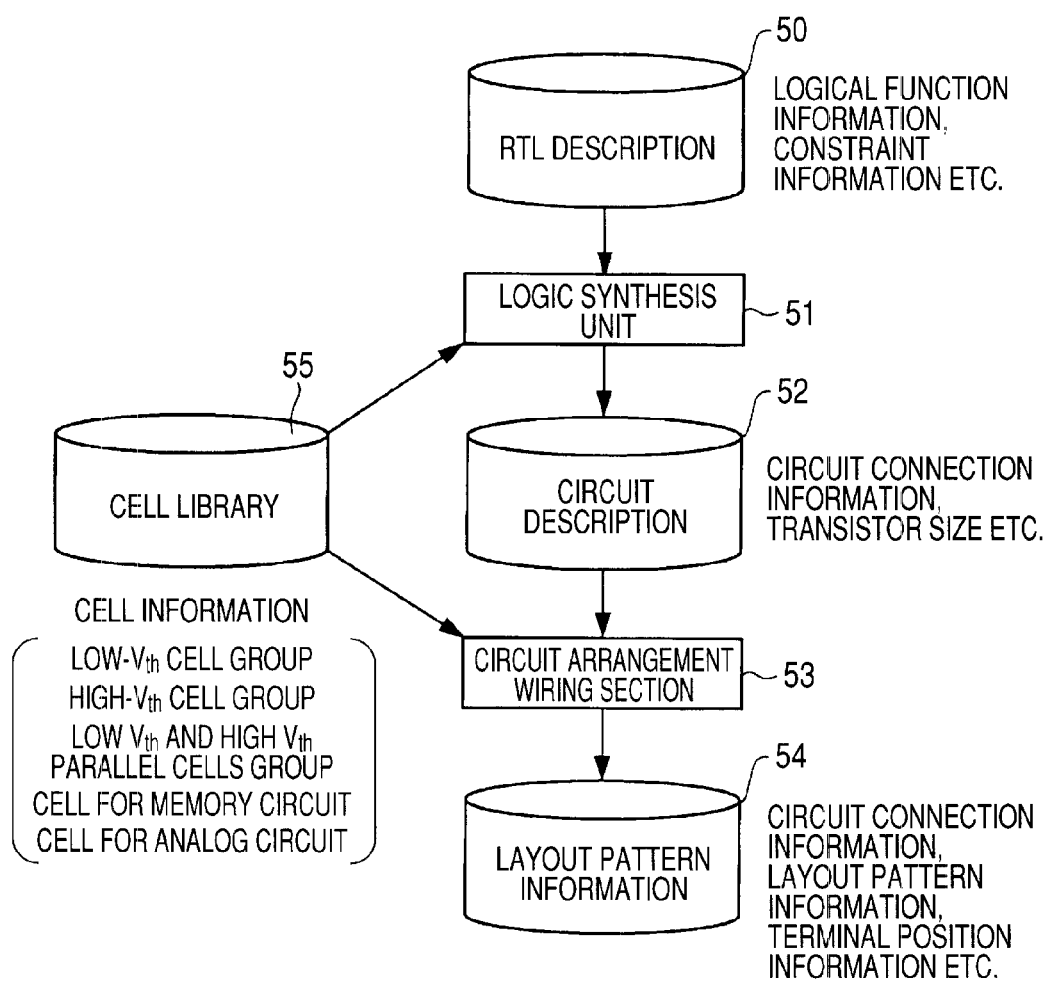
FIG. 31 is a flow chart illustrating a general circuitry design and layout design.

FIG. 31 is a flow chart illustrating a general circuitry design and layout design. RTL (Register Transfer Level) description 50 of FIG. 31 is the medium which stores the function description (RTL description) obtained as a result of performing the functional design of LSI as a design object. In this stage, the logical function information which describes the function of the circuit serves as a core. A logic synthesis unit 51 generates circuit description 52 from the RTL description and various kinds of constraint information, such as timing restriction.

When performing a logic synthesis from the RTL description, the logic circuit which satisfies the operating speed is synthesized, based on the design data reflecting the transistor performance of the process used in order to fulfill the specification of the whole LSI. In practice, the logic synthesis is the process of selecting a combination of cells which satisfy the function and the performance, with the use of a tool, from a cell library 55 (including for example, a set of basic gates such as FF, INV, NAND, and MUX; a memory; macromodules such as an analog module etc.). The cell library 55 can have the information on performance (speed, operating power, leakage current, and area), supplies the synthetic tool with the design constraint with respect to the performance, and decides the combination of the gates so as to fulfill the desired performance.

Circuit description 52 generated as a result of the logic synthesis is a storage medium storing circuit connection information, transistor size information, etc., when the basic gates and transistors are used.

Next, a circuit arrangement wiring section 53 generates an actual layout pattern based on the circuit description 52. Referring to the layout information of each cell of the cell library 55, the gates selected by the circuit description 52 are arranged, and wiring is carried out to couple each of the gates. Consequently, layout pattern information 54 can be acquired. Performance evaluations, such as the operating speed, the occupied area, and the power consumption, are carried out after the arrangement. When the performance cannot be attained, replacement of a gate, re-wiring, etc. is carried out.

By adding the cell which employs the layout of the present invention (a cell which includes common-node transistors) to the cell library 55, it becomes possible to realize LSI with the performance which has not been able to respond by the cell library of related art, which has separated a low-Vth cell group and a high-Vth cell group. That is, it is possible to add the cell library a cell or a macromodule which has a smaller area and a higher speed than a low-Vth cell, and a lower leakage than a high-Vth cell.

As described above, by registering the cell using the common-node transistors according to the present invention into the cell library, it becomes possible to construct a small area LSI which satisfies the speed and power performance.

In the above, the invention accomplished by the present inventors has been specifically explained based on the embodiments. However, it cannot be overemphasized that the present invention is not restricted to the embodiments, and it can be changed variously in the range which does not deviate from the gist.

It should be understood by those skilled in the art that various modifications, combinations, sub-combinations and alterations may occur depending on design requirements and other factors insofar as they are within the scope of the appended claims or the equivalents thereof.

The present invention can be broadly used for the manufacturing industry which manufactures a semiconductor device.

What is claimed is:

1. A semiconductor device comprising:
   (a) a memory cell array with a plurality of memory cells arranged in a matrix;
   (b) a word driver operable to select a specified row of the memory cell array; and
   (c) a column selecting unit operable to select a specified column of the memory cell array,
   wherein the word driver includes:
      an inverter circuit including: a first p-channel type MISFET having a first p-gate electrode; and a first n-channel type MISFET having a first n-gate electrode, wherein the first p-channel type MISFET and the first n-channel type MISFET are coupled in series with each other between a power supply line supplying power supply potential and a reference line supplying reference potential, and the first p-gate electrode and the first n-gate electrode are coupled electrically, wherein the inverter circuit further includes:
- a second p-channel type MISFET having a second p-gate electrode and coupled in parallel with the first p-channel type MISFET, the second p-gate electrode being coupled electrically with the first p-gate electrode, and wherein a threshold voltage of the first p-channel type MISFET and a threshold voltage of the second p-channel type MISFET are different from each other.

2. The semiconductor device according to claim 1,
wherein the first p-channel type MISFET and the second p-channel type MISFET are arranged on the side of the power supply line, and the first n-channel type MISFET is arranged on the side of the reference line.

3. The semiconductor device according to claim 1,
wherein the inverter circuit further includes:
- a second n-channel type MISFET having a second n-gate electrode, wherein the second n-channel type MISFET and the first n-channel type MISFET are coupled in parallel, and the second n-gate electrode is electrically coupled with the first n-gate electrode, and wherein a threshold voltage of the first n-channel type MISFET and a threshold voltage of the second n-channel type MISFET are different from each other.

* * * * *